US00RE36730E

United States Patent [19]

Nishi

[11] E Patent Number: Re. 36,730

[45] **Reissued Date of Patent: *Jun. 13, 2000**

[54] PROJECTION EXPOSURE APPARATUS HAVING AN OFF-AXIS ALIGNMENT SYSTEM AND METHOD OF ALIGNMENT THEREFOR

[75] Inventor: Kenji Nishi, Kawasaki, Japan

[73] Assignee: Nikon Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/002,884

[22] Filed: Jan. 5, 1998

Related U.S. Patent Documents

Reissue of:

[64] Patent No.: 5,243,195
Issued: Sep. 7, 1993
Appl. No.: 07/998,642
Filed: Dec. 29, 1992

U.S. Applications:

[63] Continuation of application No. 08/524,465, Sep. 7, 1995, abandoned, which is a continuation of application No. 07/872,750, Apr. 21, 1992, abandoned.

[30] Foreign Application Priority Data

| | | | |
|---|---|---|---|
| Apr. 25, 1991 | [JP] | Japan | 3-095599 |
| Jul. 10, 1991 | [JP] | Japan | 3-169781 |
| Jul. 23, 1991 | [JP] | Japan | 3-182557 |

[51] Int. Cl.[7] ..... G01N 21/86

[52] U.S. Cl. ..... 250/548; 356/401

[58] Field of Search ..... 250/548, 557, 250/237 G, 237 R; 356/399–401; 355/53, 55

[56] References Cited

U.S. PATENT DOCUMENTS

| | | | |
|---|---|---|---|
| 4,269,505 | 5/1981 | Mayer | 250/548 |
| 4,414,749 | 11/1983 | Johannsmeier | 33/180 |
| 4,452,526 | 6/1984 | Johannsmeier et al. | 355/43 |
| 4,677,301 | 6/1987 | Tanimoto et al. | 250/548 |
| 4,710,026 | 12/1987 | Magome et al. | 356/349 |
| 4,725,737 | 2/1988 | Nakat et al. | 250/557 |
| 4,897,553 | 1/1990 | Nishi | 250/548 |
| 5,003,342 | 3/1991 | Nishi | 355/43 |
| 5,138,176 | 8/1992 | Nishi | 250/548 |
| 5,379,108 | 1/1995 | Nose et al. | 356/400 |

FOREIGN PATENT DOCUMENTS 53-56975 5/1978 Japan .

OTHER PUBLICATIONS

IBM Technical Disclosure Bulletin, "Aligning Semiconductor Mask," vol. 13, No. 7, Dec. 1970, p. 1816.

*Primary Examiner*—Stephone Allen
*Attorney, Agent, or Firm*—Vorys, Sater, Seymour and Pease LLP

[57] ABSTRACT

An exposure apparatus for exposing mask patterns on a sensitive plate comprises a set (for X and Y direction) of a laser interferometer for measuring a position of a wafer stage and satisfying Abbe's condition with respect to a projection lens and a set (for X and Y direction) of the laser interferometer and satisfying Abbe's condition with respect to off-axis alignment system.

When a fiducial mark on the wafer stage is positioned directly under the projection lens, a presetting is performed so that measuring values by the two sets of laser interferometers are equal to each other.

113 Claims, 18 Drawing Sheets

FIG. 16A
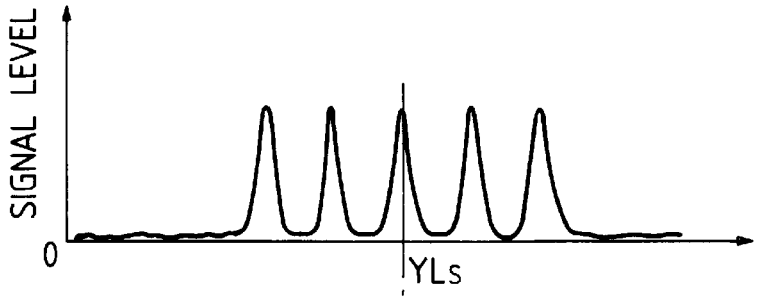
FIG. 16B
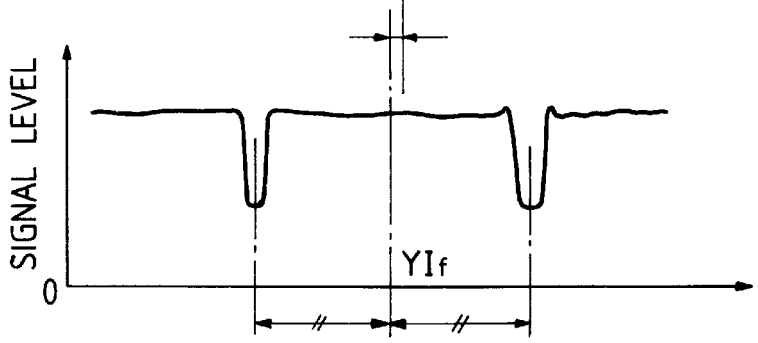
FIG. 17
| MEASURED VALUE | | CONSTANT VALUE | |
|---|---|---|---|
| TTR-A | X : ΔXR1 | FM1 ↔ FM2A | X : ΔXfa |
| | Y : ΔYR1 | | Y : ΔYfa |
| TTR-B | X : ΔXR2 | FM1 ↔ FM2B | X : ΔXfb |
| | Y : ΔYR2 | | Y : ΔYfb |
| LSA | X : XLs | | |
| | Y : YLs | | |
| OWA | X : ΔXF | | |
| | Y : ΔYF | | |
| IFS | X : X1f | | |
| | Y : Y1f | | |

PROJECTION EXPOSURE APPARATUS HAVING AN OFF-AXIS ALIGNMENT SYSTEM AND METHOD OF ALIGNMENT THEREFOR

Matter enclosed in heavy brackets [ ] appears in the original patent but forms no part of this reissue specification; matter printed in italics indicates the additions made by reissue.

[This] *This reissue application is a continuation of application Ser. No. 08/524,465 filed Sep. 7, 1995, now abandoned, which is a reissue application of U.S. Pat. No. 5,243,195 granted Sep. 7, 1993, which matured from application Ser. No. 07/998,642 filed Dec. 29, 1992, which* is a continuation of application Ser. No. 07/872,750 filed Apr. 21, 1992, now abandoned.

BACKGROUND OF THE INVENTION

1. Field of the Invention

The present invention relates to a projection exposure apparatus for causing the sensitive layer coated on a substrate, such as a water for fabricating semi-conductor device and a glass plate for fabricating liquid crystal display device, to be exposed with the patterned image on a mask or reticle. More particularly, the invention relates to a projection exposure apparatus provided with an off-axis type alignment system whereby to observe mark patterns and others on a substrate through an objective optical system dedicatedly fixed outside a projection optical system or a projection optical system only.

2. Related Background Art

An example of the conventional projection exposure apparatus provided with an off-axis type alignment system (hereinafter expediently referred to as stepper) is disclosed in U.S. Pat. No. 4,452,526 or in Patent Abstracts of Japan, Vol. 2, No. 92, Jul. 28, 1978, p. 436 E78, JP-A-53-56975.

Also, the fundamental concept of the off-axis system is disclosed in a paper entitled "ALIGNING SEMI-CONDUCTOR MASKS" in IBM Technical Disclosure Bulletin Vol. 13, No. 7, December 1970, p. 1816. Further, in U.S. Pat. No. 4,677,301 filed by the same assignee hereof for the present invention, there is proposed an alignment method for a sensitive substrate using both of two alignment systems of the off-axis type. One of the alignment systems is a system for detecting the mark on the sensitive plate appearing at a predetermined position in the image field of the projection optical system only through the projection optical system which performs a focusing of the original pattern on the mask or (reticle) onto the sensitive plate (hereinafter referred to as inner-field off-axis alignment system). The other is a system for detecting the mark on the sensitive plate through the dedicated objective optical system fixed to the outside of the projection optical system (hereinafter referred to as outer-field off-axis alignment system). The provision of such two kinds of off-axis alignment systems is also disclosed in the aforesaid U.S. Pat. No. 4,452,526.

The above-mentioned conventional apparatus has a fiducial plate with a fiducial mark as a reference fixedly on the wafer stage which is secondarily movably by a step and repeat method. This fiducial plate is used for measuring the distance between the off-axis alignment system and projection optical system, that is, the base line value between them. Now, in conjunction with FIG. 1, the principle of the conventional base line measurement will be described. In this description, the off-axis alignment system is assumed to be of the outer-field type.

In FIG. 1, a main condenser lens ICL illuminates the reticle (mask) R evenly at the time of exposure. The reticle R is supported by a reticle stage RST. This reticle stage RST is driven to enable the center CC of the reticle R to be aligned with the optical axis AX of the projection optical system (hereinafter referred to as projection lens) PL. Meanwhile, on a wafer stage WST, the fiducial mark FM, which is equivalent to the alignment mark formed on the wafer surface, is provided, and when the stage WST is positioned to allow this fiducial mark FM to arrive at a predetermined position in the projection field of the projection lens PL, the mark R on the reticle R and fiducial mark FM are detected at the same time by the alignment system DDA of a TTL (through the lens) type provided above the reticle R. The distance La between the mark RM and the center CC of the reticle R is a predetermined value defined at the time of designing. Therefore, the distance between the projection point of the mark RM on the image formation side (wafer side) of the projection lens PL and the projection point of the center CC becomes La/M, where M is magnification of the projection lens PL observed from the wafer side to the reticle side, and in the case of a ⅕ reduction projecting lens, M=5.

Also, on the outside (outer field of projection) of the projection lens PL, an off-axis wafer alignment system OWA is fixedly mounted. The optical axis of the wafer alignment system OWA is in parallel with the optical axis AX of the projection lens PL on the side of the projection image plane (on wafer plane). Then, inside the wafer alignment system OWA, there is provided a target mark TM on the glass plate, which serves to be the reference when the mark on the wafer or the fiducial mark FM is aligned. This target mark TM is arranged substantially in conjugation with the projected image plane (wafer surface or the surface of the fiducial mark FM).

Now, the base line value BL is obtained as shown in FIG. 1 by measuring the position $X_1$ of the stage WST when the reticle mark RM and fiducial mark FM are aligned as well as the position $X_2$ of the stage WST when the target mark TM and fiducial mark FM are aligned by the use of an interferometer and others and then calculated the difference $(X_1-X_2)$ This base line value BL will be a reference value when the mark on the wafer is transferred to the position just below the projection lens PL by an alignment conducted by the wafer alignment system OWA later. In other words, given the distance between the center of one shot (an area to be exposed) on the wafer and the mark on the wafer as XP, and the position of the wafer stage WST when the wafer mark and the target mark TM are matched as $X_3$, the wafer stage WST should be driven to the position obtained by an expression given below in order to coincide with the center of the shot with the center CC of the reticle.

$$X_3-BL-XP(\text{or } X_3-BL+XP)$$

In this respect, this expression represents the position in only one dimensional direction as a principle, and in practice, a two-dimensional consideration should be given. Moreover, the calculating method should be different depending on the arrangements of the TTL alignment system DDA (that is, the arrangement of the mark RM), wafer alignment system OWA, and others.

In any case, subsequent to having detected the mark position on the wafer using the wafer alignment system OWA of the off-axis type, the wafer stage WST is driven for a predetermined amount. Hence conducting exposure immediately after the pattern on the reticle R has been overlapped with the shot area on the wafer accurately.

In a conventional technique such as described above, when the positional relationship between the detected center point (the center of the target mark TM) of the off-axis alignment system OWA and the projection point of the mark RM on the reticle R by the projection lens PL (base line value BL) is measured, its relative distance is obtained by a laser interferometer while driving the wafer stage WST. Consequently, due to the running accuracy of the wafer stage WST, air fluctuation on the optical path of the laser beam of the laser interferometer, and other unavoidable causes, there is a limit to the improvement of the precision with which to measure the base line value. Also, it is necessary to drive the wafer stage WST for positioning the fiducial mark FM in the detection area in the TTL alignment system DDA and also to drive the wafer stage WST for positioning the fiducial mark FM in the detection center of the off-axis alignment system OWA. Thus there is a limit to the increase in the speed with which to execute the base line measurement process.

Further in the conventional stepper, the extended line of the measuring axis (beam optical axis) of the laser interferometer for measuring the position of the wafer stage WST is simply set to be perpendicular to the optical axis of the projection lens both in the direction X and direction Y as shown in U.S. Pat. No. 4,677,301. Accordingly, it is considered difficult to implement the direction of the mark detection so that Abbe's error (sine error) is always zero when the off-axis alignment system OWA is used for detecting various marks. Then, it may also be considered to provide a combination of laser interferometers by arranging a set of a laser interferometer thereby to make the Abbe's error zero with respect to the optical axis of the projection lens and a set of a laser interferometer thereby to make the Abbe's error zero with respect to the detection center of the off-axis alignment system OWA.

The application for a patent on an apparatus for which a conception such as this is materialized has been already filed by the inventor et al hereof and is issued as U.S. Pat. No. 5,003,342.

In this case, the two sets of the laser interferometers are used by switching them for the stage position measurement for the wafer alignment using the off-axis alignment system OWA and for the stage position measurement at the time of projection exposure. However, the adjustability (coordination) of the values in measuring both positions must be taken into account. Otherwise, errors may result inevitably.

In the above-mentioned U.S. Pat. No. 5,003,342, in order to effectuate the adjustability required, one set of the interferometer is reset while the fiducial mark plate is positioned just below the projection lens and the other set of the interferometer is reset while the fiducial mark plate is positioned just below the off-axis alignment system. Nevertheless, during each operation of the two sets of the interferometers, the wafer state is caused to be driven for the predetermined amount. Strictly speaking, there still remain errors in the running accuracy of the wafer stage, particularly depending on its yawing, and errors due to the air fluctuation (refraction index disturbance) in the optical path of the laser interferometers.

SUMMARY OF THE INVENTION

It is an object of the present invention to improve the total accuracy of a projection exposure apparatus having an off-axis alignment system.

It is another object of the present invention to provide a projection exposure apparatus in which the measurement precision is improved for the base line value of its off-axis alignment system, and the method of alignment therefor.

It is still another object of the present invention to shorten the time required for the base line measurement.

It is a further object of the present invention to obtain a structure which is not affected by the generation of errors due to the air disturbance in the optical path of the laser interferometer when the base line measurement is performed.

It is still a further object of the present invention to reduce the systematic errors for the apparatus provided with a laser interferometer capable of satisfying the Abbe's condition with respect to its projection optical system as well as with a laser interferometer capable of satisfying the Abbe's condition with respect to its off-axis alignment system.

It is still a further object of the present invention to obtain a structure capable of performing the alignment of the mask (reticle) for the main body of the apparatus and the base line measurement almost simultaneously without driving the stage.

It is still a further object of the present invention to obtain an alignment sequence thereby to restrain the reduction of throughput even if the base line measurement is executed at each time of exchanging sensitive plates.

In order to achieve the above-mentioned objects, a first fiducial mark ($FM_1$) which can be detected by an off-axis alignment system (OWA) and a second fiducial mark ($FM_2$) which can be detected by an alignment system than a projection optical system are provided in parallel with a predetermined position relationship required for designing according to the present invention. Then, at the same time that the positional deviation between the marks ($RM_1$ and $RM_2$) on the reticle (mask) and the second fiducial mark ($FM_2$) on the stage is detected by the alignment system through the projection optical system, the positional deviation of the first fiducial mark ($FM_1$) from the detection center is detected by the off-axis alignment system (OWA). Further, in accordance with the designed interval (including manufacturing errors) between the first fiducial mark ($FM_1$) and second fiducial mark ($FM_2$) and each of the detected positional deviations, the relative distance between the projection point of the mark on the reticle by the projection system and the detected center point by the off-axis alignment system OWA, that is, a base line value, is calculated.

In the present invention, the alignment system through the projection optical system and the off-axis alignment system are used at the same time, thus making it possible to execute the base line measurement highly accurately without being affected by the running accuracy of the stage and the respective positioning accuracies required. Also, there is an advantage that the measurement is not dependent on the measuring value of the laser interferometer for measuring the stage position because the base line value is not measured on the basis of the driving amount of the wafer stage which is only obtainable when it is driven as in the conventional art.

Furthermore, in the present invention, at the same time that the positional detection of the reticle (mask), detection of the amount of the positional deviation, or the reticle alignment is performed in accordance with each of the marks provided on the stage as references, the base line measurement is executed with the fiducial plate as its reference. Hence, all the references are coordinated and at the same time, there is an advantage that a series of processes is completed in a short period. In other words, it is possible to obtain both effects of a higher accuracy and higher throughput.

In another invention of the application hereof, a fiducial plate FP, with the fiducial mark $FM_2$ to be aligned with the mark RM on the reticle R and the fiducial mark $FM_1$ to be aligned with the detection center of the off-axis alignment system OWA being formed together thereon, is provided on the wafer stage WST. Then, the structure is arranged so that when the base line is measured, the positional deviation between the reticle R and fiducial plate FP is obtained while the wafer stage WST is at rest and at the same time, the positional deviation between the detection center of the off-axis alignment system OWA and the fiducial plate FP is obtained. Further, the structure is arranged so that a pair of interferometers (IFX and $IFY_1$) which can satisfy the Abbe's condition with respect to the off-axis alignment system OWA and a pair of interferometers (IFX and $IFY_2$) which can satisfy the Abbe's condition with respect to the projection optical system are provided, and inner counters are arranged to be presettable with each other so as to make the measuring values of the above-mentioned two sets of the interferometers equal at the position of the wafer stage at the time of the above-mentioned base line measurement.

When the position of the reticle R is measured using the fiducial plate FP at the time of the base line measurement, the imaginary line connecting the reference points of the two interferometers using for the same direction, that is, Y-direction measurement, for example, can be in parallel precisely with the reflection plane of the movable mirror (IMy) in the direction Y on the wafer stage just by presetting the measuring values of the two sets of the interferometers to be equal.

Furthermore, in the present invention, the structure is arranged so that the inner counters of the two sets of the interferometers can be preset with each other when the reticle R is in a state that it can be aligned to the fiducial plate FP. Hence, there is an advantage that it is unnecessary to provide any corrective calculation in consideration of the yawing of the stage and the like once the presetting has been performed.

Moreover, according to the present invention, the reticle alignment and base line measurement can be performed almost simultaneously. Therefore, even if a sequence is arranged so as to measure the base line value at each time of exchanging wafers, there is no possibility that the throughput is reduced. As a result, it becomes possible to confirm at a high speed for correction any long-term drift of the base line and the positional drift of the reticle holder resulting from the illumination of the exposure light to the reticle.

BRIEF DESCRIPTION OF THE DRAWINGS

FIGS. 16A and 16B are views showing examples of the waveforms detected by the LSA system and ISS system.

FIG. 17 is a table showing the constant values and measured values required for the base line control.

DETAILED DESCRIPTION OF THE PREFERRED EMBODIMENTS

Hereinafter, in conjunction with the accompanying drawings, the present invention will be described in detail.

Figure 1:
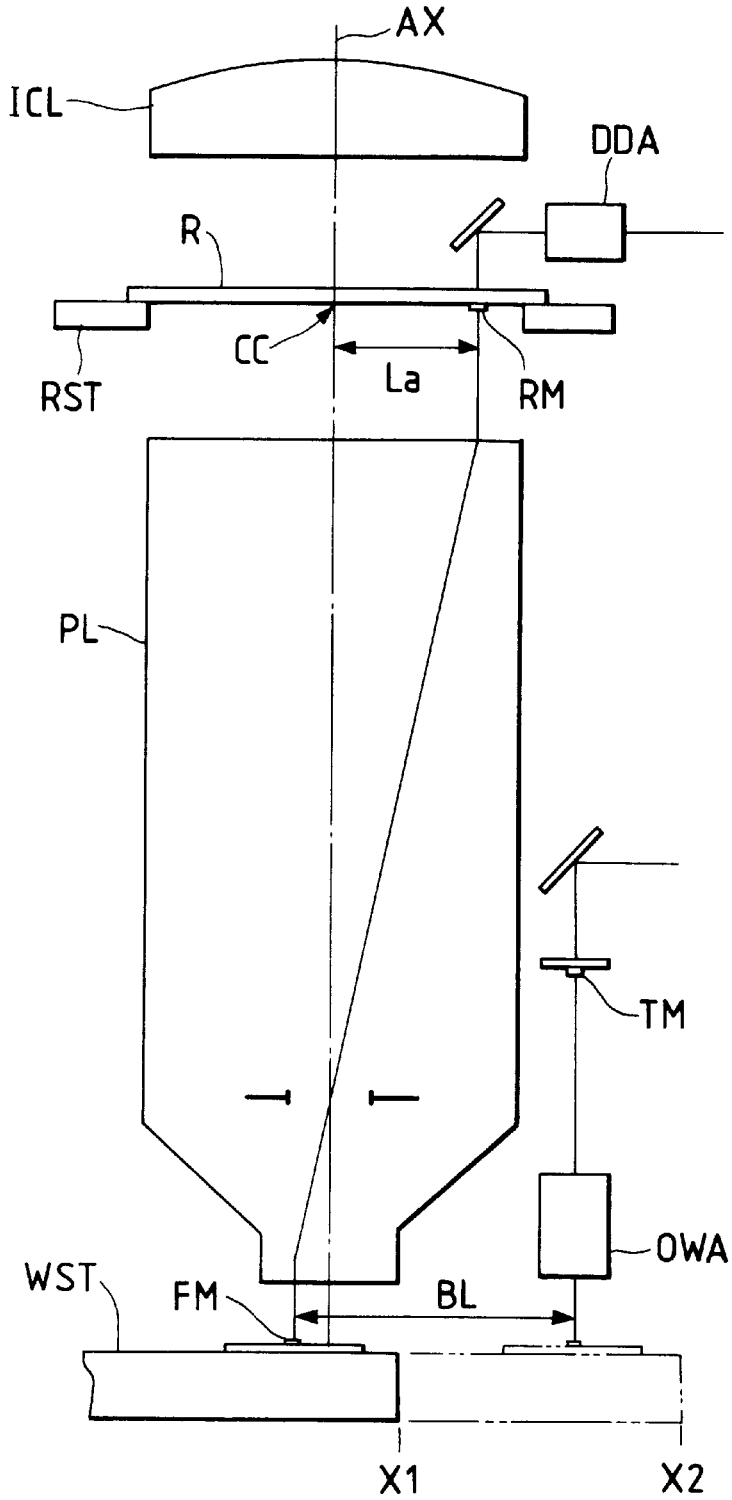
FIG. 1 PRIOR ART
FIG. 1 is a view illustrating the state of a base line measurement in a conventional projection exposure apparatus.
Figure 2:
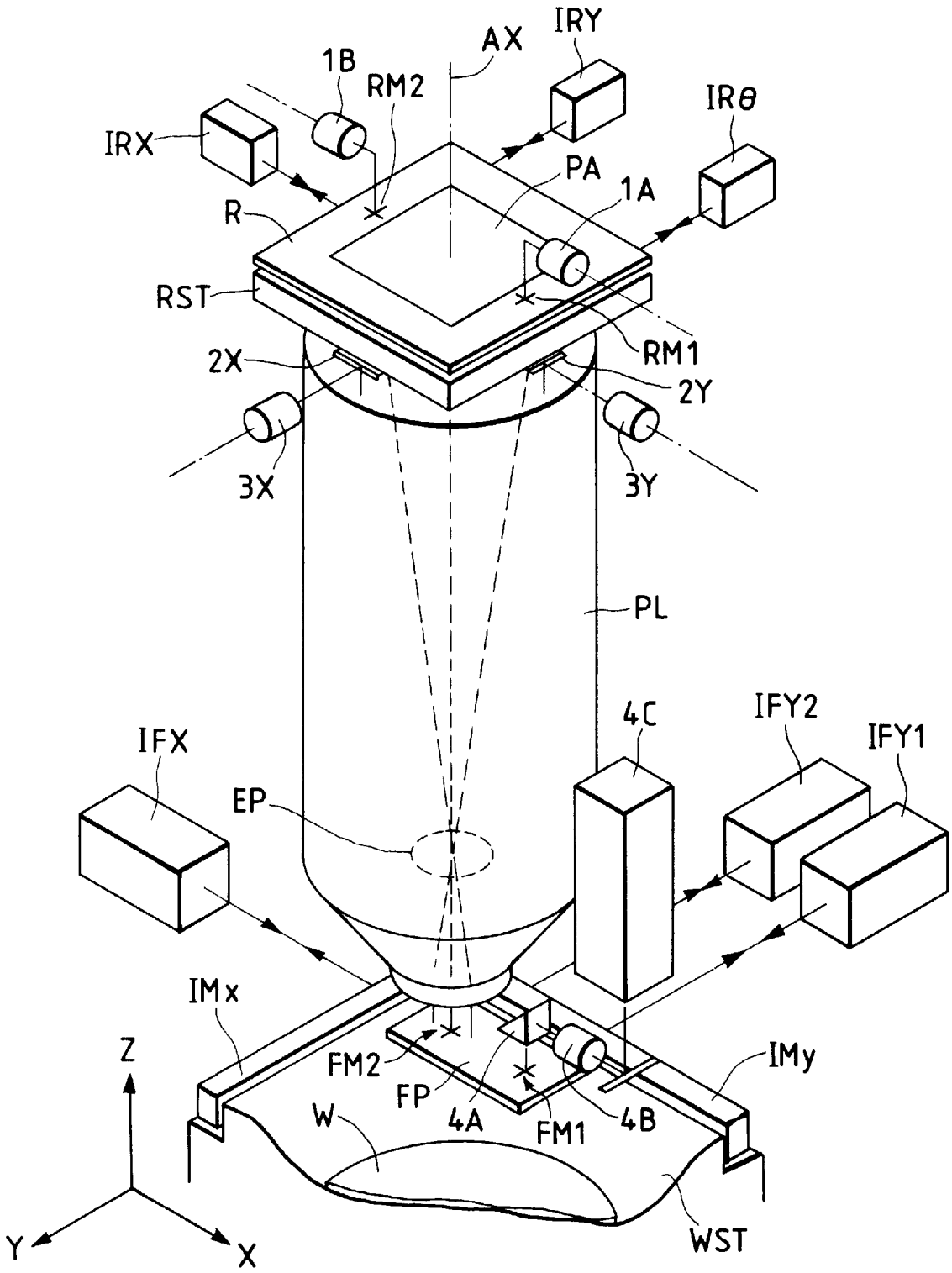
FIG. 2 is a perspective view illustrating the structure of a projection exposure apparatus according to an embodiment of the present invention.

FIG. 2 is a perspective view illustrating the structure of a projection exposure apparatus according to a first embodiment of the present invention, in which the same reference marks are given to the members which are the same as those appearing in FIG. 1. In FIG. 2, there are provided on the reticle R, a pattern area PA with the circuit patterns to be exposed on the wafer, and the reticle marks $RM_1$ and $RM_2$ for alignment. These reticle marks $RM_1$ and $RM_2$ are photoelectrically detected through the object lenses 1A and 1B of a first TTL alignment system respectively. Also, a reticle stage RST is movably driven by a motor and others of the driving system, which is not shown in FIG. 2, in two dimensional (X, Y, and θ) directions and its driving amounts or driving positions are sequentially detected by three laser interferometers IRX, IRY, and IRθ. The rotational driving amount of the reticle stage RST around the coordinate axis Z (which is parallel with the optical axis AX) is obtained by the difference between the measures values of the interferometers IRY and IRθ, and the translational driving amount in the Y axis direction is obtained by the arithmetic mean of the measured values of the interferometers IRY ad IRθ while the translational driving amount in the X axis direction is obtained by the interferometer IRX.

In the present embodiment, a second TTL alignment system which detects marks on the wafer W only through the projection lens PL is provided separately for the use in the direction X and direction Y. The second TTL alignment system for the X direction use includes a mirror 2X and object lens 3X and others fixed between the reticle stage RST and projection lens PL. The second TTL alignment system for the Y direction use includes likewise a mirror 2Y and object lens 3Y and others.

In the present embodiment, the first TTL alignment system which includes the object lenses 1A and 1B is hereinafter referred to as a TTR (through the reticle) alignment system while the second TTL alignment system which includes the object lenses 3X and 3Y are simply referred to as a TTL alignment system.

Now, on the two sides of the wafer stage WST where the wafer W is mounted, a movable mirror IMx which reflects the beam from the laser interferometer IFX and a movable mirror IMy which reflects the beam respectively from the laser interferometers $IFY_1$ and $IFY_2$ are fixed. The beam from the interferometer IFX is perpendicular to the reflecting plane of the movable mirror IMx which is extended in the direction Y, and the extended line of the beam is rectangular to the extended line of the optical axis AX of the projection lens PL. The beam from the interferometer $IFY_2$ is perpendicular to the reflecting plane of the movable mirror IMy which is extended in the direction X, and the extended line of the beam is also rectangular to the extended line of the optical axis AX. The beam from another interferometer $IFY_1$ is perpendicular to the reflecting plane of the movable mirror IMy, and is in parallel with the beam from the interferometer $IFY_2$.

Also, the off-axis wafer alignment system includes a reflective prism (or mirror) 4A fixed in the closest vicinity of the lower end portion of the projection lens PL, an object lens 4B, and others. The light receiving system 4C of the wafer alignment system includes a target plate formed target mark TM in its inside and CCD camera for taking the marks of wafer focused on the target mark plate through the prism 4A and object lens 4B. In the present embodiment, the optical axis of the object lens 4B falling on the wafer stage WST through the prism 4A, and the optical axis AX of the projection lens PL are set apart for a predetermined distance only in the direction X while these optical axes are set with almost no positional difference in the direction Y.

The extended line of the optical axis of the object lens 4B which falls on the wafer stage WST is rectangular to the extended line of the beam from the interferometer IFX and the extended line of the beam from the interferometer $IFY_1$, respectively. An arrangement of the interferometers such as this is disclosed in detail in U.S. Pat. No. 5,003,342.

On the wafer stage WST, there is fixedly provided a fiducial plate FP with two fiducial marks FM1 and FM2 being arranged for measuring the base line. The fiducial plate FP is arranged at the corner surrounded by the two movable mirrors IMx and IMy on the wafer stage WST. This plate is formed with a transparent material of a low expansion coefficient such as a fused quartz plate on which a light shielding layer is formed, and the part thereof is etched to provide the fiducial marks FM1 and FM2. The fiducial mark $FM_1$ can be detected by the off-axis wafer alignment system (4A, 4B, and 4C) while the fiducial mark FM2 can be detected by the TTR alignment system (1A and 1B) or TTL alignment system (2X and 3X; 2Y and 3Y).

The distance between these fiducial marks FM1 and FM2 in the direction X is defined with precision of sub-micron order but if there is any residual amount of arrangement error, it is assumed that such a value has been precisely measured beforehand and that has been obtained as an apparatus constant value.

Figure 3:
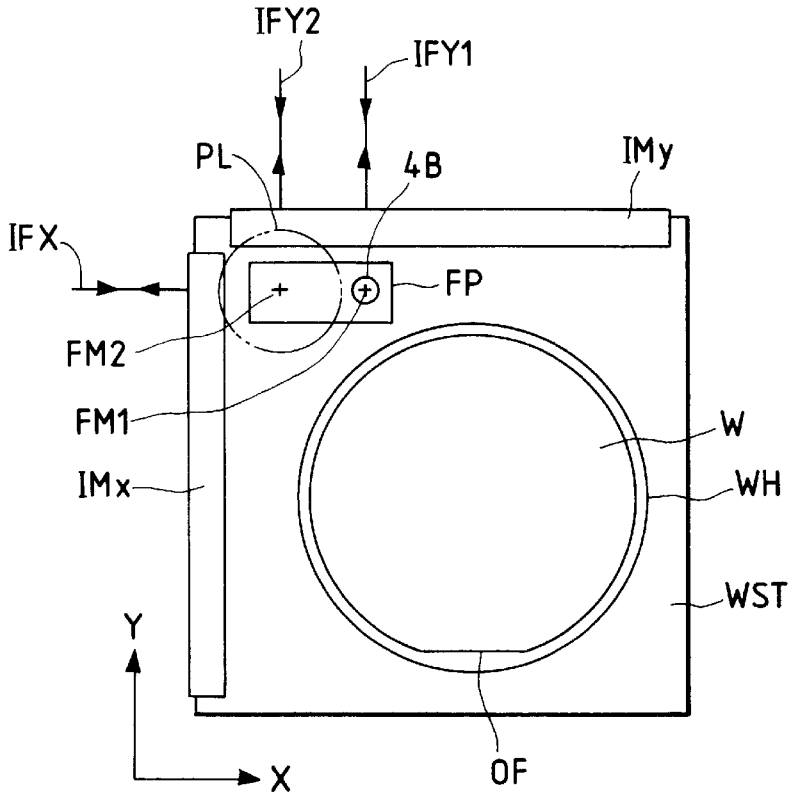
FIG. 3 is a plan view showing the arrangement of a fiducial mark plate on a wafer stage.

FIG. 3 is a plan view showing the arrangement of each member on the wafer stage SWT. The wafer W is mounted on a finely rotational wafer holder WH on the wafer stage WST, and is absorbed by vacuum. In the present embodiment the linear knotch (orientation flat) OF of the wafer W is prealigned mechanically to be in parallel with the axis X. Then, the wafer is mounted on the wafer holder WH.

As shown in FIG. 3, the center ponit of the diameter of the lowest end of the lens barrel of the projection lens PL (that is optical axis AX) and the field of the objective lens 4B are arranged as close as possible. When the projection lens PL and the fiducial plate FP are thus arranged, the wafer W is driven diagonally to the lowest right-hand side in FIG. 3 from just below the projection lens PL. Therefore, in this state, it is possible to load or unload the wafer W. An apparatus with an arrangement of the kind is disclosed in U.S. Pat. No. 4,897,553.

Figure 4:
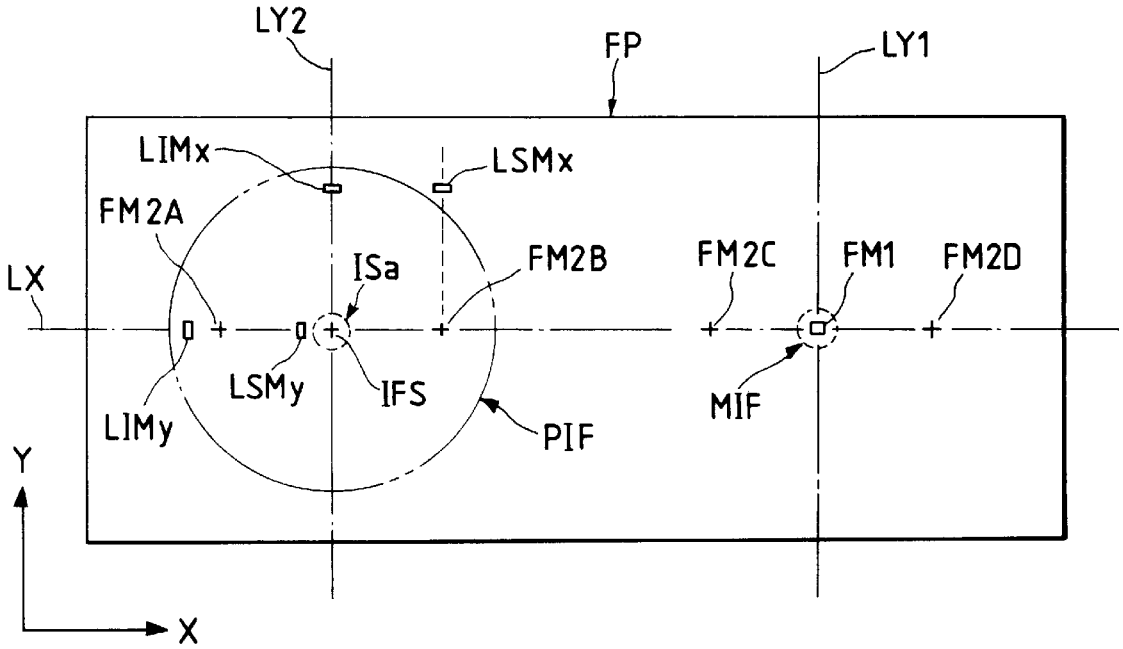
FIG. 4 is a plan view showing the arrangement of various marks on the fiducial mark plate.

FIG. 4 is a plan view showing the detailed mark arrangement of the fiducial marks FM1 and FM2 on the fiducial plate FP.

In FIG. 4, the intersecting point of the straight line LX which is in parallel with the X axis and a straight line $LY_2$ is the center of the fiducial mark $FM_2$, and when the base line is measured, this intersecting point is substantially coincided with the optical axis AX of the projection lens PL. In the present embodiment, an light emission type cross-shaped slit mark IFS is arranged on the intersecting point. Then, an illuminating light having the same wavelength as the exposure light illuminates only a localized area ISa including the light emission slit mark IFS from the reverse side of the fiducial plate FP. Also, on the symmetrical two locations on the straight line LX with respect to the light emission slit mark IFS, the fiducial marks FM2A and FM2B corresponding to the respective arrangements of the reticle marks $RM_1$ and $RM_2$ are provided. These marks FM2A and FM2B are formed by etching the chrome layer on the fiducial plate FP with the cross type slit respectively. The mark FM2A is aligned with the reticle mark $RM_1$ while the mark FM2B is aligned with the reticle mark $RM_2$. In this respect, the light emission slit mark is the same as disclosed in the above-mentioned U.S. Pat No. 4,897,553.

The circular area PIF with the center (intersecting point) of the light emission slit mark IFS as its origin is a projecting field area of the projection lens PL, and in the present embodiment, the mark LIMx which is detectable by the TTL alignment system (2X and 3X) in the direction X as shown in FIG. 2 is arranged on the straight line $LY_2$ in the field area PIF while the two marks LIMy and LSMy which are detectable by the TTL alignment system (2Y and 3Y) in the direction Y are arranged on the straight line LX in the field area PIF. As regards the detailed relations of the respective marks will be described later. In the present embodiment, however, each of the marks FM2A, FM2B, LIMx, and LIMy is arranged so that the TTL alignment system (2X and 3X) in the direction X detects the mark LIMx and the TTL alignment system (2Y and 3Y) in the direction Y detects the mark LIMy in the state that the two TTL alignment systems 1A and 1B detect the reticle marks $RM_1$ and $RM_2$ and the fiducial marks FM2A and FM2B at the same time, respectively.

On the other hand, the straight line $LY_1$ which is provided away in the direction X from the straight line $LY_2$ by a predetermined distance is in parallel with the Y axis, and on the intersecting point of the straight lines $LY_1$ and straight line Lx, there is formed a large fiducial mark FM1 which can be included in the field MIF of the objective lens 4B of the off-axis alignment system. The mark FM1 is an integrated member of a plurality of line patterns provided in parallel in the direction X and direction Y, respectively, in order to make a two dimensional alignment possible. In this respect, as clear from the description set forth above, the fiducial plate FP is fixed on the wafer stage WST to enable the straight line $LY_1$ to be coincided with the center line (measuring axis) of the beam of the interferometer $IFY_1$ as much as possible in the X - Y plane as well as the straight line $LT_2$ to be matched with the center line (measuring axis) of the beam of the interferometer $IFY_2$as much as possible (that is, to avoid the occurrence of any rotational deviation as much as possible).

Further, at the positions symmetrical to the intersecting point of the straight lines LX and $LY_1$ on the straight line LX, the two fiducial marks FM2C and FM2D are provided. The fiducial marks FM2C and FM2D are of the cross type slit patterns which are exactly the same shape and size of the fiducial marks FM2A and FM2B. The distance between them in the direction X are also exactly the same distance between the marks FM2A and FM2B. In this respect, the mark LSMx in FIG. 4 is detected by the TTL alignment system (2X and 3X) in the direction X. Hence, this is provided at the same position as the X coordinate value of the fiducial mark FM2B.

Figure 5:
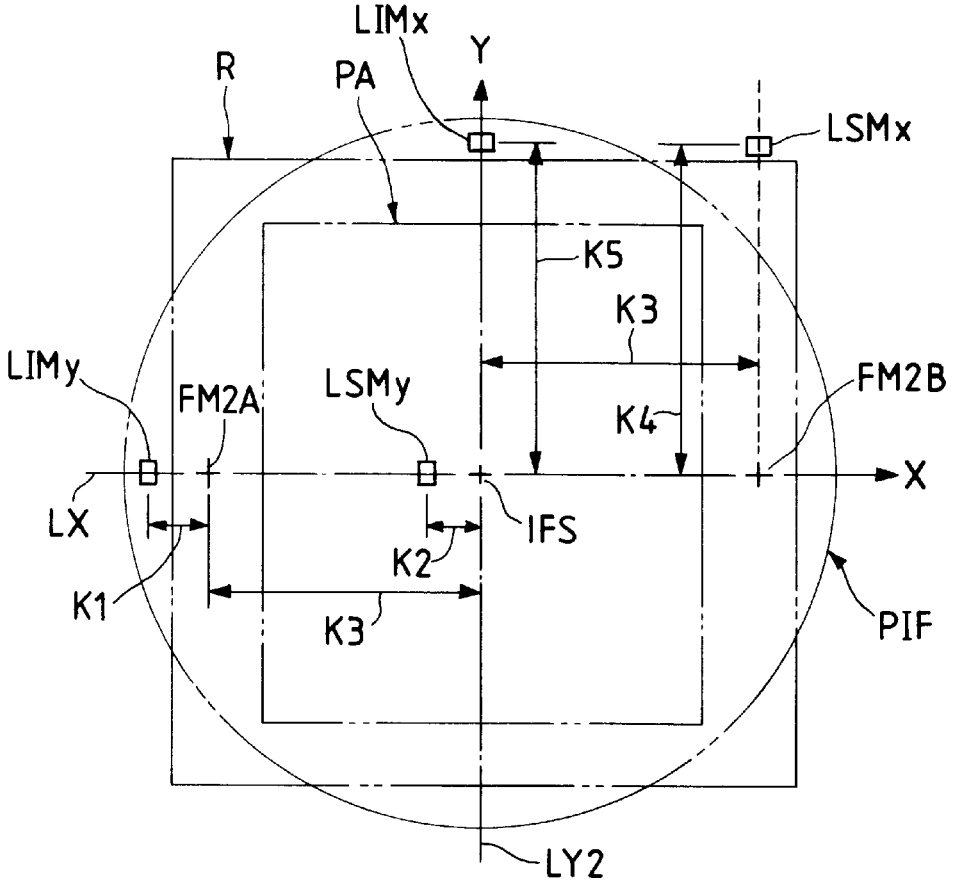
FIG. 5 is a plan view showing the arrangement relationship between the image field of a projection lens, reticle pattern, and fiducial mark.

FIG. 5 is an enlargement of each mark arrangement on the fiducial mark FM2 side only on the fiducial plate FP and shows the state that the center of the projecting field area PIF of the projection lens PL is matched with the intersecting point of the light emission slit mark IFS.

Figure 6:
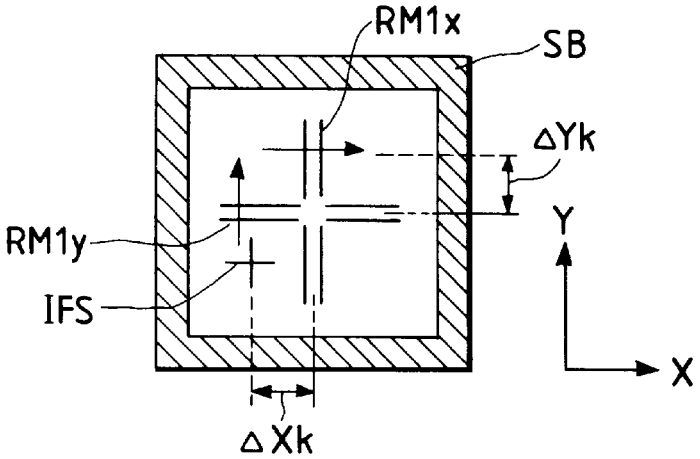
FIG. 6 is a view showing an example of the shape of a reticle alignment mark.

In FIG. 5, the positional relationship between the peripheral shape of reticle R which is ideally position in such state and the peripheral shape of the pattern area PA is also indicated by two-dot chain lines. The marks LIMx and LIMy for the TTL alignment system are positioned at the outermost periphery of the projecting field PIF, but this because of the fact that the mirrors 2X and 2Y at the leading end of the TTL alignment system are arranged so as not to shield the projection area of the pattern area PA. In this state, the fiducial mark FM2A can be aligned with the reticle mark $RM_1$, but the reticle mark $RM_1$ ($RM_2$ also the same) is structured with the double slit mark $RM_1y$ which is extended in the direction X and the double slit mark $RM_1x$ which is extended in the direction Y, and these marks $RM_1y$ and $RM_1x$ are formed as a dark portion in the transparent portion surrounded by the oblong shielding member SB as shown in FIG. 6. Among the cross-shaped slits of the fiducial mark FM2A, the slit which is extended in the direction X is sandwiched by the double slit marks $RM_1y$ while the slit which is extended in the direction Y is sandwiched by the double slit marks $RM_1x$, hence making it possible to achieve the ideal alignment.

Here, the interval $k_1$ between the center of the fiducial mark FM2A and the center of the mark LIMy in the direction X and the interval $K_2$ the center of the light emission slit mark IFS and the center of the mark LSMy in the direction X shown in FIG. 5 are defined to provide a difference just for an offset amount $\Delta Xk$ in the direction X (which value is on the wafer side) when the light emission slit mark IFS shown in FIG. 6 scans the reticle mark $RM_1$ in the direction Y. In other words, it is defined to be $K_1=K_2+\Delta Xk$ or $K_1=K_2-\Delta Xk$.

Further, the central position of the mark LSMx in the direction X which is detectable by the TTL alignment system in the direction X coincides with the central position of the fiducial mark FM2B in the direction X. This is a condition that is satisfied when the intervals $K_3$ in the direction X between each of the center points of the fiducial marks FM2A and FM2B in the two locations and the center of the light emission slit mark IFS are both equal. Also, the position of the mark LSMx in the direction Y is substantially equal to the position of the mark LIMx in the direction Y. Strictly speaking, however, if the interval between the center of the light emission mark IFS and the center of the mark LIMx in the direction Y is given as $K_4$ and the center of the light emission mark IFS and the center of the mark LSMx in the direction Y is given as $K_5$, these are defined to be a relationship $K_4=K_5+\Delta Yk$ or $K_4=K_5-\Delta Yk$. Here, $\Delta Yk$ is an offset amount in the direction Y when the light emission slit mark IFS scans the double slit mark $RM_1x$ in the direction X as shown in FIG. 6.

Subsequently, in reference to FIG. 7, the detailed structure of the TTR alignment system (1A) will be described. A total reflection mirror 100 is provided slantly at an angle of 45 degrees above the reticle mark $RM_1$ to set the optical axis of the objective lens 101 perpendicular to the reticle R. This TTR alignment system has a self-illuminating system for a coaxial falling illumination, comprising a beam splitter 102, a light source 103 for generating light of exposure wavelength, a shutter 104 for switching the shield and passage of the illuminating light, an optical fiber 105 for conducting the illuminating light, a condenser lens 106 for converging the illuminating light from the emission ends of the optical fiber 105 to illuminate an illumination field aperture 107 evenly, and a lens system 109 for transmitting the illuminating light from the field aperture 107 to the objective lens 101 on Koehler illumination condition. In this way, the objective lens 101 illuminates only the inside of the shielding zone SB in which the mark $RM_1$ of the reticle R. Thus, the reflecting light from the mark $RM_1$ is reflected by the beam splitter 102 through the mirror 100 and objective lens 101 to entire the image formation lens 110. The imaging light of the mark $RM_1$ is divided into two by a half mirror 111 to enable an enlarged image to be formed by the image formation lens 110 respectively on the image formation planes of a CCD camera 112X for X-direction detection and a CCD camera 112Y for Y-direction detection. The CCD cameras 112X and 112Y are arranged to provide the directions of its horizontal scanning to be rectangular to each other with respect to the enlarged image of the mark $RM_1$.

At this juncture, when the fiducial mark FM2A on the fiducial plate FP is position directly below the inner area of the shielding zone SB including the mark $RM_1$, the CCD 112X and CCD 112Y take the cross-shaped slit of the fiducial mark FM2A as black line. Then an image processing circuit 113X executes a digital waveform process of image signals from the CCD camera 112X to obtain the positional deviation amount of the X-direction (horizontal scanning direction) between the slit of the fiducial mark FM2A which is extended in the direction Y and the double slit mark $RM_1x$ of the reticle mark $RM_1$. An image processing circuit 113Y executes a digital waveform process of image signals from the CCD camera 112Y to obtain the positional deviation amount of the Y-direction (horizontal scanning direction) between the slit of the fiducial mark FM2A which is extended in the direction X and the double slit mark $RM_1y$ of the reticle mark $RM_1$. A main control system 114 controls the driving system 115 of the reticle stage RST to correct the position of the reticle R if the positional deviation amounts of the fiducial mark FM2A and reticle mark $RM_1$ in the directions X and Y thus obtained by the processing circuits 113X and 113Y are beyond the predetermined tolerance range.

The driving system 115 detects the positions (X, Y, and θ) of the reticle stage RST by the three interferometers IRX, IRY, and IRθ (shown in FIG. 2) before correction of the stage RST, and obtained the measuring values to be detected by the three interferometers IRX, IRY, and IRθ after correction by computation. Therefore, the driving system 115 serves to position the reticle stage RST by its servo control so as to make each of the measuring values of the three interferometers IRX, IRY, and IRθ the measuring value which should be detected after correction of the stage RST. Also, the main control system 114 controls the driving system 116 which performs the servo control on the position of the wafer stage WST on the basis of the measuring values of the interferometers IFX, $IFY_1$, or $IFY_2$.

Figure 7:
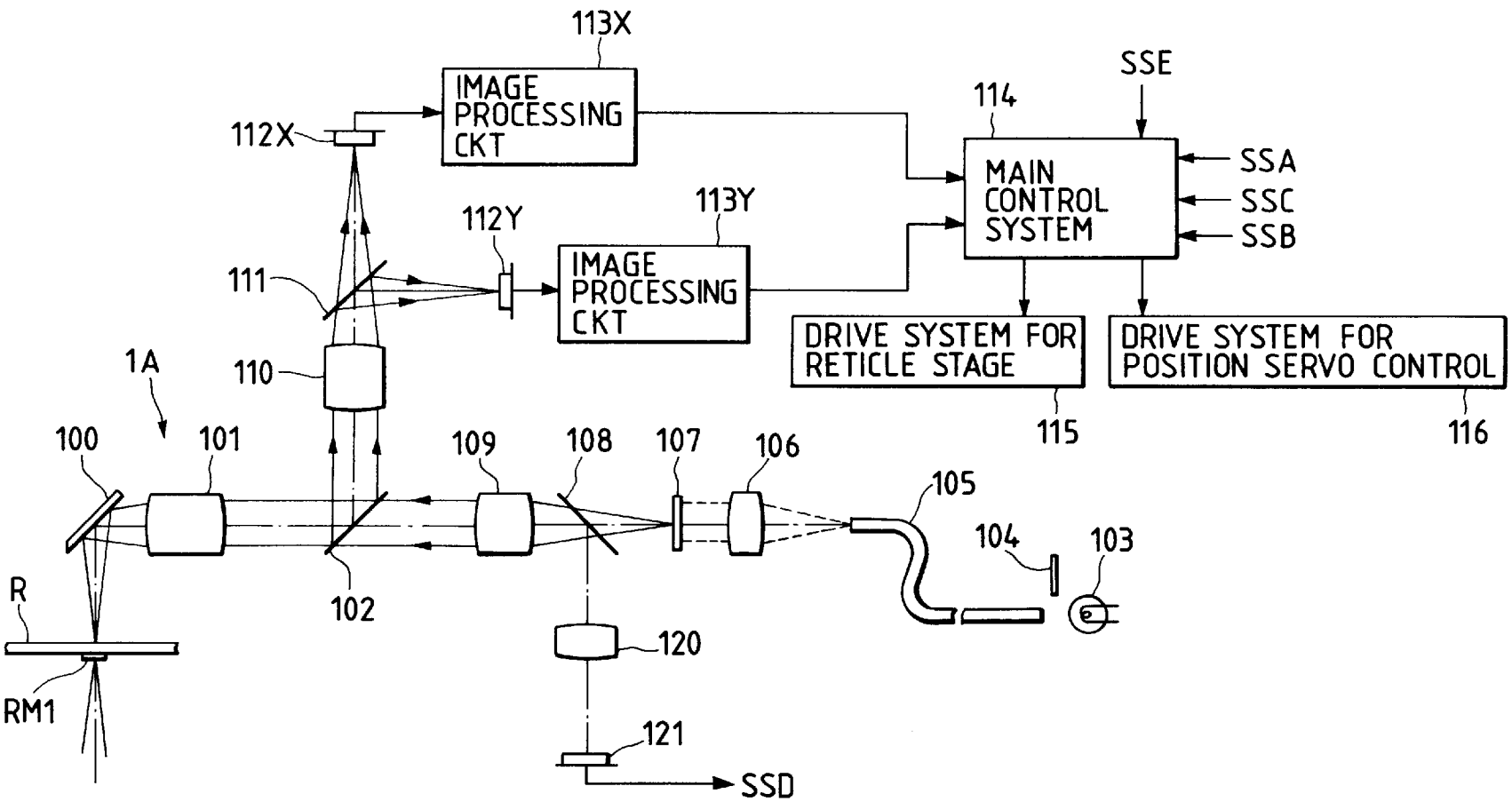
FIG. 7 is a view showing the structure of a TTR alignment system.

Now, as shown in FIG. 7, there is provided in the TTL alignment system 1A, a light receiving system for the light emission mark for detecting the illuminating light from the light emission mark IFS on the fiducial plate FP through the projection lens PL, the transparent portion in the inside of the light shield zone SB of the reticle R, the mirror 100, the objective lens 101, the beam splitter 102, the lens system 109 and the beam splitter 108. This light receiving system for the light emission mark comprises a lens system 120, a photoelectric sensor (photomultiplier) 121 and others, and the light receiving plane of the photoelectric sensor 121 is conjugately arranged with the pupil plane EP of the projection lens PL and the pupil plane formed between the objective lens 101 and the lens system 109. The photoelectric sensor 121 detects photoelectrically the amount of passing light which is varied when the light emission mark IFS scans the reticle mark $RM_1$ (or $RM_2$) to output photoelectric signals SSD in accordance with its variations. The process of this photoelectric signals SSD is executed by the digital sampling of the signal waveforms in response to the up down pulses (one pulse per driving amount of 0.02 $\mu$m, for example) being output from the interferometers IFX and $IFY_2$ accompanying the scanning of the wafer stage WST for storage in a memory.

Now, in reference to FIG. 8, an example of the structure of the TTL alignment systems (2Y and 3Y) in FIG. 2 will be described. The TTL alignment system used for the present embodiment prevent the effect produced by the wafer resist layer of the wafer W when the mark reflection light is detected as well as the sensitizing the resist layer by utilizing the red light from an He-Ne laser source 130 as the mark illumination light. Further, in this TTL alignment system, two alignment sensors each having a different mark detection principle are incorporated so that the two alignment sensors can be used alternatively by sharing the objective lens 3Y. A structure of the kind is precisely disclosed in an application Ser. No. 55,504 filed on Apr. 6, 1990 which is currently copending. Hence, the description thereof will be made briefly here.

The He-Ne laser light from the laser source 130 is divided by the beam splitter 131 to arrive at shutter 132A and 132B which are opened and closed complementarily. In FIG. 8, the shutter 132A is opened while the shutter 132B is closed. The laser light enters the light transmission system 133A of a double beam interference alignment system (L1A). This light transmission system 133A divides the incident beam into two laser beams, and outputs the two laser beams with a constant frequency differential by the use of an acousto-optic modulation (AOM) element. In the case represented by FIG. 8, the two laser beams output from the light transmission system 133A are paralleled in the direction perpendicular to the plane of FIG. 8. These two laser beams are reflected by a half mirror 134 and are further divided into two by a beam splitter 135. The two laser beams reflected by the beam splitter 135 are caused to intersect on the diaphragm APA of the conjugation plane of the wafer by the objective lens 3Y. The two parallel laser beams passing the diaphragm APA with predetermined intersection angle are reflected by a mirror 2Y to enter the projection lens PL, and are again caused to intersect on the wafer W or on the fiducial plate FP. In the area where these two laser beams are caused to intersect, one dimensional interference fringes are produced. The interference fringes thus produced flow in the direction of the pitches of the interference fringes at a velocity corresponding to the frequency differential of the two beams.

Here, the marks LIMy and LIMx shown in FIG. 4 and FIG. 5 are assumed to be diffraction gratings in parallel with the interference fringes. Then, from the marks LIMx and LIMy of the diffraction grating type, the interference beat light capable of varying its intensity in response to the frequency differential are generated. Now, if the pitches of the diffraction gratings of the marks LIMx and LIMy and the pitches of the interference fringes are arranged to be in a certain constant relation, the interference beat light are generated vertically from the wafer W or fiducial plate FP and caused to return through the projection lens PL along the optical path of the two transmission beams sequentially from the mirror 2Y, diaphragm APA and the objective lens 3Y. Then, the interference beat light are transmitted partially through the beam splitter 135 to reach a photoelectric detector 139. The light receiving plane of the photoelectric detector 139 is arranged almost conjugately with the pupil plane EP of the projection lens PL. Also, on the light receiving plane of the photoelectric detector 139, a plurality of photoelectric elements (photodiode, phototransistor, and others) are arranged apart from each other. The interference beat light are received by the photoelectric element positioned in the center (the center of pupil) of the photoelectric detector 139. The photoelectric singals becomes signals of alternating current having the sine waveform which is of the same frequency as the heating frequency, and are inputted into a phase difference measuring circuit 140 as the measuring signal.

Also, the two transmission light beams which have been transmitted through the beam splitter 135 become parallel beams on the reference grating plate 137 of the transmission type by an inverted Fourier transform lens 136 for intersecting. Therefore, on the reference grating plate 137, one dimensional interference fringes are formed. The interference fringes are caused to flow in one direction at a velocity in response to the beating frequency. The photoelectric element 138 receives the interference light of ± primary diffraction light coaxially generated from the reference grating plate 137 or either the interference light of zeroth light or the interference light of secondary diffraction light. The intensities of these rays of interference light are also varied into the sine waveform by the frequency which is equal to the beating frequency, and the photoelectric element 138 outputs signals of alternating current having the same frequency as the beating frequency to the phase difference measuring circuit 140 as the reference signal.

The phase difference measuring circuit 140 obtains the phase difference $\Delta\phi$ (within ±180°) between the measuring signal from the photoelectric detector 139 and the reference signal from the photoelectric element 138, and outputs the positional deviation about Y direction of the mark LIMy on the fiducial plate FP corresponding to the phase difference $\Delta\phi$ (or an equivalent mark on the wafer), that is, outputs the information SSB of the positional deviation amount in the direction of the grating pitches to the main control system 114 in FIG. 7. The resolution of the positional deviation detection is determined by the relationship between the pitches of the mark LIMy and the pitches of the interference fringes illuminated on this mark, and the resolution of the phase difference detection circuit. However, assuming that the resolution of the phase difference detection is ±1° and given the grating pitch Pg of the mark LIMy as 8 $\mu$m, and the pitch Pf of the interference fringe as Pg/2, the detection resolution of the positional deviation is expressed as $\pm(1°/180°)\times(Pg/4)$. Hence the resolution being approximately ±0.01 $\mu$m.

The main control system 114 in FIG. 7 performs the servo control of the driving system 116 of the wafer stage WST on the basis of the positional deviation information SSB from the TTL alignment system of a high resolution L1A type such as this in order to servo lock the wafer stage WST so that the mark LIMy on the fiducial plate FP is always driven to maintain a predetermined positional relationship with the reference grating plate 137.

However, when the servo lock is given, it is not necessarily required to convert the phase difference to the positional deviation amount if only the phase difference of the signals respectively from the photoelectric element 138 and photoelectric detector 139 is stabilized at a predetermined value, and it is possible to perform the servo lock by detecting only the variation of the phase difference.

Another detection method for the TTL alignment system is such that as disclosed in the aforesaid application Ser. No. 505,504 currently copending, the mark is scanned against the slit type laser spot light which is extended in the direction rectangular to the direction of the mark detection, and the signal level obtainable by detecting the diffraction and scattered rays of light being generated from the mark photoelectrically is digitally sampled in response to the up down pules from the interferometers IFX and $IFY_2$, which are generated accompanying the drawing of the wafer stage WST for the mark scanning.

Figure 8:
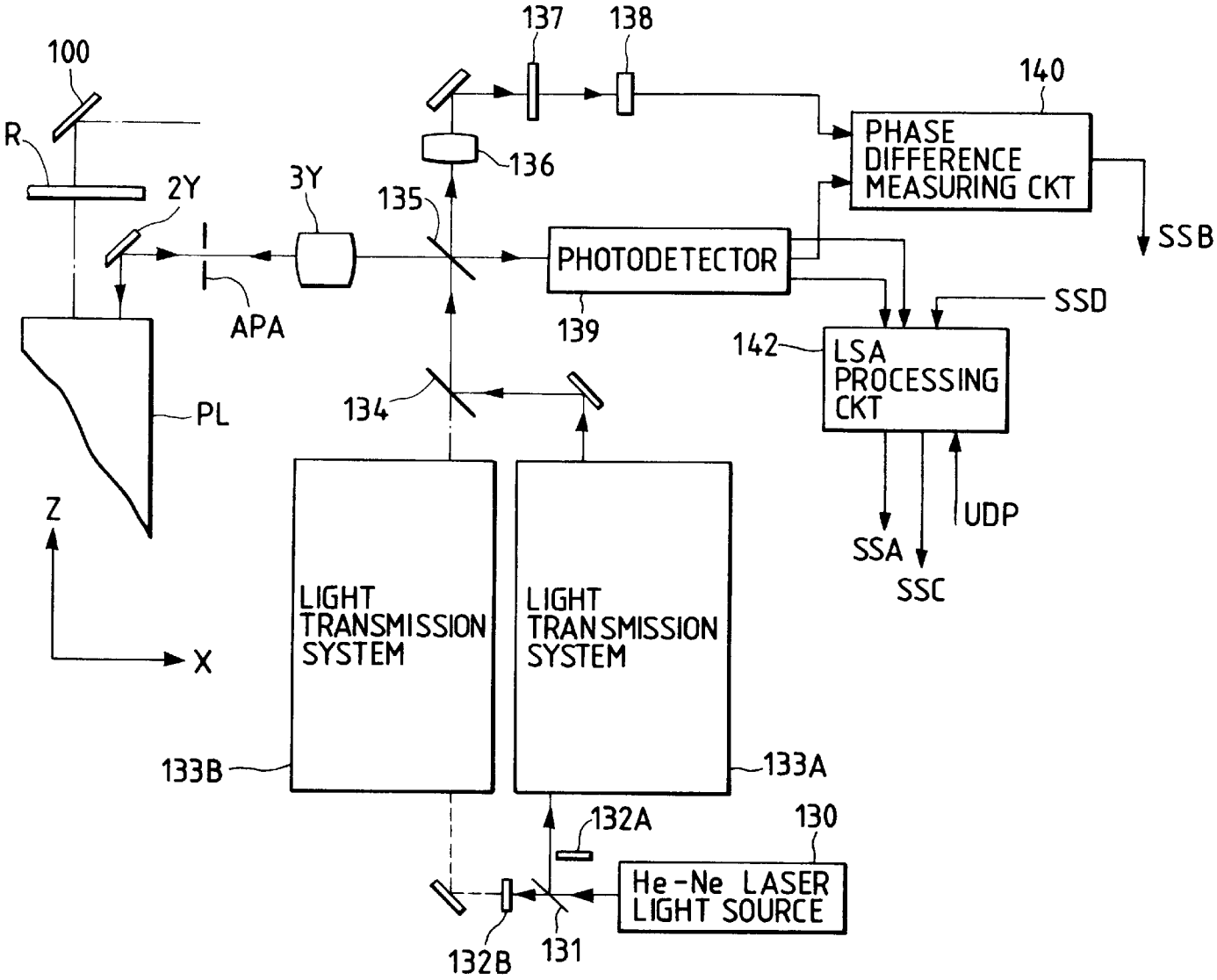
FIG. 8 is a view showing the structure of a TTL alignment system.

In FIG. 8, the laser beam enters the light transmission system 133B of the laser step alignment (LSA) type when the shutter 132B is opened while the shutter 132A is closed. The incident beam is formed to be or a slit type having the beam cross-section at the converging point being extended in one direction by the functions of a beam expander and a cylindrical lens. The incident beam thus formed enters the projection lens PL through the beam splitters 134 and 135, the lens system 3Y, and mirror 2Y. At this juncture, the diagram APA is conjugated with the surface of wafer or the fiducial plate FP under the wavelength of the He-Ne laser light, and the beam is converged thereto in the slit shape. In a case of TTL alignment system represented in FIG. 8, the beam spot produced by the LSA method is formed in the slit shape which is extended in the direction X at a rest position in the projection field PIF. When the wafer stage WST is scanned in the direction Y and the mark LSMy on the fiducial plate FP crosses the beam spot, the diffraction light and rays of the scattered light generated from this mark LSMy are caused to arrive at the photoelectric detector 139 through the projection lens PL, mirror 2Y, objective lens 3Y and beam splitter 135 and are received by photoelectric elements on the circumference other than the central photoelectric element. The photoelectric signals from these photoelectric elements are inputted into an LSA processing circuit 142 so as to be sampled digitally in response to the up down pulse signals UDP from the interferometer $IFY_2$ (or $IFY_1$) of the wafer stage WST. The processing circuit 142 stores the digitally sampled signal waveform in a memory and calculates the Y coordinate value of the wafer stage WST at the time when the center point of the slit shaped spot light of the LSA type in the direction Y and the center point of the mark LSMy in the direction Y are precisely matched in accordance with the stored waveforms. This coordinate value thus calculated is output as a mark positional information SSA. This information SSA is transmitted to the main control system 114 shown in FIG. 7 for the use of the driving control of the driving system 116 of the wafer stage WST.

Also, in the LSA processing circuit 142, there are provided the memory which performs the digital sampling of the photoelectric signals SSD from the photoelectric sensor 121 in FIG. 7 in response to the up down pulse signals UDP, and the circuit whereby to give a high-speed computation process to the signal waveforms stored in the memory. With these, the processing circuit outputs to the main control system 114 a coordinate value of the wafer stage WST as a projection positional information SSC of the reticle mark $RM_1$ when the projected image of the reticle mark $RM_1$ by the projection lens PL has been precisely matched with the light emission mark IFS.

Subsequently, in reference to FIG. 9 and FIG. 10, the structure of the off-axis alignment system OWA will be described in detail. FIG. 10 illustrates the structure of the off-axis alignment system OWA, and a reference mark IMP designates the wafer surface or the surface of the fiducial plate FP. An image on the surface area positioned in the field MIF of the objective lens 4B is formed on an index plate 4F through a prism mirror 4A, objective lens 4B, mirror 4C lens system 4D, and half mirror 4E. The light which illuminates the surface IMP advances through the half mirror 4E and then progressively through the lens system 4D, mirror 4C, the objective lens 4B, and the prism mirror 4A to the surface IMP. The illuminating light has a band width of approximately 300 nm which is extremely low in sensitivity to the resist layer of the wafer.

Figure 9:
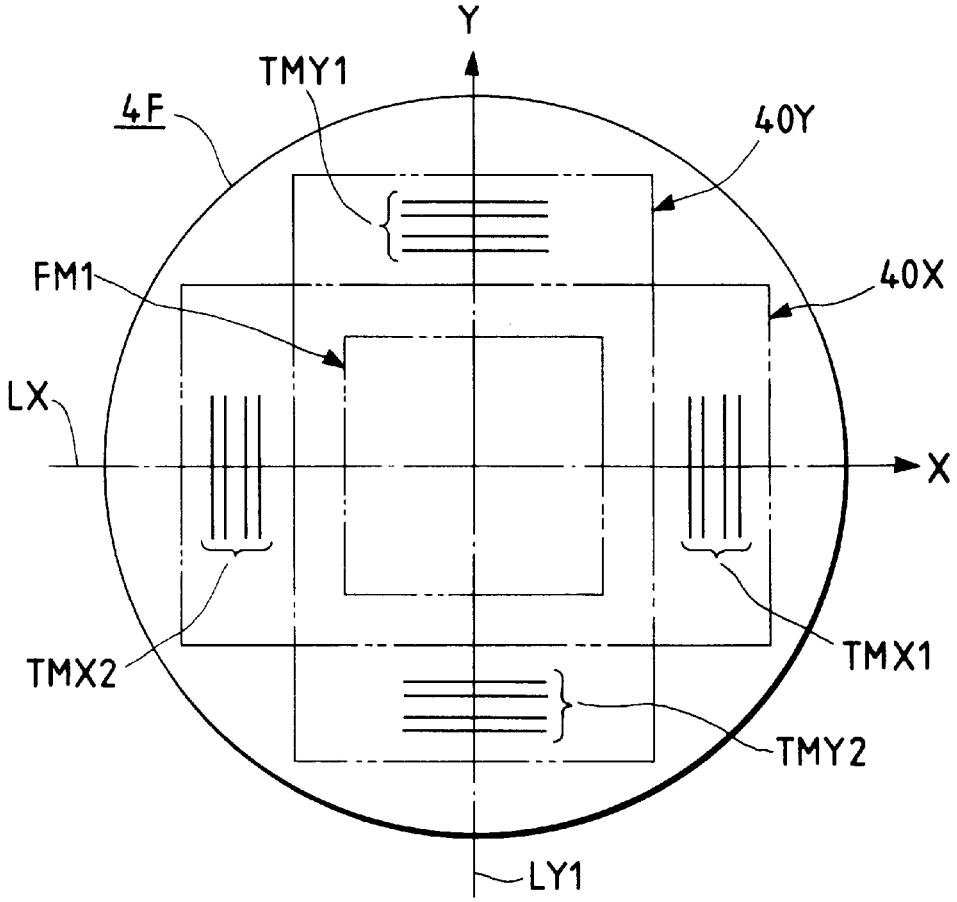
FIG. 9 is a view showing the pattern arrangement of the indication plane of an off-axis alignment system.
Figure 10:
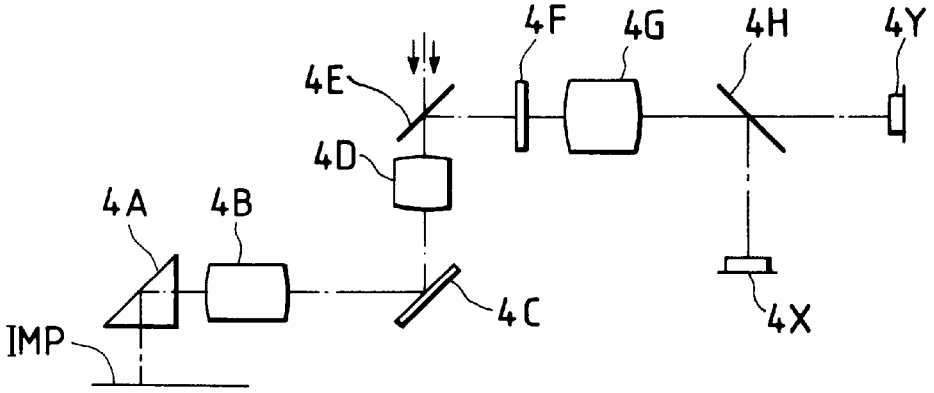
FIG. 10 is a view showing the structure of the off-axis alignment system.

As shown in FIG. 9, the index plate 4F is formed by arranging index marks $TMX_1$, $TMX_2$, $TMY_1$, and $TMY_2$ comprising a plurality of line patterns (four lines, for example) with shielding portions on a transparent glass. FIG. 9 shows a state that the intersecting point of the straight lines LX and $LY_1$ provided on the fiducial plate FP and the center of the index plate 4F are matched. The index marks $TMX_1$ and $TMX_2$ are arranged to sandwich the fiducial mark $FM_1$ on the fiducial plate FP in the direction X while the index marks $TMY_1$ and $TMY_2$ are arranged to sandwich the fiducial mark FM1 in the direction Y.

Now, the images of the respective index marks on the index plate 4F and the fiducial mark $FM_1$ (or mark on the wafer) are formed in enlargement on the two CCD cameras 4X and 4Y through the image formation lens 4G for taking image and half mirror 4H.

The image taking area of the CCD camera 4X is provided in the area 40X in FIG. 9 on the index plate 4F while the image taking area of the CCD camera 4Y is provided in the area 40Y. Then, the horizontal scanning line of the CCD camera 4X is defined in the direction X which is rectangular to the line patterns of the index marks $TMX_1$ and $TMX_2$ while the horizontal scanning line of the CCD camera 4Y is defined in the direction Y which is rectangular to the line patterns of the index marks $TMY_1$ and $TMY_2$. The image signals (composite video signals) from each of the CCD cameras 4X and 4Y are processed by a waveform processing circuit including a circuit for digitally sampling the signal level for each pixel, a circuit for adding the image signals (digital values) obtainable from each of the plural horizontal scanning lines to obtain its average, a circuit for computing each of the positional deviation amounts of the index marks TM and fiducial mark $FM_1$ in the directions X and Y at a high speed, and others. Then, the information of the positional deviation amounts is transmitted to the main control system 114 in FIG. 7 as an information SSE.

Figure 11:
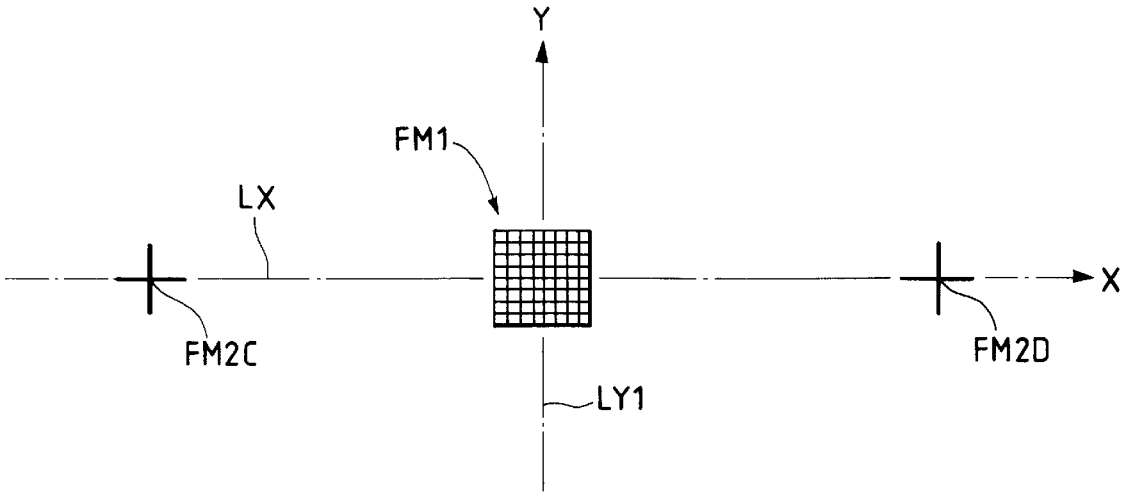
FIG. 11 is an enlargement of the fiducial mark $FM_1$ on the fiducial mark plate.

In this respect, the detection center or the off-axis alignment system OWA in the present embodiment is meant to be the bisector point of the two index marks $TMX_1$ and $TMX_2$ in the direction X as to the X direction, for example, and in the direction Y, the bisector point of the two index marks $TMY_1$ and $TMY_2$ in the direction Y. In some cases, however, only the center point of the index mark $TMX_2$ or $TMX_1$ in the direction X may be used instead of the bisector point of the two index marks $TMX_1$ and $TMX_2$, for example FIG. 11 is an enlargement of the fiducial mark $FM_1$ formed on the fiducial plate FP, which is formed as a two dimensional pattern in which a plurality or line patterns extending in the direction Y are arranged at predetermined pitches in the direction X while the line patterns extending in the direction X are arranged at a predetermined pitches in the direction Y.

For the positional detection of this fiducial mark $FM_1$ in the direction X, the image signals from the CCD camera 4X are analyzed by the waveform processing circuit, and the averaged position of each of the detected positions (pixel positions) of the plural line patterns arranged in the direction X is defined as the X directional position of the fiducial mark FM. Then, the deviation amount with respect to the central position of the index marks $TMX_1$ and $TMX_2$ are obtained. The detection of the fiducial mark $FM_1$ in the direction Y is conducted by the CCD camera 4Y in the same manner.

Figure 12:
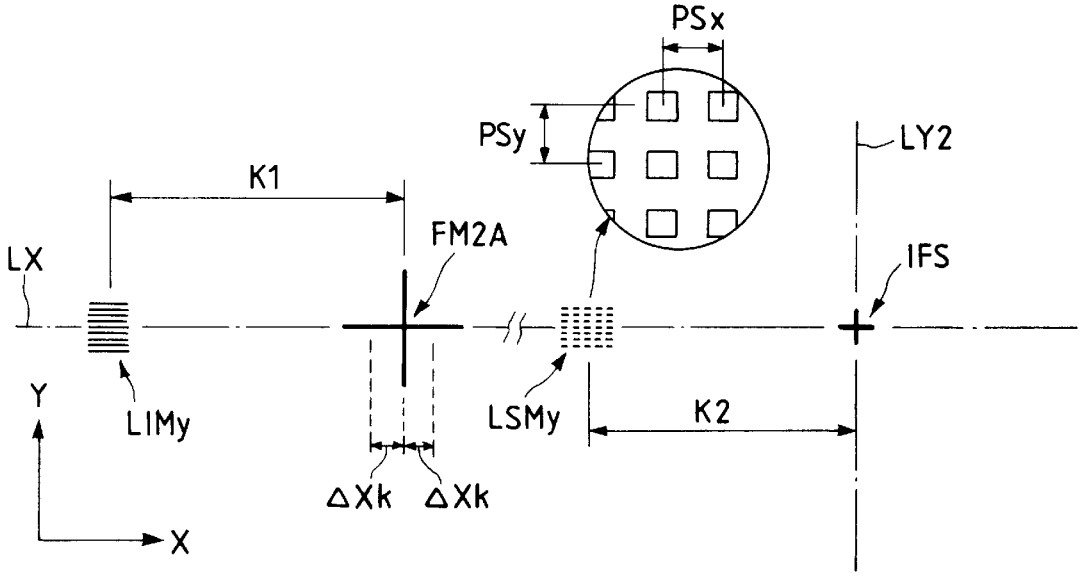
FIG. 12 is an enlargement of the fiducial marks $FM_2$, LIM, and LSM on the fiducial mark plate.

Now, as described earlier in conjunction with FIG. 5, the arrangement of each of the marks on the fiducial plate FP to be detected by the TTR alignment system and TTL alignment system is defined to be in a predetermined positional relationship. Here, in reference to FIG. 12, the description will be made further thereof. FIG. 12 is an enlargement showing each of the marks positioned on the straight line LX. The mark LIMy is a diffraction grating in which grating elements are arranged in the direction Y at a predetermined pitch (8 $\mu$m, for example). The mark LSMy is a two dimensional grating pattern in which fine square dot patterns are arranged in the direction X at pitches PSx and in the direction Y at pitches PSy as shown in a circle in enlargement. The mark LSMy is the one to be detected by the beam spot of the TTL alignment system of LSA type in the direction Y, and the beam spot is of a slit type extending in the direction X and its beam width in the direction Y is substantially the same as the dimension of the dot pattern in the direction Y. In this respect, the pitches PSx in the direction X contribute to the generatin of the diffraction light at the time of the mark detection. The pitches PSy the direction Y serve to provide a multimark by arranging a plurality of diffraction marks in the direction Y. Therefore, if there is no need for providing any multimark, it sufficies if only dot pattern group of one kind is arranged on the straight line LX.

Also, while the pitch PSx in the direction X is uniformly determined by the diffraction angle of the primary diffraction light required for the wavelength of the beam spot, the pitch PSy in the direction Y can be the same as or larger than the pitch PSx.

Now, as described in conjunction with FIG. 5, the interval $K_1$ between the center point of the marl LIMy in the direction X and the center point of the fiducial mark FM2A in the direction X and the interval $K_2$ between the center point of the light emission mark IFS in the direction X and the center point of the mark LSMy in the direction X are in a relation ship $K_1=K_2\pm\Delta Xk$. This condition is only required for the substantial matching of the center of the mark detection area (the illuminating area of the interference fringes) or the TTL alignment system of L1A type according to the present embodiment and the center point of the mark detection (beam spot) of the TTL alignment system of LSA type. Therefore, the relationship is not necessarily confined to the above-mentioned condition.

The alignment system described in conjunction with FIG. 8 is also structured exactly in the same way in the direction X, and the positional information of each of the marks in the direction X is transmitted to the main control system 114.

Now, before the base line measurement and the operation of each alignment by the apparatus (stepper) according to the present embodiment will be described, the correction of errors that may take place when the fiducial plate FP is mounted on the wafer stage WST is described. Of the possible errors in mounting the fiducial plate FP, the one which will affect the accuracy ultimately is a rotational error which is residual in the X-Y coordinate system of the fiducial plate FP.

Traditionally, for the mounting of a fiducial plate of the kind on a wafer stage, it has been proposed that the plate is fixed with a set screw and others to make fine adjustments possible (such as disclosed in U.S. Pat. No. 4,414,749). However in consideration of changes in the elapsing time, it is extremely disadvantageous to adopt a fixing method of fiducial plate with a fine adjustment mechanism from the viewpoint of stability in accuracy. Accordingly, it is desirable to fix the fiducial plate FP on the wafer stage firmly without allowing even a slightest displacement (nm order).

In any fixing methods to be adopted, it is prepared to obtain the amount of the residual rotation error in advance for the fiducial plate FP according to the present embodiment.

The residual rotation error referred to here is meant to be the degree of the parallelization between the straight line LX provided on the fiducial plate FP shown in FIG. 4 and the reflective plane of the movable mirror IMy shown in FIG. 3. The control of the coordinating position for the wafer stage WST is carried out all by the operations of the interferometers IFX, IFY (or $IFY_2$) as reference, and it is equally mentioned that each of the reflecting planes of the movable mirrors IMx and IMy serves to be the reference for measuring the coordinating position. Hence, the parallelism between the reflection plane of the movable mirror IMy and the straight line LX on the fiducial plate FP presents a problem. Also, as a mounting error, there is possible displacement (translational error) in parallelism in each direction, that is the Y direction which is perpendicular to the reflecting plane of the movable mirror IMy and the X direction which is perpendicular to the reflecting plane of the movable mirror IMx. However, this can be corrected when positioning the wafer stage WST, and those translational error presents almost no problem.

Figure 13A:
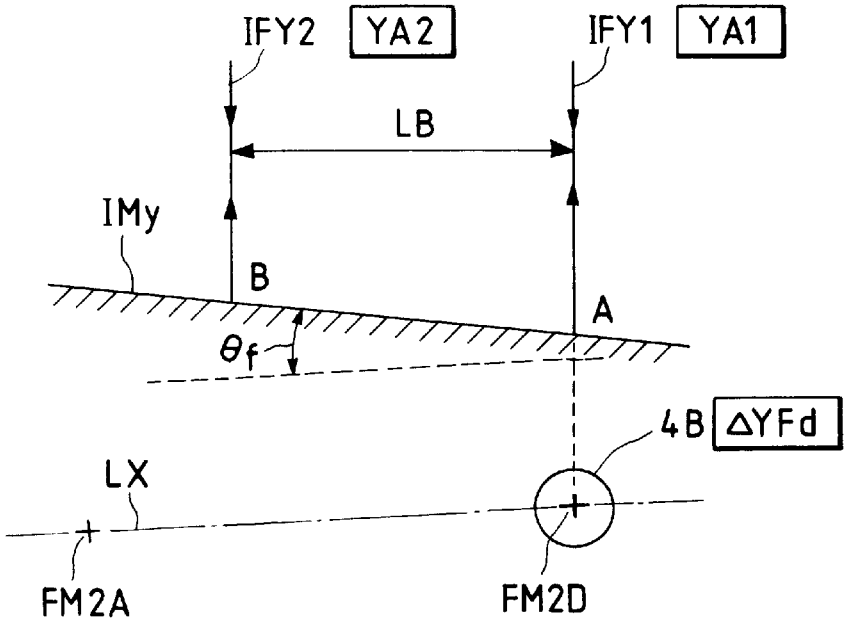
FIGS. 13A and 13B are views illustrating the error in taking the fiducial mark plate to the wafer stage and the measurement method therefor

Now, the residual rotational error of the fiducial plate FP can be obtained either by the self check conducted by the stepper in FIG. 2 or by a pilot exposure using a wafer. Here, as an example, the self check method will be described. Among the alignment sensors for the stepper shown in FIG. 2, it is only the off-axis type wafer alignment system OWA that while the mark detection in the direction Y is possible, the Abbe's condition can be satisfied with respect to either one of the two interferometers $IFY_1$ and $IFY_2$. Accordingly, in the present embodiment, the mark detection function of the alignment system OWA in the direction Y will be used with the interferometer $IFY_1$ as reference. At first, the coordinate positions of the fiducial marks FM2A and FM2D on the fiducial plate FP in the direction Y respectively are measured by the off-axis alignment system OWA. To this end, as shown in FIG. 13A, a bar mark which is extended in the direction X of the fiducial mark FM2D is positioned in the field of the objective lens 4B to obtain the positional deviation amount in the direction Y between the index marks $TMY_1$ and $TMY_2$ shown in FIG. 9. In this case, it may be possible to align the bar mark which is extend in the direction X of the fiducial mark FM2D only with either one of the index marks $TMY_1$ and $TWY_2$. Here, in FIG. 13, it is assumed that the straight line LX on the fiducial plate FP and movable mirror IMy is relatively rotated by θf, and its representation is exaggerated.

In any case, with the index marks $TMY_1$ and $TMY_2$ as reference the deviation amount ΔYFd in the direction Y of the fiducial FM2D is detected by on the basis of the image signals from the CCD camera 4Y shown in FIG. 10. The positional deviation amount is obtainable as an information SSE inputted in the main control system 114 shown in FIG. 7.

Simultaneously, the measured values YA1 and YA2 of the interferometers $IFY_1$ and $IFY_2$ when the fiducial mark FM2D is being detected by the objective lens 4B are stored in the main control system 114.

Figure 13B:
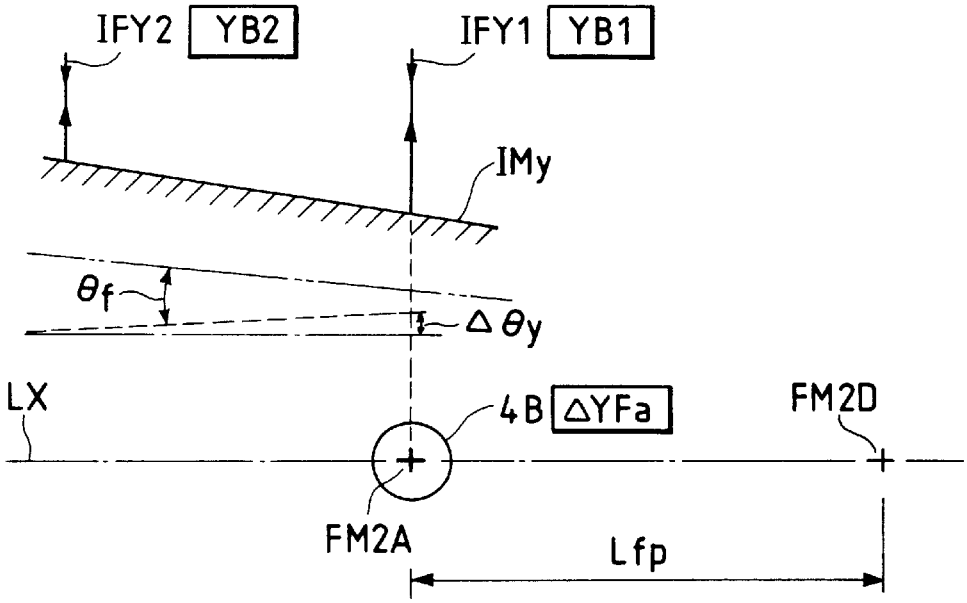

Subsequently, the wafer stage WST is driven in the direction X by a predetermined amount Lfp, and the bar mark which is extended in the direction X of the fiducial mark FM2A is positioned with respect to the index marks $TMY_1$ and $TMY_2$ of the off-axis alignment system OWA. This state is illustrated in FIG. 13B.

The predetermined amount Lfp is defined at this juncture to be equal to the designed interval between the fiducial marks FM2A and FM2D in the direction X.

Then, likewise, the deviation amount ΔYFa of the fiducial mark FM2A in the direction Y and each of the measured values $YB_1$ and $YB_2$ of the interferometers $IFY_1$ and $IFY_2$ are obtained.

With the above-mentioned operation, the measuring preparation work has been completed, and it is now possible to obtain the amount θf of the residual rotation error by computation.

At first, a rotational error θf' can be obtained by an equation given below approximately on the assumption that there is no yawing when the wafer stage WST is driven in the direction X for a predetermined amount Lfp.

$$\theta f' = (YA_1 - \Delta YFd) - (YB_1 - \Delta YFa)/Lfp \quad (1)$$

$$= (YA_1 - YB_1) + (\Delta YFa - \Delta YFd)/Lfp$$

However, if any yawing takes place, a fine rotational error portion Δθy of the wafer stage WST due to this yawing should be included in the equation (1).

Consequently, the real residual rotation error θf can be expressed by the following equation:

$$\theta f = \theta f' - \Delta\theta y \quad (2)$$

The rotational error Δθy due to the yawing can be obtained by:

$$\Delta\theta y \cong (YA_1 - YA_2)/LB - (YB_1 - YB_2)/LB \quad (3)$$

Here, LB is the interval between the respective measuring axes in the direction X of the two interferometers $IFY_1$ and $IFY_2$.

Now, let it be assumed that the same measuring is performed using the fiducial mark FM2C instead of the fiducial mark FM2D. Then, the designed interval between the fiducial marks FM2A and FM2C in the direction X becomes equal to the interval LB between the interferometers $IFY_1$ and $IFY_2$ in the direction X. Therefore, the predetermined driving amount Lfp or the wafer stage WST also becomes Lfp=LB.

Because of this, when the fiducial marks FM2A and FM2C (or FM2B and FM2D) are used, the equation (3) will be as follows:

$$\Delta\theta y \cong (YA_1 - YB_2) + (YB_2 - YA_2)/Lfp \quad (4)$$

Therefore, the residual rotation error θf can be obtained as follows from the equations (1), (2), and (4):

$$\theta f \cong \theta f' - \Delta\theta y = (\Delta YFa - \Delta YFd) - (YB_2 - YA_2)/Lfp \quad (5)$$

In other words, when the interval between the two fiducial marks in the direction X used for measuring is equal to the interval LB between the two interferometers $IFY_1$ and $IFY_2$ in the direction X, it becomes unnecessary to monitor the measured values ($YA_1$ and $YB_1$) of the interferometer $IFY_1$ which have been regarded as reference.

Now, the residual rotational error θf of the fiducial plate FP for the movable mirror IMy is obtainable as set forth above. This value is stored in the main control system 114 In this respect, four fiducial marks are provided along the straight line LX on the fiducial plate FP Thus, the residual rotational error is obtained using two arbitrary fiducial marks out of the four, and it may be possible to adopt its mean value For example, an arithmetic mean value $(\theta f_1 + \theta f_2)/2$ can be a residual rotational error of the fiducial plate FP where $\theta f_1$ is a rotational error obtained by detection of the fiducial marks FM2A and FM2C and $\theta f_2$ is a rotational error obtained by detection of the fiducial marks FM2B and FM2D. Further, on the straight line LX, the marks LIMy, LSMy, IFS, $FM_1$ are arranged. Therefore, it may be possible to detect any two of them by the off-axis alignment system OWA for the measurement of the mark position in the direction Y. In any events, the distance between the marks in two locations to be measured in the direction X should be desirably be as long as possible for securing its accuracy Also, the measuring method for the residual rotation error by the self check set forth above is an example. Some other method by the self check is conceivable, which will be referred to when the operational sequence is described later.

Moreover, the above-mentioned measuring method is such as obtaining the residual rotational error θf. However, as the θf is detected as an offset value when the wafer alignment is conducted by the off-axis alignment system OWA, a method for obtaining the θf by examining the vernier after exposure is conceivable In other words, using the off-axis alignment system OWA an overlapped exposure is performed on the test wafer, it is possible to obtain the residual mounting error θf by reading the vernier for checking the overlapping accuracy in the directions X and Y subsequent to the resist pattern having been developed. Of this method, the detailed description will be made later.

Now, the operation of the base line measurement by the apparatus according to the present embodiment will be described. The operation described herein is a typical one and some of its variations will be described later colletively.

Figure 14:
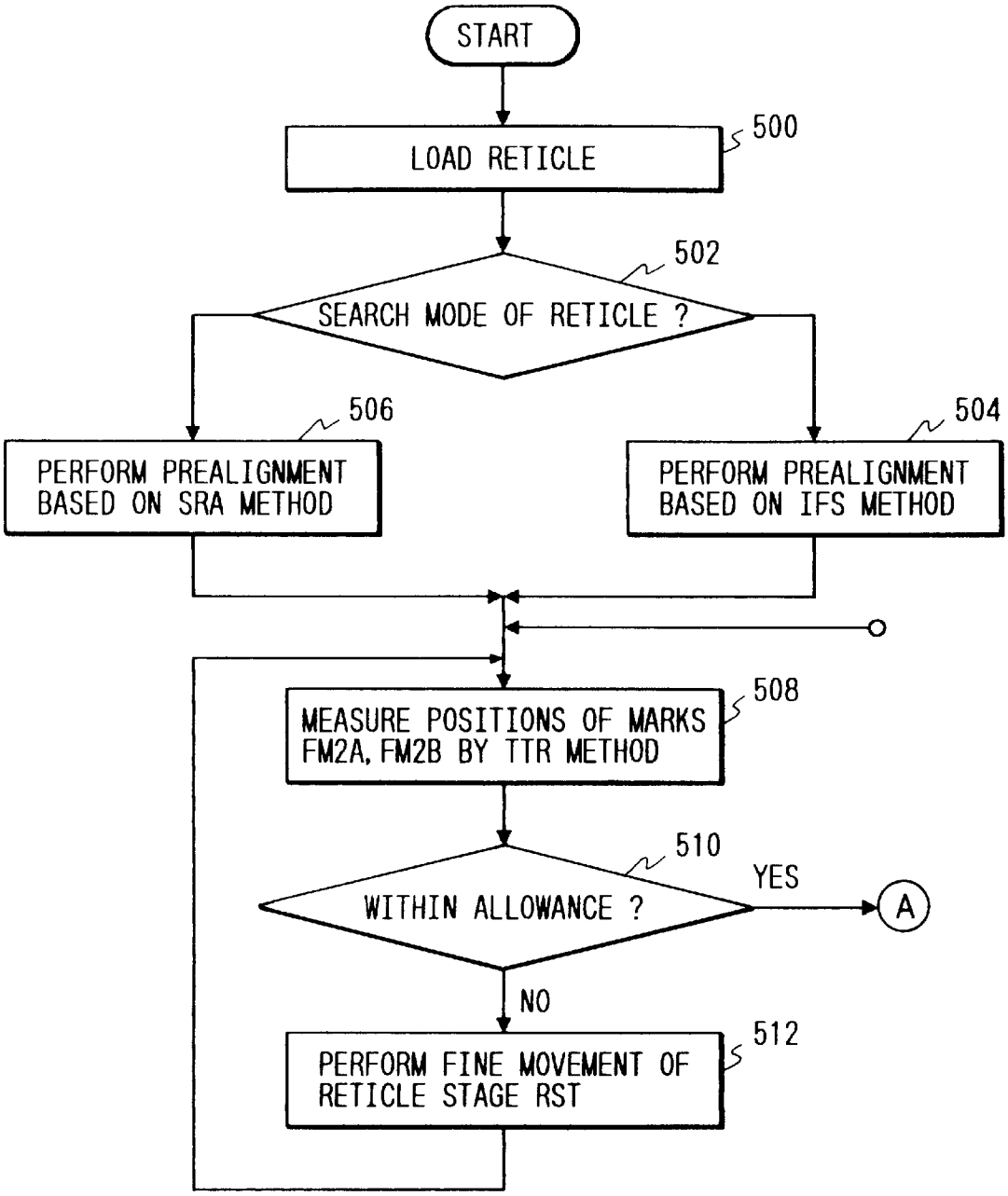
FIG. 14 is a view illustrating the typical sequence for the apparatus.
Figure 15:
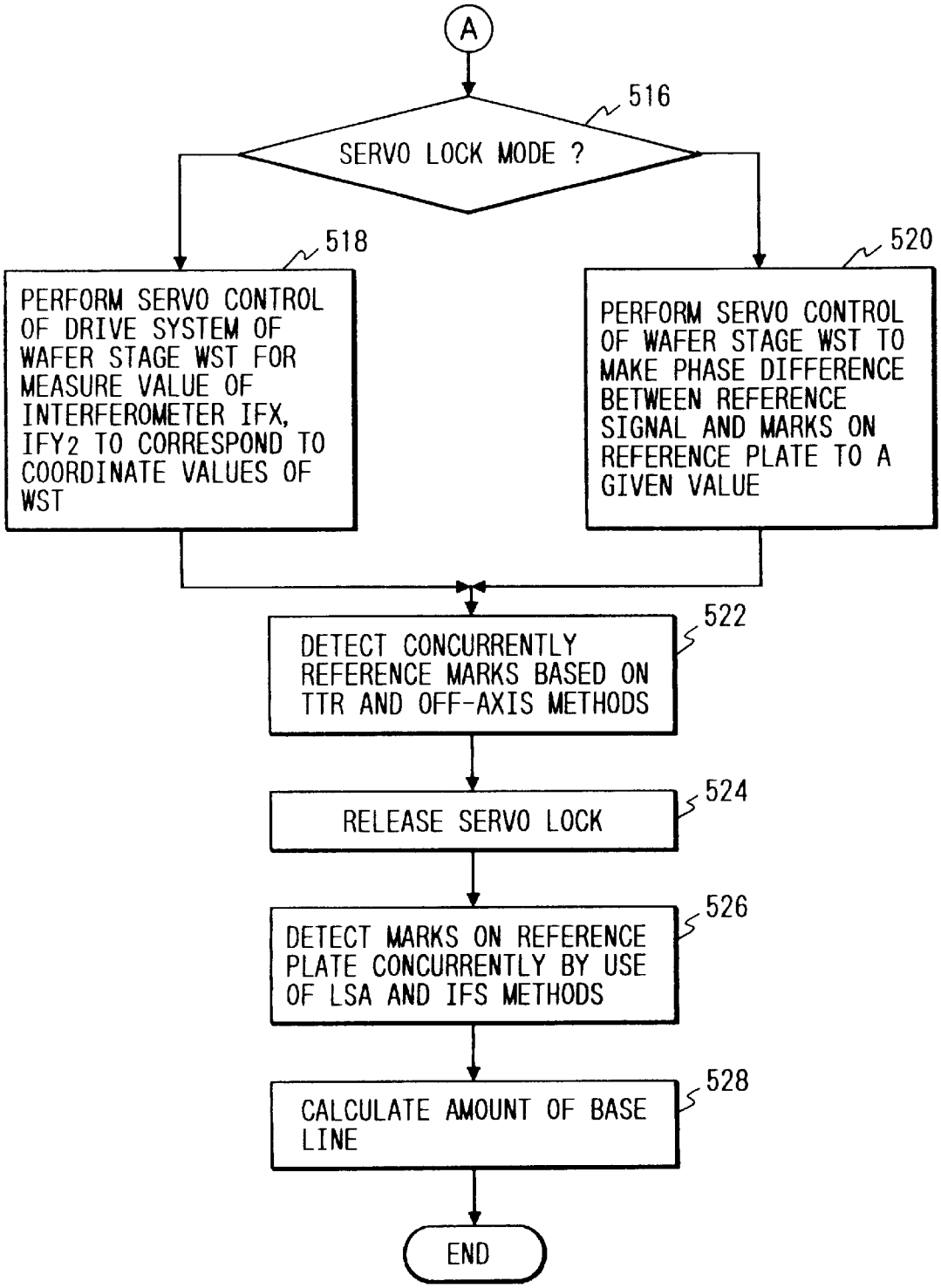
FIG. 15 is a view illustrating the typical sequence for the apparatus.

FIG. 14 and FIG. 15 are flowcharts showing the typical sequence This typical sequence is mainly controlled by the main control system 114 integrally.

At first, the reticle R which is stored in a predetermined storage position is transferred automatically or manually for its loading to the reticle stage RST only with the precisions mechanically available for delivering and positioning (step 500). In this case, the loading precision of the reticle R should desirably be less than ±2 mm provided that the window area (inner side of the shielding zone SB) shown in FIG. 6 is approximately 5 mm square in its size and the length of the double slit marks $RM_1x$ and $RM_2y$ is approximately 4 mm.

Then, the main control system 114 executes a reticle search for the preliminarily rough alignment (prealignment) of the position of reticle R so that the marks $RM_1$ and $RM_2$ of the reticle R can be normally detected by the TTL alignment systems 1A and 1B. For this reticle search, there are two kinds, SRA method and IFS method, as shown in steps 504 and 506 in FIG. 14. In step 502, the mode selection is executed. The prealignment by the IFS method to be selected in the step 504 is such that as shown in FIG. 6, the wafer stage WST is driven by a large stroke (several mm, for example) for searching in the directions X and Y so that the possible position of the reticle mark $RM_1$ or $RM_2$ is searched by the light emission mark IFS while the position of the reticle stage RST is kept stationary, and then the positions of the reticle marks $RM_1$ and $RM_2$ are roughly detected by the interferometers IFX, and $IFY_2$ thereby to obtain the deviation amount of the detected positions from the designed positions (where they are supposed to be located), hence making it possible to drive finely the reticle stage RST depending on the interferometers IRX, IRY, and IRθ for the reticle stage RST.

On the other hand, the prealignment by the SRA method to be selected in the step 506 is executed as given below The blank surface of the fiducial plate FP is arranged directly below the possible positions of the reticle marks $RM_1$ and $RM_2$, and in such a state, the TTR alignment systems 1A and 1B are used to allow the CCD cameras 112X and 112Y (FIG. 7) to take the image of patterns on the reticle R. Thus, the image signal waveforms corresponding to the horizontal scanning line in the first flame are stored in a memory. Then, the reticle stage RST is driven for a predetermined amount in the direction X or direction Y by the driving system 115 in accordance with the measured values of the interferometers IRX, IRY, and IRθ. Subsequently, the image signal waveforms of the second flame are received from the CCD cameras to connect them to the signal waveforms of the first flame. After that, the joined image signal waveforms are analyzed to obtain each position of the reticle mars $RM_1$ and $RM_2$. Hence, with this method, the deviation amounts from the designed positions are obtained for the required driving of the reticle stage RST.

In any one of the search modes, the center of each of the reticle marks $RM_1$ and $RM_2$ of the reticle R can be prealigned with the center of the photographing area for each of the CCD cameras 112X and 112Y provided respectively for the two TTR alignment systems 1A and 1B at a high speed with an accuracy of approximately several μm.

Now, the main control system 114 enters the reticle alignment operation beginning at the step 508. Before that, however, the driving system 116 is controlled in accordance with the measured values of the interferometers IFX, $IFY_2$ (or $IFY_1$) to position the wafer stage WST so as to set each of the two fiducial marks FM2A and FM2B at the designed positions in the field PIM of the projection lens PL. When the position of the wafer stage WST is set, the fiducial mark FM2A (FM2B) is taken by the CCD cameras 112X and 112Y in a state that it is substantially aligned with the reticle mark $RM_1$ ($RM_2$). At this stage, the processing circuits 113X and 113Y in FIG. 7 are actuated to calculate the positional deviation amounts ($\Delta XR_1$ and $\Delta YR_1$) in the directions X and Y of the reticle mark $RM_1$ with respect to the fiducial mark FM2A as well as the positional deviation amounts ($\Delta XR_2$ and $\Delta YR_2$) in the directions X and Y of the reticle mark $RM_2$ with respect to the fiducial mark FM2B.

Now, in step 510, whether each of the positional deviation amounts is within the tolerance value or not is determined. If it is beyond the tolerance value, the process proceeds to step 512. At this juncture, as clear from the shapes and arrangements of the two reticle marks $RM_1$ and $RM_2$, it is possible to achieve the alignment of the reticle R in the direction X by making the polarities and absolute values of the deviation amounts $\Delta XR_1$ and $\Delta XR_2$ equal provided that it is given as positive if each of the center points of the reticle marks $RM_1$ and $RM_2$ is respectively deviated toward the reticle center CC with respect to each of the center points of the fiducial marks FM2A and FM2B, and given as negative if deviated in the opposite direction.

Likewise, it is possible to achieve the alignment of the reticle R in the direction Y and direction θ by making the polarities and absolute values of the deviation amounts $\Delta YR_1$ and $\Delta YR_2$ in the direction Y equal provided that it is given as positive if the center point of each of the reticle marks $RM_1$ and $RM_2$ is deviated toward the positive direction of the Y axis of the static coordinate system. The deviation amount ΔθR of the reticle R in the direction θ (rotational direction) can be obtained by the following equation from the deviating amounts $\Delta YR_1$ and ΔYR2 (real dimensions on the reticle) in the direction Y where the interval between the reticle marks $RM_1$ and $RM_2$ in the direction X is Lrm:

$$\Delta\theta R=\sin^{-1}((\Delta YR_1-\Delta YR_2)/Lrm)\cong(\Delta YR_1-\Delta YR_2)/Lrm \quad (6)$$

However, there should be no problem even if the evaluation of the deviating amount of the reticle R in the direction θ is simply made by obtaining the absolute value $\Delta YR_1-\Delta YR_2$ because the interval Lrm is accurately defined in advance for any one of the reticles. From the above, if the deviating amounts of the reticle R in the directions X, Y, and θ are greater than the allowable amounts, the reticle stage RST is driven finely in step 512. At this juncture, the required amounts for such fine drivings in the direction X, direction Y, and direction θ are calculated on the basis of the each of the deviating amounts ($\Delta XR_1$, $\Delta YR_1$) and ($\Delta XR_2$, $\Delta YR_2$). Therefore, while monitoring the positions of the reticle stage RST by the three interferometers IRX, IRY, and IRθ, the stage is finely driven to the correcting postions. This method is the so-called open control system, and if the control accuracy of the driving system 115 and the positioning accuracy of the reticle stage RST are sufficiently high and stable, it is possible to align the reticle R at the target position precisely with only one-time positional deviation measurement (step 508) and one-time positional correction (step 512). However, whether or not the alignment at the target position has been executed by the positional correction must be verified, it is necessary for the main control system 114 to repeat the operations beginning at the step 508.

With the above-mentioned steps 508 to 510, the reticle R is aligned with respect to the designed coordinating positions of the fiducial marks FM2A and FM2B on the fiducial plate FP.

Now, the reticle R is thus aligned with respect to the fiducial marks FM2A and FM2B, but due to the constant residual rotation error θf that the fiducial plate FP has against the reflecting plane of the movable mirror as described earlier in conjunction with FIG. 13, the reticle R is, strictly speaking, rotated by θf after the alignment with respect to the reflecting plane of the movable mirror.

Therefore, in the step 512 where the reticle stage RST is finely driven, it is arranged that the alignment position with to the fiducial mark FM2A of the reticle mark $RM_1$ is further allowed to have offsets of ($\Delta Ox_1$, $\Delta Oy_1$) and the alignment position with respect to the fiducial mark FM2B of the reticle mark $RM_2$ is further allowed to have offsets of ($\Delta Ox_2$, $\Delta Oy_2$) Here, the offsets $Ox_1$ and $Ox_2$ in the direction X can be zero for both of them while the offsets $\Delta Oy_1$ and $\Delta Oy_2$ in the direction Y can be defined as follows:

$$\Delta Oy_1 = Lrm \cdot \theta f/2$$

$$\Delta Oy_2 = -Lrm \cdot \theta f/2$$

Consequently, when the reticle R is aligned with the fiducial plate FP as reference, the final condition with the mounting error (θf) of the fiducial plate FP having been taken into account is provided with the positional deviating amounts defined as follows when each of the marks are detected in the TTR alignment system:

$$\text{Direction X: } \Delta XR_1 = \Delta XR_2 \rightarrow 0$$

$$\text{Direction Y: } \Delta YR_1 \rightarrow \Delta ORy_1 (= \Delta YR_1 + \Delta Oy_1)$$

$$\Delta YR_2 \rightarrow \Delta ORy_2 (= \Delta YR_2 + \Delta Oy_2)$$

For the establishment of the final alignment positions with these offsets having been executed, it may be possible to adopt the open control system using the interferometers IRX, IRY, and IRθ for the reticle or to drive the reticle stage RST with the closed loop control using the positional deviating values ($\Delta YR_1$, $\Delta YR_2$) obtainable from the each of the processing circuits 113X and 113Y of the TTR alignment system as deflecting signals and the above-mentioned final positional deviating amounts ($\Delta ORy_1$, $\Delta ORy_2$) as target values.

Now, there is a method in which the reticle marks $RM_1$, $RM_2$ and the TTR alignment system are used besides the methods described in the case of obtaining the residual rotational error θf of the fiducial plate FP and in conjunction with FIG. 13. Such method can be implemented by providing additionally a step before the step 508 in the flowchart shown in FIG. 14, in which the reticle marks $RM_1$, $RM_2$ and the fiducial marks FM2C, FM2D are aligned by the TTR method.

In other words, when the prealignment of the reticle R is completed in the step 504 or step 506, the coordinate positions of the fiducial marks FM2C and FM2D are measured with the reticle marks $RM_1$ and $RM_2$ as tentative reference points because the reticle R has been set with a precision of ±several μm. At this juncture, the reticle marks $RM_1$ and $RM_2$ are positioned almost symmetrically to the optical axis AX of the projection lens PL in the direction X. Strict speaking, therefore, an Abbe's error is included in each of the positional deviating amount ΔY2C of the reticle mark $RM_1$ and the fiducial mark FM2C in the direction Y detected by the TTR alignment system 1A and the positional deviating amount ΔY2D of the reticle mark $RM_2$ and the fiducial mark FM2D in the direction Y by the TTL alignment system 1B. However, if the arithmetic mean value ΔYRC [(ΔY2C+ΔY2D)/2], which expresses the deviating amount between the center point of the reticle R and the center point of the fiducial mark FM1 in the direction Y, is obtained, the Abbe's error portion should be canceled by the arithmetic mean.

Therefore, the measured value $Yfm_1$ of the interferometer $IFY_2$ is stored when the deviating values ΔY2C and ΔY2D are being detected by the TTR alignment systems 1A and 1B to obtain the value $YF_1 = Yfm_1 - \Delta YRC$. Then, it becomes possible to obtain the Y coordinate value $YF_1$ of the center point of the fiducial mark FM1 (the center point of the fiducial marks FM2C and FM2D in the direction X) with the center point of the reticle R as reference.

As regards the direction X, it sufficies if only the deviating amount ΔXRC[(ΔX2C−ΔX2D)/2] between the center point of the reticle R and the center point of the fiducial mark FM1 in the direction X is obtained in consideration of the orientation (positive or negative) thereof on the basis of the deviating amount ΔX2C detected by the TTR alignment system 1A and the deviating amount ΔX2D detected by the TTR alignment system 1B. At this juncture, the X coordinate position of the wafer stage WST is detected as $Yfm_1$ by the interferometer IFX. Then, by working out $XF_1 = Yfm_1 - \Delta XRC$, it is possible to obtain the X coordinate value $XF_1$ of the center point of the fiducial mark FM1 with the center point of the reticle R as reference.

The coordinate values ($XF_1$, $YF_1$) obtained as set forth above are the values including the distance from each of the reflecting planes of the movable mirrors IMy and IMx to the center point of the fiducial mark FM1 with the interferometers IFX and $IFY_2$ as references.

Now, the wafer stage WST is driven to execute step 508 in FIG. 14. As described earlier, in the step 508, each of the positional deviating amounts between the reticle marks $RM_1$, $RM_2$ and the fiducial my FM2A, FM2B are obtained by the TTR alignment systems 1A and 1B at first. The positional deviating amounts of the fiducial mark FM2B with respect to the reticle mark $RM_1$ are ($\Delta XR_1$, $\Delta YR_1$) while the positional deviating amounts of the fiducial mark FM2B with respect to the reticle mark $RM_2$ are ($\Delta XR_2$, $\Delta YR_2$). At this juncture, the coordinate values ($Xfm_2$, $Yfm_2$) of the wafer stage WST obtained at the time of detection of the fiducial marks FM2A, FM2B by the TTR alignment system are stored from the interferometers IFX and $IFY_2$ although this has not been required in the step 508 in FIG. 14.

From the above-mentioned measurement results, the main control system 114 obtains the coordinate values ($XF_2$, $YF_2$) of the center point of the fiducial mark $FM_2$ (the center points of the marks FM2A and FM2B in the direction X) with the center point of the reticle R as reference as follows:

$$XF_2=Xfm_2-(\Delta XR_1-\Delta XR_2)/2$$

$$YF_2=Yfm_2-(\Delta YR_1-\Delta YR_2)/2$$

The coordinate values ($XF_2$, $YF_2$) are the values including the distance from each of the reflecting planes of the movable mirrors IMy and IMx to the center point of the fiducial mark FM2 with the interferometers $IFY_2$ and IFX as references.

Therefore, the mounting error (rotational error) θf' of the fiducial plate FP including the yawing amount Δθy, when the wafer stage WST is driven from the detecting position of the fiducial marks FM2C and FM2D to the detecting position of the fiducial marks FM2A and FM2B, will be calculated by the following equation:

$$\theta f \cong YF_1-YF_2/XF_1-XF_2 \quad (7)$$

In this case, the variation of the difference between the measured value of the interferometer $IFY_1$ and the measuring value of the interferometer $IFY_2$ corresponds to the yawing amount Δθy. Consequently, the real mounting error θf can be obtained with such a correction as provided by the aforesaid equation (2).

During the period the above computation is being executed, the main control system 114 will execute the next steps 510 and 512. In other words, when the mounting error θf of the fiducial plate FP is obtained in the sequence in FIG. 14 as describe above, only the positional deviating amounts ($\Delta XR_1$, $\Delta RY_1$) and ($\Delta XR_2$, $\Delta RY_2$) which are initially measured in the step 508 are needed.

Subsequently, the main control system 114 will execute the operations beginning at step 516 as shown in FIG. 15. In step 516, whether the position of the fiducial plate FP is servo locked in accordance with the measured values obtained by the interferometers IFX, $IFY_2$ (or $IFY_1$) for the wafer stage WST or servo locked by the LIA method of the TTL alignment system is selected. If the servo lock using the interferometers is selected, the process will proceed to step 518 to store the coordinate values of the wafer stage WST at the time or the completion of the reticle alignment and perform the required servo control of the driving system 116 of the wafer stage WST so that the measured values of the interferometers IFX, $IFY_2$ (or $IFY_1$) are always matched with the stored values. If the servo lock by the LIA method is selected, the process will proceed to step 520 to set the shutters 132A and 132B shown in FIG. 8 as in the state shown in FIG. 8 and allow the respective marks LIMx and LIMy on the fiducial plate FP to be illuminated with interference fringes. Then, the wafer stage WST is servo controlled by the phase difference measuring circuit 140 so that the phase difference with the fiducial signals is always kept to be in a predetermined value respectively in the direction X and direction Y. In the case of the LIA method, the two marks LIMx and LIMy on the fiducial plate FP are aligned to the reference grating plate 138 fixed inside the TTL alignment systems While it is possible to servo lock the wafer stage WST with substantially the same precision irrespective of the interferometer mode on the basis of the measured values of the interferometers IFX, $IFY_2$ (or $IFY_1$) or the LIA mode in accordance with the TTL alignment, it has been ascertained according to experiments or simulations that the LIA mode is more stable than the interferometer mode. In general, the moving stroke of the wafer stage WST in the directions X and Y is greater than the diameter of the wafer. The stroke is required to be 30 cm or more, for example. Consequently, the length of the light path of laser beam from the interferometers IFX and $IFY_2$, which is exposed to the atmosphere is as much as several tens cm or more. Because of this, in spite of the wafer stage WST being strictly stationary, the values of the inner counters of the interferometers are varied in the order of 1/100 μm to 1/10 μm if a diffraction index locally fluctuates in the air on the optical path. Therefore, when the servo lock is performed in order to make the counter values of the interferometers constant, the position of the wafer stage WST may be finely moved due to the fluctuation of the diffraction index within a range of approximately ±0.08 μm in some cases. The fluctuation of the diffraction index takes place when lumps of air having temperature differential are caused to pass slowly through the optical path of the laser beam from the interferometer. The interferometer for the wafer stage has an ambient disadvantage such as this and in some cases, it lacks stability as compared with the LIA method. It is possible to provide a cover for the beam used for the LIA method so that it is not exposed to the atmosphere eventually. Further, if the beam is not exposed, there hardly occurs any fluctuation of diffraction index because the space between the reticle and projection lens and the space between the projection lens and wafer are approximately several cm only.

In consideration of the above, it is preferable to use the TTL alignment system as much as possible if the position of the fiducial plate FP (wafer stage WST) can be controlled by servo using the this alignment system in a state where the fiducial marks FM2A and FM2B are being detected by the TTR alignment systems.

Now, the main control system 114 performs the fiducial mark detections in step 522 using the TTR alignment system and off-axis alignment system simultaneously. In general, the reticle stage RST is finely driven to the target position in the earlier step 510, and when the alignment is completed, the reticle stage RST is fixed by a vacuum absorption and others to the column side which becomes its base. When this absorption is conducted, the reticle stage RST may be deviated laterally for a slight amount in some cases. The lateral deviation is extremely small, but it can be one of errors in view of the base line control and careful attention should be given. Such a care may be taken by repeating the measuring operation in the step 508 using the CCD cameras 112X and 112Y for the TTR alignment systems or by monitoring the variations of the measured values of the interferometers IRX, IRY, and IRθ from the completion of the reticle alignment. In the present embodiment, however, the arrangement has been made so that the base line value is controlled including such a lateral deviation. As a result, it is unnecessary to obtain the lateral deviation amount individually for its particular purpose.

Now, in the step 522, the fiducial mark FM1 on the fiducial plate FP has already been positioned in the detection area of the off-axis alignment system OWA.

Therefore, the main control system 114 obtains the positional deviating amounts (ΔXF, ΔYF) of the index mark TM in the index plate 4F and the fiducial mark FM1 in the directions X and Y as real dimensions on the wafer using the CCD cameras 4X and 4Y on the off-axis alignment system as shown in FIG. 10. At the same time, using the CCD cameras 112X and 112Y on the TTR alignment system, the positional deviating amounts ($\Delta XR_1$, $\Delta YR_1$) of the reticle mark $RM_1$ and fiducial mark FM2A and the positional deviating amounts ($\Delta XR_2$, $\Delta YR2$) of the reticle mark $RM_2$ and fiducial mark FM2B are measured as real dimensions on the wafer side. At this juncture, the processing circuits 113X, 113Y, and others are controlled in order to match the timing as much as possible for the storage of the image signal waveforms corresponding to the photographed images of the marks because the CCD cameras are of the photoelectric type for the TTR system and off-axis system as well. In general, however, the CCD camera outputs the image singals for one frame portion per 1/30 seconds. It is therefore unnecessary to synchronize the reception of the image signals strictly by the frame unit for the TTR system and the off-axis system. In other words, the required receptions of the signals are carry out almost simultaneously. It will be good enough if the signals are received within several seconds (preferably within a second), for example. In this respect, when the position of the fiducial plate FP is servo locked, it is necessary to set the reception of the image signal waveforms by the TTR system and that of the image signal waveforms by the off-axis system to be in an interval sufficinetly shorter than the time for the positional variation of the wafer stage due to the fluctuation of the air diffraction index.

Subsequently in step 524, the main control system 114 releases the servo lock of the wafer stage WST and proceeds to the operation in step 526 in which the driving (scanning) of the wafer stage WST is started for detecting each of the marks on the fiducial plate FP by the use of the LSA method and IFS method simultaneously.

In this step 526, the wafer stage WST is driven so that as described in conjunction with FIG. 6 and FIG. 5 earlier, the light emission slit mark IFS scans the reticle mark $RM_1$ two dimensionally. The wafer stage WST is at first positioned so as to set the light emission slit mark IFS to be in the positional relationship as shown in FIG. 6. Then, the beam spot of the slit type extended in the direction X by the TTL alignment system of the LSA method is at a deviated position in the direction Y with respect to the mark LSMy on the fiducial plate FP. Now, from such state, if the wafer stage WST is scanned in the direction Y, the waveforms of the photoelectric signal from the photoelectric detector 139 of the LSA method as well as of the photoelectric signal SSD from the photoelectric element 121 of the IFS method become as shown in FIG. 16. FIG. 16A shows the detected waveform of the mark LSMy received in the memory by the LSA method. Here, as the mark LSMy is formed with five pieces of diffraction grating patterns, five peaks are produced on the signal waveform. The processing circuit 142 shown in FIG. 8 obtains each of the gravitational positions for the five peak waveforms and works out its mean value as the Y coordinate position for the mark LSMy.

On the other hand, the signals SSD obtainable by the IFS method include the two-bottom waveform portions as shown in FIG. 16B with respect to the double slit mark $RM_1y$ of the reticle mark $RM_1$. The processing circuit 142 obtains the respective center points of the two bottom waveforms in the signal waveforms in FIG. 16B in order to work out its center point as the central coordinate position YIf of the projected image of the double slit mark $RM_1y$ in the direction Y.

Likewise, as indicated in FIG. 6 by an arrow in the direction X, the light emission slight mark IFS is driven to scan the double slit mark $RM_1x$ of the reticle mark $RM_1$. At this juncture, the slit type spot by the LSA method of the TTL alignment system in the direction X is being scanned by the mark LSMx on the fiducial plate FP simultaneously, so that the same waveforms as shown in FIG. 16 are obtained. In this case, the X coordinate value of the mark LSMx detected by the LSA method in the direction X is XLs while the X coordinate value of the double slit mark $RM_1x$ detected by the IFS method is XIf.

As shown in FIG. 16, the difference between the coordinate positions YLs and YIf is the base line value between the center point detected by the LSA method of the TTL alignment system in the direction Y and the projected point of the center CC of the reticle R in the direction Y.

Subsequently, the main control system 114 operates the computation to obtain the base line value in step 528. The parameters required for this computation are separated into the measured real values obtained by the measurements as shown in the table in FIG. 17 and the constant values predetermined for the system design. For the measured real values shown in the table in FIG. 17, [TTR−A] means the TTR alignment system 1A in FIG. 2 while [TTR−B] means the TTR alignment system 1B. Also, the measured real values for each of the alignment systems are classified by the positional deviating amounts or mark coordinate positions in the direction X and direction Y. On the other hand, for the designed constant values, each of the distances ($\Delta Xfa$, $\Delta Yfa$) in the directions X and Y between the center point of the fiducial mark FM1 and the fiducial mark FM2A and each of the distances ($\Delta Xfb$, $\Delta Yfb$) in the directions X and Y between the center point of the fiducial mark FM1 and the fiducial mark FM2B are precisely measured in advance with the straight line LX as reference and are stored.

The main control stem 114 works out the distance from the bisector point of the line portion connecting each of the center points of the fiducial marks FM2A and FM2B to the center point of the fiducial mark FM1 in the direction X on the basis of the constant values $\Delta Xfa$ and $\Delta Xfb$ as follows:

$$LF=(\Delta Xfa+\Delta Xfb)/2 \tag{8}$$

Then, the main control system 114 obtains ½ of the difference between the deviating amount $\Delta XR_1$ in the direction X obtainable from TTR-A and the deviating amount $\Delta XR_2$ obtainable from TTR-B as the deviating amount $\Delta Xcc$ on the dimension for the wafer side as follows:

$$\Delta Xcc=(\Delta XR_1-\Delta XR_2)/2 \tag{9}$$

Here, the values $\Delta XR_1$ and $\Delta XR_2$ are assumed to be positive when the reticle marks $RM_1$ and $RM_2$ are deviated toward the center of the reticle with respective to the fiducial marks FM2A and FM2B respectively, and negative when deviated in the opposite direction.

If the value $\Delta Xcc$ thus obtained by the equation (9) is zero, it is considered that the projection point of the center CC of the reticle R is precisely matched with the bisector point in the direction X of each of the center points of the two fiducial marks FM2A and FM2B.

Then, on the basis of the measured real value $\Delta XF$ and the calculated values LF and $\Delta Xcc$, the main control system 114 works out the distance BLOx from the projection point on the XY coordinate plane of the center CC of the reticle R to the center point (bisector point between the index marks $TMX_1$ and $TMX_2$) on the XY coordinate plane of the index plate 4F of the off-axis alignment system OWA in the direction X as the base line value in the direction X with respect to the off-axis alignment system OWA as follows:

$$BLOx=LF-\Delta Xcc-\Delta XF \quad (10)$$

Here, the ΔXF is assumed to take the positive value when the fiducial mark FM1 is detected and found to be deviated toward the direction of the projection lens PL (fiducial marks FM2A and FM2B) with respect to the bisector point of the index marks $TMX_1$ and $TMX_2$ in the direction X, and the negative value when detected and found to be deviated in the opposite direction.

Subsequently, on the basis of the measured real values $\Delta YR_1$ and $\Delta YR_2$, the main control system 114 obtains the deviating amount ΔYcc in the direction Y between the projection point of the center point CC of the reticle R and the bisector point (provided substantially on the straight line $LY_2$) of the line portion connecting the center point of the fiducial mark FM2A and the center point of the fiducial mark FM2B as follows:

$$\Delta Ycc-(\Delta YR_1+\Delta YR_2)/2 \quad (11)$$

Here, the $\Delta YR_1$ and $\Delta YR_2$ are assumed to take the positive value when the reticle marks $RM_1$ and $RM_2$ are deviated in the positive direction Y in FIG. 4 (in the above on the plane of FIG. 4) with respect to the respective fiducial marks FM2A, FM2B and the negative value when deviated in the opposite direction. This deviating amount ΔYcc becomes zero when the projection point of the center CC of the reticle R and the bisector point of the line portion connecting the fiducial marks FM2A and FM2B are matched precisely.

Further, on the basis of the constant values ΔYfa and ΔYfb, the main control system 114 obtains the deviating value $\Delta Yf_2$ in the direction Y between the bisector point of the line portion connecting each of the center points of the fiducial marks FM2A, FM2B and the center point of the fiducial mark FM1 as follows:

$$\Delta Yf_2=(\Delta Yfa+\Delta Yfb)/2 \quad (12)$$

On the basis of the above-mentioned calculated values ΔYcc and $\Delta Yf_2$ and measured real value ΔYF. The main control system 114 works out the distance BLOy in the direction Y between the projection point of the center CC of the reticle R and the center point (bisector point between the index marks $TMY_1$ and $TMY_2$) of the index plate 4F of the off-axis alignment system OWA in the direction Y as the base line value in the direction Y with respect to the off-axis alignment system OWA as follows:

$$BLOy=\Delta Ycc-\Delta Yf_2-\Delta YF \quad (13)$$

From the above-mentioned calculation, the base line values (BLOx and BLOy) of the off-axis alignment system OWA is obtained Then, the main control system 114 calculates the base line values (BLTx and BLTy) or the TTL alignment system of the LSA method. The base line value BLTy for the TTL alignment system of the LSA method in the direction Y is a deviating amount between the center point of the slit type beam spot in the direction Y and the projection point of the center CC of the reticle R in the direction Y and is obtainable by the following equation:

$$BLTy=YIf-YLs \quad (14)$$

Likewise, the base line value BLTx for the TTL alignment system of the LSA method in the direction X is a deviating amount between the center point of the slit type beam spot in the direction X and the projection point of the center CC of the reticle R in the direction X and is obtainable by the following equation:

$$BLTx=XIf-XLs \quad (15)$$

However, the values thus obtained by the equations (14) and (15) include the arrangement error ΔYsm in the direction Y between the center of the light emission mark IFS and the mark LSMy on the fiducial plate FP and the arrangement error ΔXsm in the direction X between the center of the light emission mark IFS and the mark LSMx on the fiducial plate FP. Therefore, if these errors cannot be neglected, these should be stored as constant values in advance, and the equations (14) and (15) are modified respectively as the equations (14') and (15') given below.

$$BLTy=YIf-YLs-\Delta Ysm \quad (14')$$

$$BLTx=XIf-XLs-\Delta Xsm \quad (15')$$

With the sequence set forth above, the base line measurement is completed, and the prealigned wafer W is mounted on the wafer stage WST.

On the wafer W, a plurality of exposure areas, that is, the shot area in which the pattern area PA of the reticle R is projected, are arranged two dimensionally. Then, in each of the shot areas the alignment marks to be detected by the off-axis alignment system OWA or TTL alignment systems (2X and 3X; 2Y and 3Y) are formed in a predetermined relationship with respect to the center point of the shot area. In many cases, these alignment marks on the wafer are provided within a street line. For the practical wafer alignment methods, there have been known traditionally several method or sequence. Here, therefore, the description of those known methods and sequences is omitted. Only the fundamental wafer alignment will be described.

Figure 18:
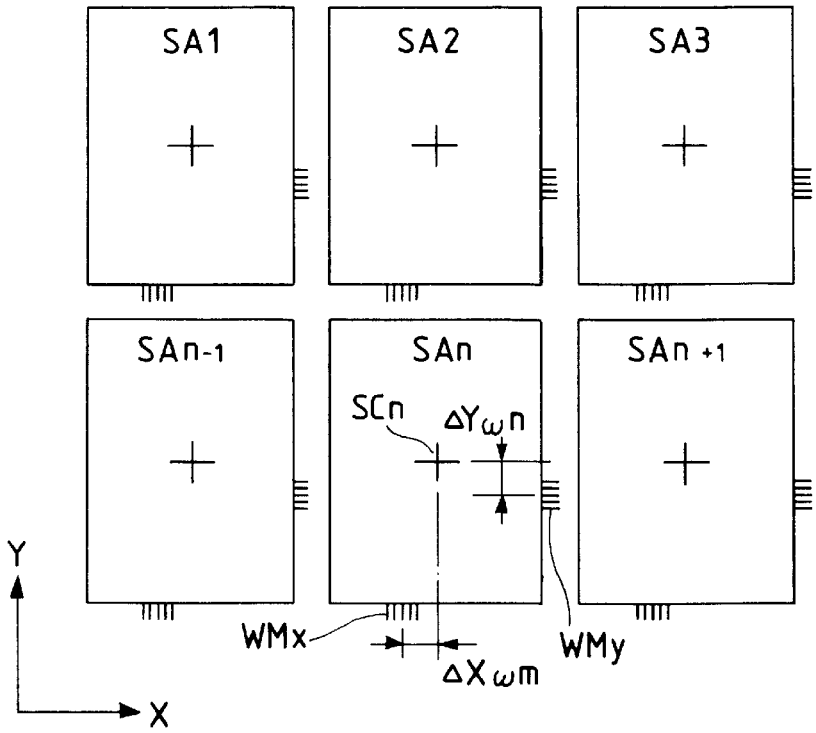
FIG. 18 is a plan view showing the shot arrangement and the wafer mark arrangement on a FIG. 19 is a view illustrating the principle of the mutual presetting of the two interferometers in the direction Y.

FIG. 18 shows the arrangement of the marks and shot areas on the wafer W, and the interval in the direction X between the center SCn of the sot area SAn and the mark WMx to be detected in the direction X is established as ΔXwm and the interval in the direction Y between the center SCn and the mark WMy to be detected in the direction Y are established as ΔYwm in designing. At first, when the off-axis alignment system OWA is used, the wafer stage WST is positioned so as to allow the mark WMx in an arbitrary shot area SAn to be sandwiched between the index marks $TMX_1$ and $TMX_2$ in the detecting area of the off-axis alignment system OWA. Here, the marks WMx and WMy are assumed to be of the same maltiline patterns as the fiducial mark FM1.

Then, the main control system 114 reads the coordinate position Xm of the wafer stage WST positioned in the direction X from the interferometer IFX.

Further, the image signals from the CCD camera 4X in the off-axis alignment system OWA are processed to detect the deviating amount ΔXp between the center point of the index plate 4F and the center point of the mark WMx in the direction X. Subsequently, the wafer stage WST is driven to position the wafer stage WST so that the wafer mark WMy is allowed to be sandwiched between the index marks $TMY_1$ and $TMY_2$ of the off-axis alignment system. At this juncture, the coordinate position Ym in the direction Y is read from the interferometer $IFY_1$. Then, the deviating amount ΔYp in the direction Y between the center point of the index plate 4F and the center point of the mark WMy is obtained by the photographing of the CCD camera 4Y.

When the above-mentioned mark position detection is completed, the coordinate positions (Xe and Ye) of the wafer stage WST are obtained by the computation according to the equations given below to enable the center SCn of the shot area SAn to be matched with the projection point of the center CC of the reticle R when exposed.

$$Xe=Xm-\Delta Xp+(BLOx-\Delta Xwm) \quad (16)$$

$$Ye=Ym-\Delta Yp+(BLOy-\Delta Ywm) \quad (17)$$

In this respect, if the marks WMx and WMy are detected by the TTL system of the LSA method, the stage coordinate positions of exposure can be obtained by the following equations provided that each of the detecting positions of the marks WMx and WMy by the LSA method is given as Xm and Ym:

$$Xe=Xm+BLTx-\Delta Xwm \quad (18)$$

$$Ye=Ym+BLTy-\Delta Ywm \quad (19)$$

According to the description set forth above, there are no Abbe's errors included in the coordinate positions Xm and Ym of the wafer stage WST and the deviating amounts ΔXp and ΔYp of the mark positions at the time of the mark detection if the measured values of the two interferometers IFX and $IFY_1$ are used for the two dimensional mark positioning detection using the off-axis alignment system OWA because both of the measured values of the interferometers IFX and $IFY_1$ are defined to be rectangular even at the detection center point in the static coordinate system of the off-axis alignment system OWA.

Therefore, when the wafer marks and fiducial marks are detected using the off-axis alignment system OWA, it is important to use the interferometer $IFY_1$ which can satisfy the Abbe's condition with respect to the alignment system OWA rather than the interferometer $IFY_2$ whcih can satisfy the Abbe's condition with respect to the projection lens PL.

However, in order to use the interferometers IFX and $IFY_2$ which can satisfy the Abbe's condition with respect to the projection lens PL and the interferometers IFX and $IFY_1$ which can satisfy the Abbe's condition with respect to the off-axis alignment system OWA by switching them without any modifications, it is necessary to perform the resetting (or presetting) of each of the inner counters of the two interferometers $IFY_1$ and $IFY_2$ in a specific state. To state the conclusion first, the values of the respective inner counter of the two interferometers $IFY_1$ and $IFY_2$ should be preset so that they are equal to the value of either one of them at the position where the wafer stage WST is stationary so as to enable the detection of the fiducial mark FM2 through the projection lens PL to be conducted at the same time of the detection of the fiducial mark FM1 being performed through the off-axis alignment system OWA. Therefore, according to the sequences in FIG. 14 and FIG. 15, it is necessary to add the counter presetting operation (or counter data latching operation) of the two interferometers $IFY_1$ and $IFY_2$ and at the same time, and to operate the computation to correct the base line value due to the mounting error θf of the fiducial plate FP as described earlier. Subsequently, therefore, the specific example will be described hereunder.

At first, the reticle alignment is executed in the steps 508, 510, and 512 in FIG. 14. At this junction, in consideration of the mounting error θf of the fiducial plate FP, the alignment positions of the reticle marks $RM_1$ and $RM_2$ in the direction X are set to be $\Delta XR_1=\Delta XR_2$ and to take the zero value while the alignment positions in the direction Y are set to be $\Delta YR_1 \rightarrow \Delta Oy_1$ and $\Delta YR_2 \rightarrow \Delta Oy_2$ respectively. In other words, the reticle R is aligned so that the line connecting the two reticle marks $RM_1$ and $RM_2$ is paralleled to the reflecting plane of the movable mirror IMy.

After that, the base line error is measured, and once the reticle alignment has been accomplished, the servo lock is actuated so that the wafer stage WST is not moved. Now, with such servo lock state in view, an error Ly (Δθa+Δθr) is present between the measured value Le of the interferometer $IFY_2$ which can satisfy the Abbe's condition with respect to the projection lens PL and the measured value Lf of the interferometer $IFY_1$ which can satisfy the Abbe's condition with respect to the off-axis alignment system OWA. Here, the Ly is the interval in the direction X (same as LB in FIG. 13) between each of the measuring axes of the two interferometers $IFY_1$ and $IFY_2$, and the rotational error Δθa is a fine rotational error from the ideal position (ideal X axis) of the reflecting plane of the movable mirror IMy resulting from the position of the wafer stage WST at the time of the base line measurement. Also, the rotational error Δθr is a fine rotational error from the ideal position (X axis) of the reflecting plane of the movable mirror IMy when the wafer stage WST is driven to its predetermined home position. These errors Δθa, and Δθr cannot be measured directly and independently. Usually, however, it is possible to measure them as the varied amount from the reset position of the synthesized value of the Δθa and Δθr by resetting (or presetting) the inner counters of the interferometers $IFY_1$ and $IFY_2$ simultaneously when the wafer stage WST has reached its home position. In other words, the varied amount of Δθa+Δθr can be measured as a yawing value with the reset position as reference.

Therefore, in a state that the position of the wafer stage WST is being monitored or controlled by the interferometer $IFY_2$ capable of satisfying the Abbe's condition with respect to the projection lens, the error Lt−Le=Ly (Δθa+Δθr) is included in he measured value Lf of the other interferometer $IFY_1$ naturally, and it is neither possible to incorporate the measured value Lf of the interferometer $IFY_1$ with the measurement of the base line value as a real value as it is, nor is it possible to transfer the control of the wafer stage WST to the control by the interferometer $IFY_1$ as it is.

As a result, after storing the difference between the measured value Lf or the interferometer $IFY_1$ and the measured value Le of the interferometer $IFY_2$ with the wafer stage WST being servo locked subsequent to the positioning of the fiducial plate FP as ΔLyw [Ly(Δθa+Δθr)] when the base line is measured, the measured value of inner counter of the interferometer $IFY_1$ is replaced (preset) from the value Lf to the value Le. Thus, in performing control thereafter, there will be no problem at all even if the control based on the interferometer $IFY_2$ used for positioning the wafer stage WST for exposure is switched over to the control based on the interferometer $IFY_1$ used for the off-axis alignment.

Figure 19:
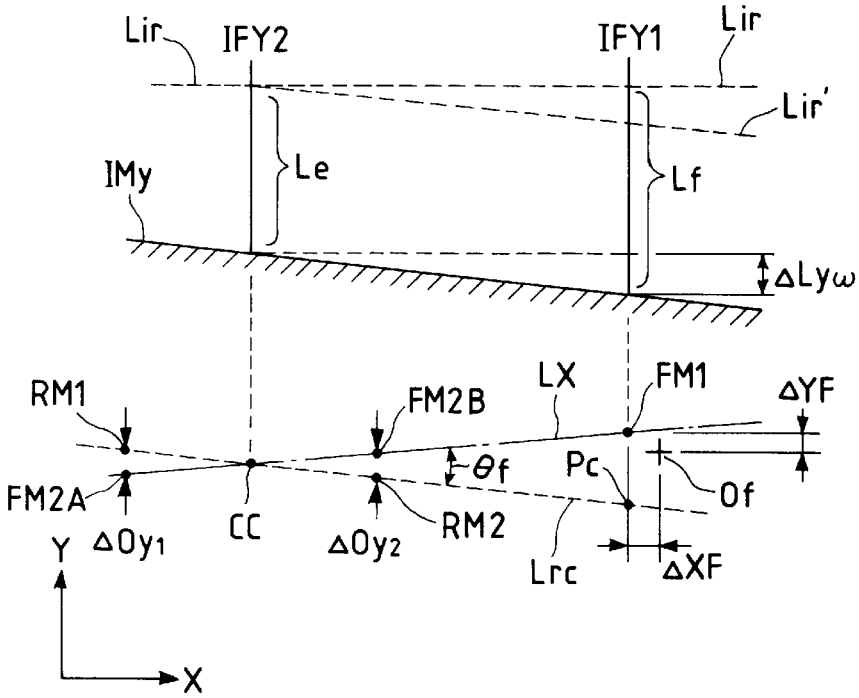

FIG. 19 illustrates this state exaggeratedly. In FIG. 19, the line LX connecting the two fiducial marks FM2A and FM2B is rotated by an error θf with respect to the line Lrc which is in parallel with the reflecting plane of the movable mirror IMy. When the reticle R is aligned, the reticle mark $RM_1$ is positioned by offsetting itself just by $\Delta Oy_1$ with respect to the fiducial mark FM2A while reticle mark $RM_2$ is positioned by offsetting itself just by $\Delta Oy_2$ with respect to the fiducial mark FM2B. Thus, the line portion connecting the reticle marks $RM_1$ and $RM_2$ is in parallel with the line Lrc eventually. In FIG. 19, the line Lrc is defined to run through the reticle center CC, the reticle marks $RM_1$, $RM_2$, and the center CC are positioned on the line Lrc.

Now, in this state, the two interferometers $IFY_1$ and $IFY_2$should be preset to the same counting value Le but as shown in FIG. 19, references for the two interferometers $IFY_1$ and $IFY_2$ after the presetting are modified to the reference line Lir'. In FIG. 19, the line Lir represents the reference in a state of the interferometers $IFY_1$ and $IFY_2$ being preset to a same value when the wafer stage WST comes to its home position, for example. In other words, it can be considered that the distance from this imaginary reference line Lir or Lir' to the movable mirror IMy is being measured by the interferometers $IFY_1$ and $IFY_2$. Accordingly, immediately after the presetting is completed, the reference line Lir', the reflecting plane of the movable mirror IMy, and the line Lrc are in parallel to one another. In this connection, if an attempt is made to find the yawing of the wafer stage WST from the difference in the measured values of the two interferometers $IFY_1$ and $IFY_2$ subsequent to the presetting, the reference required for the yawing value should be modified to the line Lir' in FIG. 19. In other words, the line which is in parallel with the reflecting plane of the movable mirror IMy when fiducial plate FP is positioned directly below the projection lens PL and the off-axis alignment system at the time of the base line measurement becomes the reference for the measurement of the yawing value thereafter.

Further, in the base line measurement, the positional deviating amounts (ΔXF and ΔYF) between the fiducial mark FM1 and index mark TM are obtained by the off-axis alignment system as shown in FIG. 17. In FIG. 19, a point Of designates the detection center point defined by the index mark TM of the off-axis alignment system.

Here, the real base line value is determined by the positional relationship between the center point CC of the reticle R and the detection center point Of, but if the mounting error θf of the fiducial plate FP should be extremely small, the base line value in the direction X is determined by the constant value ΔXfa (distance between FM1 and FM2A), constant value ΔXfb (distance between FM1 and FM2B), deviating amount of the center point CC at the time of the reticle alignment in the direction X, and deviating amount ΔXF detected by the off-axis alignment system as shown earlier in FIG. 17.

In other words, given the distance from the bisection point of the two fiducial marks FM2A and FM2B in the direction X to the center point of the fiducial mark FM1 on the line LX as LF, this LF can be obtained as followed in the same manner of the equation (8).

$$LF=(\Delta Xfa+\Delta Xfb)/2$$

Also, the residual deviating amount ΔXcc of the center point CC in the direction X with respect to the intermediate point of the fiducial mark FM2 at the time of the reticle alignment can be obtained from the measured real values $\Delta XR_1$ and A $XR_2$ in FIG. 17 in the same manner of the equation (9).

$$\Delta Xcc=(\Delta XR_1-\Delta XR_2)/2$$

Consequently, the real base line value BLOx in the direction can be obtained as followed in the same manner of equation (10).

$$BLOx=LF-\Delta Xcc-\Delta XF$$

On the other hand, as to the base line value BLOy in the direction Y, it is impossible to guarantee the accuracy when applying the equation (13) described earlier as it is because there occurs a sine error (deviating amount in the direction Y) due to the mounting error θf.

Here, again, FIG. 19 is referred to for consideration. At first, there is no problem for the positional control of the wafer stage using either one of the two interferometers $IFY_1$ and $IFY_2$ if only they have already been preset. For example, let it be assumed that the wafer stage WST is driven in the direction X by the distance LF (strictly speaking, by the distance LF−ΔXcc) from the state where the a specific point on the wafer is positioned directly below the center point CC of the reticle R without changing the measured value of the interferometer $IFY_1$. Then, the specific point on the wafer is positioned the point Pc in FIG. 19. Consequently, the real base line value BLOy to be controlled in the direction Y is an interval between the detection center point Of of the off-axis alignment system and the point Pc in the direction Y.

Now, since the mounting error θf of the fiducial plate FP has already been obtained, the deviating amount ΔYfc between the point Pc and the fiducial mark FM1 in the direction Y can be obtained by the following equation provided that the θf is sufficiently small:

$$\Delta Yfc\cong(LF-\Delta Xcc)\cdot\theta f \tag{20}$$

Therefore, the base line value BLOy in the direction Y with the mounting error θf being taken into account can be expressed in the following equation with a modification to the equation (13):

$$BLOy=\Delta Ycc-\Delta Yf_2-\Delta Yfc-\Delta YF \tag{21}$$

In this respect, the values ΔYcc and $\Delta Yf_2$ are obtained from the equations (11) and (12).

As set forth above, the two interferometers $IFY_1$ and $IFY_2$ are preset to a same value at the time of the base line measurement by the fiducial plate FP and at the same time, a correction is additionally given to the calculation of the base line value in accordance with the mounting error θf as well as the alignment of the reticle R is implemented with respect to the fiducial marks on the fiducial plate FP in the state of the base line measurement. In this way, all the erroneous elements are canceled, hence enabling the provision of a significantly higher accuracy than the conventional one for the base line measurement.

In this respect, when the base line measurement is operated, the measured values of the inner counter are sampled approximately several tens times per approximately second by the computor even in the case where the halting position of the wafer stage WST is being read by the interferometer $IFY_1$, and by equalizing them, the error due to the fluctuation is experimentally reduced to approximately 0.03 μm to 0.012 μm.

Also, when the alignment marks WMx, WMy, and others of the wafer W are detected by the off-axis alignment system OWA as in FIG. 18, the positioning of the wafer stage WST is controlled by the interferometers $IFY_1$ and IFX. At this juncture, the yawing of the wafer stage WST may take place in some cases. The occurrence of the yawing in this case, however, will not affect the ultimate alignment accuracy (the registration accuracy between the reticle and shot on the wafer) after the two interferometers $IFY_1$ and $IFY_2$ are preset.

Figure 20:
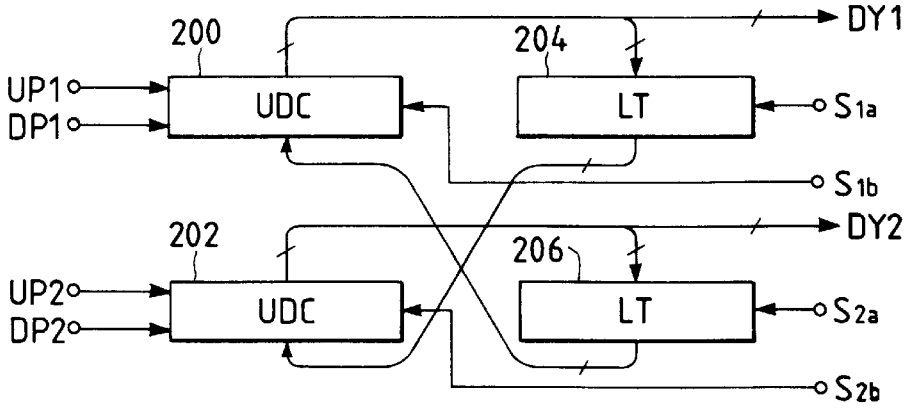
FIG. 20 is a circuit block diagram showing an example of performing the preset of the interferometers.

FIG. 20 shows an example of the implementation of the mutual presetting hard ware of the circuit of the two interferometers $IFY_1$ and $IFY_2$described in conjunction with FIG. 19. The same function can be implemented by the same conception in computation on a soft ware.

In FIG. 20, the up down counter (UDC) 200 is the inner counter of the interferometer $IFY_1$ to perform the reversible counting of the up pulse UP1 and down pulse DP1 generated accompanying the Y direction driving of the wafer stage WST. The up and down counter (UDC) 202 is the inner counter of the interferometer $IFY_2$to perform likewise the reversible counting of the up pulse UP2 and down pulse DP2. Each of the counted values of the UDC 200 and UDC 202 is output to the main control system 114 as parallel 24-bit Y coordinate values $DY_1$ and $DY_2$, for example. The latch circuits (LT) 204 and 206 keep on holding the counting values $DY_1$ and $DY_2$ when each of the counting values $DY_1$ and $DY_2$ is inputted and at the same time, the latch pulses $S_1$a and $S_2$a are received from the main control system 114. Here, the output value of the LT 204 is applied as a preset value to the UDC 202 while the output value of the LT 206 is applied as a preset value to the UDC 200. The UDCs 200 and 202 are preset to the presetting values in response to the load pulses $S_1$b and $S_2$b from the main control system 114, respectively.

As described earlier, when the measured value Le ($DY_2$) of the interferometer $IFY_2$ is preset to the interferometer $IFY_1$, the latch pulse $S_2$a is output to the LT 206 and the load pulse $S_1$b is output to the UDC 200 after a predetermined delay ($\mu$Sec order). In the case of the circuit in FIG. 20, an inverted presetting is possible as a matter of course. It is also possible to preset the measured value Lf ($DY_1$) to the UDC 202 of the interferometer $IFY_2$. In this respect, the coordinate measurement using interferometers is relative because of the interferometer is a type of incremental measuring. So, it may therefore be possible to reset the UDCs 200 and 202 to zero simultaneously instead of the presetting of the UDC 200 of the interferometer $IFY_1$ and UDC 202 of the interferometer $IFY_2$ or to reset them to a predetermined value at the same time irrespective of the measured values Le and Lf.

Now, while the measurement operation of the base line value shown in the above-mentioned example is executed after the precise reticle alignment has been completed a illustrated in FIG. 14 and FIG. 15, it may be possible to perform the base line measurement in the stage where the reticle has been aligned roughly.

For example, the reticle is roughly aligned by the SRA method or IFS method to the location where the reticle marks $RM_1$ and $RM_2$ can be detected by the TTR alignment systems 1A and 1B in the step 504 or 506 in FIG. 14. Then, the step 508 in FIG. 14 and the step 522 in FIG. 15 are operated simultaneously to obtain the positional deviating amounts ($\Delta XR_1$ and $\Delta YR_1$) between the fiducial mark FM2B and reticle mark $RM_1$, the positional deviating amounts ($\Delta XR_2$ and $\Delta YR_2$) between the fiducial mark FM2A and reticle mark $RM_2$, and the positional deviating amounts ($\Delta XF$ and $\Delta YF$) between the fiducial mark FM1 and index mark of the off-axis alignment system.

At this juncture, the fiducial plate FP is servo locked either in the interferometer mode or LIA mode. In consideration of the fine movement of the wafer stage WST, however, the positional deviating amount detections respectively by the TTR alignment system and off-axis alignment system should be repeated several times to obtain its means values. By this equalization, the error values which are generated at random are reduced. Then, once each of the positional deviating amounts is thus obtained, it becomes possible to know thereafter just be computation the relative positional relationship between the projection point at the center point CC (or the marks $RM_1$ and $RM_2$) of the reticle R and the detection center point of the off-axis alignment system OWA. Further, the position rough alignment position of the reticle stage RST in this state is read from the measured values of the interferometers IRX, IRY, and IR$\theta$ for storage. It is also desirable to execute the equalization of this reading.

Then, on the basis of the positional deviating amounts previously measured ($\Delta XR_1$ and $\Delta YR_1$), ($\Delta XR_2$ and $\Delta YR_2$), ($\Delta XF$ and $\Delta YF$) and the predetermined constant values, the deviating amounts (in the directions X, Y, and $\theta$) between the projection point at the center CC of the reticle and the center point of the fiducial mark FM2 (the bisector point between the mark FM2A and FM2B) which should take place when the detection center of the off-axis alignment system OWA is matched with the center of the fiducial mark FM1 ($\Delta XF$=0 and $\Delta YF$=0) are calculated. Then, the reticle stage RST is finely driven from the stored rough alignment position by the deviating amounts thus worked out by the use of the interferometers IRX IRY, and IR$\theta$. In this way, the reticle R is precisely aligned with respect to the detection center of the off-axis alignment system OWA. Thereafter, the sequence beginning at the step 524 shown in FIG. 15 is taken by the main control system 114.

As described above, if there is provided a sensor (interferometer or alignment system) capable of measuring the positional deviating amount of the reticle stage RST (that is, reticle R) over a comparatively long range (±several mm, for example), the reticle R can be finely aligned after the detection of each of the fiducial marks for measuring the base line is operated, at the same time the rough alignment position being stored. In this way, the throughput will be improved more that the sequences shown in FIG. 14 and FIG. 15.

In the embodiment according to the present invention, the TTL alignment system of the LIA method is employed for the servo lock of the fiducial plate FP. It is also necessary to operate the base line control regarding this TTL alignment system of the LIA method itself with the center CC of the reticle R. Now, assuming that the TTL, alignment system of the LIA method is used for the detection of the marks on the wafer W, it should be good enough only to store the phase errors $\Delta\phi x$ and $\Delta\phi y$ respectively for the marks LIMx and LIMy detected by the TTL alignment systems of the LIA methods 3X and 3Y as the portions corresponding to the base line error values with respect to the center CC of the reticle R when the reticle marks $RM_1$ and $RM_2$ detected by the TTR alignment systems 1A and 1B and the fiducial marks FM2A and FM2B are precisely matched, respectively.

Subsequently, examples of the modifications of the present embodiment will be described.

In the steps 508 to 512 of the sequences shown in FIG. 14 and FIG. 15, the reticle alignment is completely implemented by the use of the TTR alignment systems 1A and 1B. However, it is possible to omit such operation to a certain extent. As shown in FIG. 2, the positional deviations of the reticle R in the directions X, Y, and $\theta$, are being monitored by the iterferometers IRX, IRY, and IR$\theta$ successively, and with the searching operation by IFS method in the step 504, the respective coordinates of the projection points of the reticle marks $RM_1$ and $RM_2$ are detected by the interferometers on the wafer stage side to work out the deviating amounts of the reticle R form the designed positions in the directions X, Y, and $\theta$. Then, it may be possible to driven the reticle stage RST finely depending on the interferometers on the reticle side to make the correction of such deviating amounts possible. In this case, assuming that the measuring resolution of the interferometers IRX, IRY, and IR$\theta$ on the reticle side are sufficiently high (0.005 $\mu$m, for example), the positioning of the reticle R should be executed high accuracy.

Also, while the off-axis alignment system OWA used for the present embodiment is a static type alignment system where the mark detection is operated with the wafer state WST being at rest, the same effect is obtainable for a scanning type alignment system where the mark detection is operated by moving the wafer stage WST such as a TTL alignment system of the LSA method or IFS method. For example, if the off-axis alignment system OWA is modified to be a system in which the marks on the wafer stage WST are detected by scanning with the irradiation to the wafer W of the laser beam the spot of which is formed to be of a slit type, it should be good enough only to make the arrangement of each of the marks on the fiducial plate so that the light emission mark IFS can scan the reticle marks $RM_1$ or $RM_2$ at the same time that the wafer stage WST is moved to cause the fiducial mark $FM_1$ on the fiducial plate FP to cross such beam spot.

Moreover, if the LIA method is incorporated in the off-axis alignment system OWA and the fiducial mark $FM_1$ on the fiducial plate FP is arranged to be the same diffraction grating as the marks LIMx and LIMy, it may be possible to servo lock the wafer stage WST on the basis of the resultant detection of the phase difference measurement circuit so as to align the fiducial mark $FM_1$, which is detected by the off-axis alignment system OWA, with the reference grating of the LIA in the off-axis alignment system at all times. In this case, it is possible to calculate the base line value just by obtaining each of the positional deviating amounts between the fiducial marks FM2A and FM2B and reticle marks $RM_1$ and $RM_2$ by the TTR alignment systems IA and 1B in a state that the detection center of the off-axis alignment system OWA is precisely matched with the center of the fiducial mark FM1.

Also, using CCD cameras for a TTL alignment system, the mark images on the wafer or fiducial plate FP are reversely projected by the projection lens, and both the images thus projected and the images of the index marks provided in the optical path of the TTL alignment system are photographed for the detection of the positional deviating amounts. Such a method for detecting the mark positions may be employed. When this method is used, the control of the base line value should be performed between the projection point toward the wafer side of the center point (the detection center point) of the index mark in the optical path of the TTL alignment system and the center of the reticle marks $RM_1$ and $RM_2$ (or the center CC of the reticle).

Figure 21:
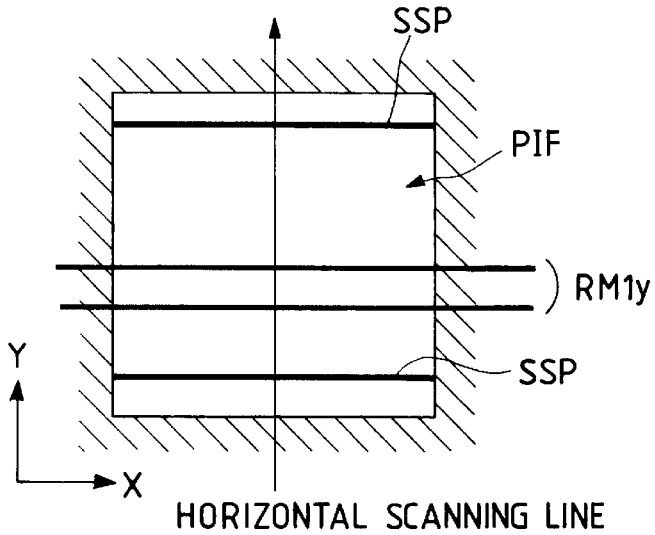
FIG. 21 is a view illustrating another pattern of the emission mark on the fiducial mark plate.

Now, the description has been made of the IFS method shown in the present embodiment solely as a stage scan, that is, a scanning type alignment system. However, it may be possible to make it a static type alignment system. To this end, the light emission mark IFS on the fiducial plate FP should be modified from the slit type to a rectangular light emission area. Then, the light emission area which is sufficiently larger than the width of the double slit is positioned directly below the double slit $RM_1y$ (or $RM_1x$) of the reticle mark shown in FIG. 6, and using TTR alignment system disposed above the reticle R, the portion of the mark $RM_1y$ (or $RM_1x$) is observed by the CCD camera and others. Hence obtaining the image signals having the same waveforms as those shown in FIG. 16B. At this juncture, if there is no index mark which can serve as an reference in the TTR alignment system, it may be possible to obtain the deviating amount of the double slit mark $RM_1y$ (or $RM_1x$) with the position of a specific pixel of the CCD camera as reference. Also, with this method, the projection point of the center of the reticle mark $RM_1$ (or $RM_2$) can be calculated on the basis of its deviating amount and the coordinate value of the wafer stage WST obtainable when the rectangular light emission area is positioned. Further, as shown in FIG. 21, light shielding slit patterns SSP are provided on a part of the rectangular light emission area PIF for measuring the amount of its deviation with respect to the double slit mark $RM_1y$ (or $RM_1x$) Then, the light emission area PIF is photographed by the CCD camera of the TTR alignment system so that the positional deviating amounts may be obtained by the dark lines of the double slit mark $RM_1y$ and the dark lines of the slit patterns SSP.

Figure 22:
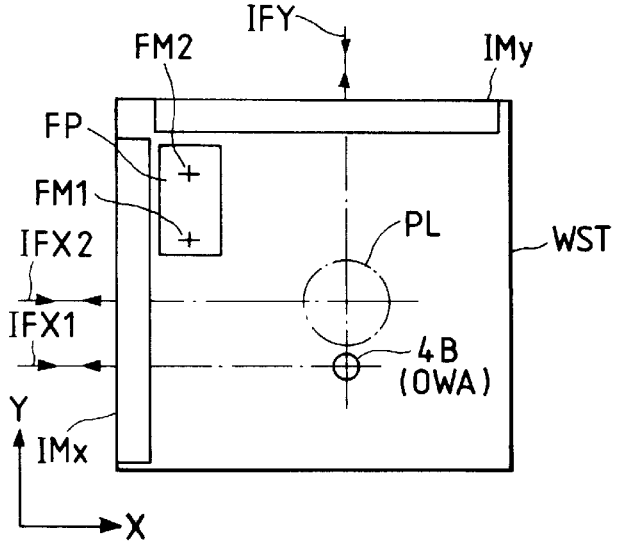
FIG. 22 is a plane view showing another arrangement of the off-axis alignment system.

FIG. 22 shows an example of a variation of the arrangement of the fiducial plate FP on the wafer stage WST and the arrangement of the off-axis alignment system, in which the objective lens 4B in the off-axis alignment system is positioned below the projection lens PL in the plane of FIG. 22. This position is at the front side of the main body of the apparatus and corresponds to the wafer loading direction. Of the reference marks of parts in FIG. 22, those other than IFY, $IFX_1$, $IFX_2$ which designate the interferometers for measuring the position of the wafer stage WST are the same as the reference marks of parts appearing in FIG. 3. In FIG. 22, the line portion connecting the position of the optical axis of the projection lens PL and the detection center (substantially the same as the optical axis position of the objective lens 4B) of the off-axis alignment system OWA is in parallel with the Y axis. Therefore, one interferometer IFY is arranged in the direction Y while two interferometers $IFX_1$ and $IFX_2$ are arranged in the direction X. To match with them, the arrangement of each of the marks on the difucial plate FP is modified so that the line portion connecting each of the center points of the fiducial mark FM1 and fiducial mark FM2 can be paralleled to the Y axis.

In this case shown in FIG. 22, too, when the marks on the wafer, fiducial mark FM1, or the like is detected by the off-axis alignment system OWA, the interferometers $IFX_1$ and IFY which can satisfy the Abbe's condition are used, and the interferometers $IFX_2$ and IFY are used when the wafer stage is positioned for exposure. In other words, in detecting the marks by the off-axis alignment system OWA, the positional coordinate value in the direction X measured by the interferometer $IFX_1$ becomes correspondent to the positional coordinate value measured by the interferometer $IFX_2$. This correspondence is performed exactly in the same manner as the reciprocative mutual presetting of the interferometers $IFY_1$ and $IFY_2$ as described in conjunction with FIG. 19.

The exposure apparatus described in the embodiment mentioned above is a stepper which causes the projected image in the pattern area PA on the reticle R to be exposed on the wafer W by a step-and-repeat method. The present invention is also equally applicable to an exposure apparatus of a step-scan method whereby to scan the reticle and wafer simultaneously in the direction perpendicular to the optical axis of the projection optical system.

Also, it is possible to apply the same positioning systems to an X-ray aligner, X-ray stepper, and the like using an X-ray souce of SOR and others.

Figure 23:
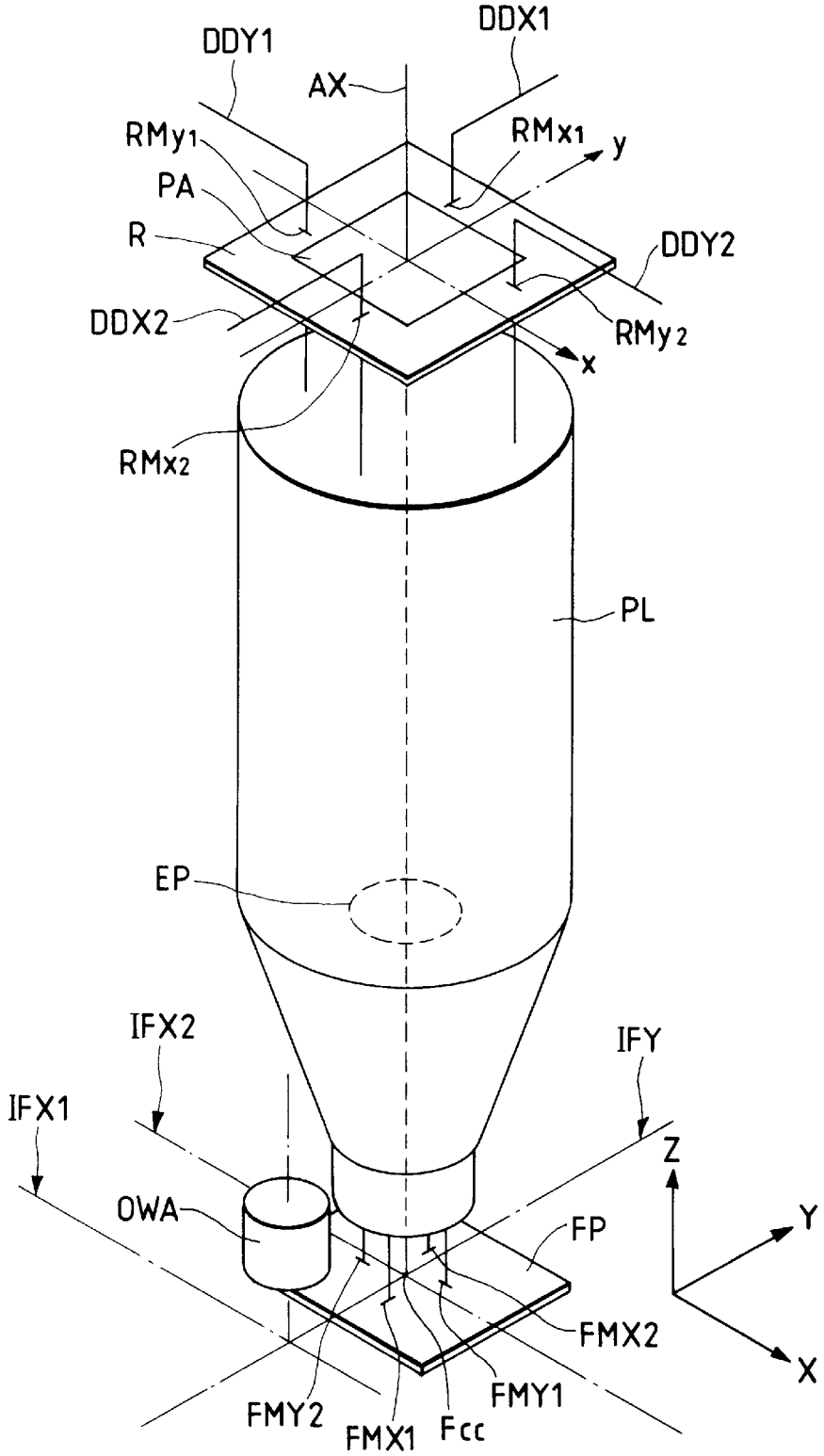
FIG. 23 is a perspective view illustrating the structure of a projection exposure apparatus according to a second embodiment of the present invention.
Figure 24:
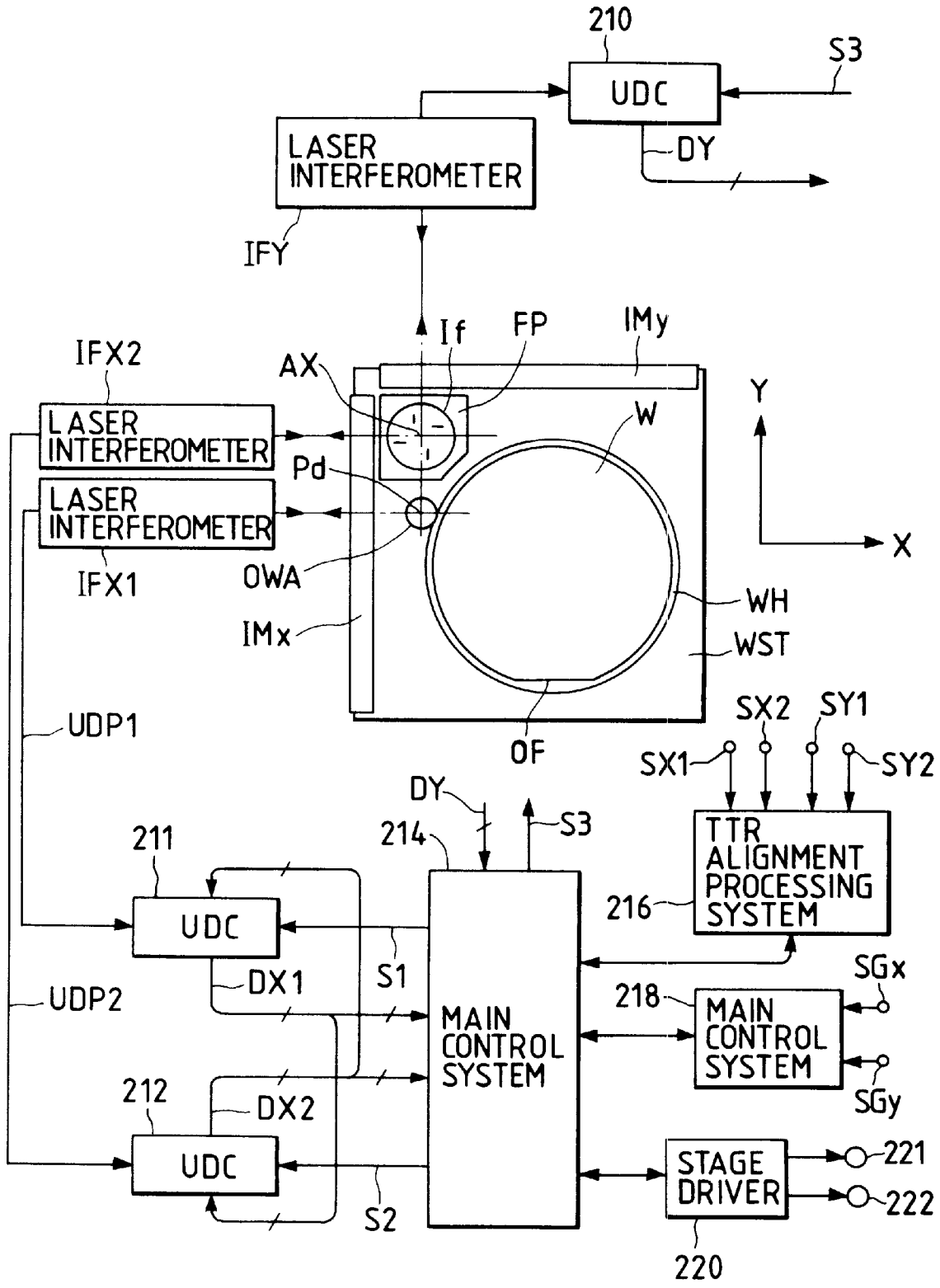
FIG. 24 is a view illustrating the structure of the apparatus shown in FIG. 23 on the wafer stage and the structure of its control system.

FIG. 23 illustrates the structure of the a projection exposure apparatus according to a second embodiment of the present invention. FIG. 24 is a block diagram showing the arrangements of the wafer stage and laser interferometers and the control system of the apparatus shown in FIG. 23.

In FIG. 23, a reticle R having a predetermined pattern area PA is held on a reticle stage which is not shown, and is positioned so that the optical axis AX of a project lens PL can pass through the center point of the pattern area PA. This reticle stage is finely driven by a motor in the direction X, direction Y, and direction θ (rotation around the optical axis AX) to drive the reticle R for the alignment with the wafer through the projection lens PL (die by die alignment) or for the alignment of the reticle R itself with respect to the apparatus (reticle alignment). Also, in four locations in the circumference of the pattern area PA of the reticle R, the reticle alignment (or die by die alignment) marks $RMx_1$, $RMx_2$, $RMy_1$ and $RMy_2$ are provided. The marks $RMx_1$, $RMx_2$ are used for positioning in the direction of the X axis of the rectangular coordinate system xy on the reticle side or the positional deviation detection while the marks $RMy_1$ and $RMy_2$ are used for positioning in the direction of the y axis of the rectangular coordinate system xy or the positional deviation detection. These four marks are all arranged in the field of the projection lens PL.

Now, as shown in FIG. 24, the projection image of the pattern area PA of the reticle R is focused on the wafer W which serves as an exposure substrate. The wafer W is held on the wafer stage WST through a wafer holder WH. The wafer stage is driven in parallel in the rectangular coordinate system XY by the step-and-repeat method or step-and-scan method. The holder WH can be finely driven in the direction θ on the stage WST to correct the rotation after the pre-alignment of the wafer W. Also, on the two sides surrounding the stage WST, there are fixedly provided a movable mirror IMy having a reflecting plane in parallel with the X axis of the rectangular coordinate system XY and a movable mirror IMx having a reflecting plane in parallel with the Y axis. To the reflecting plane of the movable mirror IMy, the laser beam from the interferometer IFY is irradiated in parallel with the Y axis. The interferometer IFY causes the reflected beam from the driving mirror IMY to interfere with the reflected beam from a reference mirror fixed at a predetermined position to measure the driving distance from the movable mirror IMy (that is, the reference position of the wafer stage WST) in the direction Y.

Likewise, two laser interferometers $IFX_1$ and $IFX_2$ are provided oppositely in the direction X with respect to the movable mirror IMx. Of these the measurement axis which is the center of the laser beam of the interferometer $IFX_2$ and each of the extended lines of the measurement axes (beam centers) of the interferometers IFY are provided to intersect at right angles at the position of the optical axis AX of the projection lens PL.

In FIG. 24, a circle If around the optical axis AX is the image field of the projection lens PL, and the fiducial plate FP which is large enough to include the image field If is fixed to the stage WST at a height substantially the same level as the surface on the wafer W.

On this fiducial plate FP, there are formed four fiducial marks $FMX_1$, $FMX_2$, $FMY_1$ and $FMY_2$ as shown in FIG. 23, which are aligned with each of the projected images of the four marks $RMx_1$, $RMx_2$, $RMy_1$ and $RMy_2$ of the reticle R when its center Fcc is matched with the optical axis AX of the projection lens PL. These four fiducial marks FM are detected by each of the TTR alignment systems (mark detection means) $DDX_1$, $DDX_2$, $DDY_1$, and $DDY_2$ through the projection lens PL and reticle R together with the corresponding four reticle marks RM. For this TTR alignment system, several methods are made practicable and publicly known. As a typical TTR system thereof, there are such a method, as shown in FIG. 7, too, in which the images of the fiducial marks FM reversely projected to the reticle R side by the projection lens P1 and the images of the reticle marks RM are photographed for the detection of the positional deviation on the basis of the image signals thus obtained, and a method in which the spot light of converged laser beams is irradiated on the fiducial plate FP through the reticle R and projection lens PL, and the diffraction rays or scattered rays of light generated from each of the marks at the time of one dimensional scanning which crosses the reticle marks RM and fiducial marks FM are selectively detected by photoelectrically in the plane conjugated with the pupil EP of the projection lens PL to detect the positional deviating amounts between the fiducial marks FM and reticle marks RM and others. In addition, the TTL alignment system may be used for the detection of the positional deviation between the alignment marks (which should be wafer marks) attached to the shot area on the wafer W and the reticle marks RM.

Now, in the present embodiment, the off-axis alignment system OWA is fixed outside the projection lens PL as shown in FIG. 23 earlier. This off-axis alignment system OWA includes a microscopic objective lens 4B to detect the alignment marks on the wafer W as images, and television camera (CCD and others) 4X and 4Y for photographing the images in enlargement as in the case shown in conjunction with FIG. 10. Also, since the alignment system OWA is separately provided from the projection lens PL, there is provided an optical system (objective lens) for which an achromatic process has been given independently, and the light evenly illuminating the observation area on the wafer W through the objective lens 4B is produced by a halogen lamp having a wavelength width of approximately 200 to 350 nm. A case is of course taken so that the light sensitive wavelength band of the resist on the wafer W is not exposed to such illuminating light.

Inside an off-axis alignment system OWA such as this, index marks are provided for detecting the positional deviation of the marks on the wafer W as shown in FIG. 9. The enlarged images of the index marks and wafer marks are photographed by the television cameras. Therefore, when the mark positions on the wafer W are detected by the off-axis alignment system OWA, the coordinate positions (Xw and Yw) of the wafer stage WST are stored while the index marks TM and wafer marks WM are being photographed by the television cameras as in the case of the first embodiment. Then, after obtaining the positional deviating amounts (ΔX and ΔY) of the index marks TM and wafer marks WM in the directions X and Y by the image signal processing, these amounts must be worked out as the coordinate values (Xw−ΔX and Yw−ΔY). Because there is such a necessity to read the coordinate positions of the wafer stage WST, the center of the detection point Pd (the same as Of in FIG. 19) of the off-axis alignment system OWA is set at the point where the extended line of the measurement axis of the interferometer IFY in the direction Y and the extended line of the measurement axis of the interferometer $IFX_1$ in the direction X intersect at right angles as shown in FIG. 24, too. Here, the center point Pd of the detection for the off-axis alignment system OWA is not necessarily the position of the optical axis of the objective lens, but it is rather an imaginary point determined by the inner index marks. In other words, when the index marks are projected on the wafer W through the objective lens, it is considered that the center point Pd of the detection is present at a predetermined position with the projection points of such index marks as reference, and that the positional deviating amounts (ΔX and ΔY) with respect to the center point Pd of the detection is being obtained by the off-axis alignment system OWA.

When the interferometers IFY and $IFX_1$ of the off-axis alignment system OWA are arranged as described above, the Abbe's error (sine error) becomes zero at the time of the mark position detection by the alignment system OWA. Likewise, the arrangements of the interferometers IFY and $IFX_2$ can be made to satisfy the Abbe's condition with respect to the projection lens PL.

Now, in FIG. 24, the up down pulses UDP1 output from the interferometer $IFX_1$ are reversibly counted by the up down counter (UDC) 211 which can be preset, and its counted value $DX_1$ is output to the main control system 214 for the stage control as a coordinate value of the stage WST in the direction X. Likewise, in the interferometer $IFX_2$, the up down pulses $UPD_2$ are counted by the UDC 212 which can be preset and its counted value $DX_2$ is output to the main control system 214 as a coordinate value of the stage WST in the direction X. Likewise, in the interferometer $IFY_1$, the up down pulses are counted by the UDC 210 and its counted value DY is transmitted to the main control system 214. The up down pulses from each of the these interferometers are defined to be one pulse per driving of the stage WST of 0.01 μm, for example.

The main control system 214 outputs preset (or reset) signals $S_1$, $S_2$, and $S_3$ to the UDCs 210, 211, and 212, respectively. To the UDCs 211 and 212, among them, particular presettings are conducted in response to the preset signals $S_1$ and $S_2$. In other words, when the preset signal (pulse) $S_1$ is output, the counted value $DX_2$ of the UDC 212 is preset to the UDC 211 while the preset signal (pulse) $S_2$ is output, the counted value $DX_1$ of the UDC 211 is present to the UDC 212. In this respect, zero reset signal is transmitted from the main control system 214 to the UDCs 210, 211, and 212 when the wafer stage WST is positioned at its home position.

Now, the TTR alignment processing system 216 works out various alignment errors and positional correction amounts of the reticle stage or wafer stage WST on the basis of the deviation information $SX_1$, $SX_2$, $SY_1$, and $SY_2$ for the mark positions detected by each of the TTR alignment systems $DDX_1$, $DDX_2$, $DDY_1$, and $DDY_2$ to output the results to the main control system 214. The off-axis alignment processing system 218 works out the center point of the coordinates of the shot area on the wafer W, the regularity of the shot area arrangements, the expansion, contraction, distortion of the wafer W, and others on the basis or each information of the positional deviations SGx and SGy of the plural wafer marks in the directions X and Y detected by the alignment system OWA and outputs such results to the principal control system 214. The stage driver 220 controls motors 221 and 222 for driving the wafer stage WST in the direction X and direction Y, respectively, to position the wafer stage WST precisely in accordance with the results output from the aforesaid processing systems 216 and 218 as well as with the coordinate values ($DX_1$, $DX_2$, and DY) from the UDCs 210, 211 and 212.

Subsequently, the operation of the present embodiment will be described. However, as the entire sequence thereof is mostly known, its details will be omitted. Only its characteristic sequence will be described below.

At first, the reticle R is mounted on the reticle stage before mounting the prealigned wafer W on the holder WH. The reticle R is also held on the reticle stage by the mechanical prealignment. At this juncture, it is assumed that the UDCs 210, 211, 212 of the interferometers IFY, $IFX_1$ and $IFX_2$ are zero reset because the wafer stage WST is at its home position.

Then, the main control system 214 controls the motor 221 and 222 to position the wafer stage WST through the stage driver 220 as shown in FIG. 23 or in FIG. 24. The position at which the wafer stage WST is set as shown in FIG. 23 or in FIG. 24 is predetermined with respect to the home position. Accordingly, the center point Fcc of the fiducial plate FP is positioned with an accuracy of approximately several μm with respect to the optical axis AX of the projection lens PL. When this positioning is accomplished, the wafer stage WST is servo locked under control of the interferometers IFY and $IFX_2$.

After that, using the TTR alignment system $DDX_1$, $DDX_2$, $DDY_1$, and $DDY_2$, the positional deviating amounts $SX_1$, $SX_2$, $SY_1$, and $SY_2$ between the reticle marks RM and fiducial marks FM are obtained. Based on these positional deviating amounts, the processing system 216 works out the positional deviating amount between the center point of the reticle R and the center point Fcc of the fiducial plate FP in the directions X and Y and the relative rotational error amount in the direction θ. The main control system 214 drives motors (not shown) and others to drive the reticle stage finely so that the positional deviating amount and rotational error amount are both driven into zero values. The driving of the reticle stage can be controlled either with a closed loop control based on the information of the positional deviating amounts and rotational error amounts obtainable from the processing system 216 as the position deviation of the marks are sequentially detected by the TTR alignment systems, or with an open control if there are provided sensors capable of measuring the position of the reticle stage highly precisely.

With the operation set forth above, the reticle R is aligned with the fiducial mark FM on the fiducial plate FP as reference.

At the position of the wafer stage WST where the reticle R is precisely aligned with respect to the fiducial plate FP, each of the UDCs 211 and 212 for the two interferometers $IFX_1$ and $IFX_2$ are preset with each other. More specifically, the main control system 214 outputs the present signal $S_1$ so that the measured value $DX_2$ of the UDC 212 of the interferometer $IFX_2$ being used for servo locking the wafer stage WST can be preset to the counter UDC 211 of the other interferometer $IFX_1$ at this juncture.

Immediately before this operation, however, the measured value $DX_1$ of the counter UDC 211 is read by the main control system 214 to work out the difference with the measured value $DX_2$ for the storage of such difference or the measured value $DX_1$ thus read. These stored values are needed when the reciprocative relationship of the measured values between the interferometers $IFX_1$ and $IFX_2$ is restored to the original stage.

The operation which has been described follows the sequence characteristic of the present embodiment, and after this, the wafer stage WST is driven to allow the off-axis system OWA to detect the fiducial marks FM on the fiducial plate FP sequentially for positioning. Each position of the wafer stage WST then is measured by the interferometers $IFX_1$ and IFY for storage. Further, the positional deviating amount for each of the fiducial marks FM is obtained by the off-axis alignment processing system 218 with respect to the detection center Pd. Then, on the basis of the information of the positional deviating amounts and stored respective positions of the stage, the relative positional relationship (base line) between the projection point of the center point of the reticle R and the center point Pd of the detection on the rectangular coordinate system XY is computed and stored.

After that, the wafer W is mounted on the holder WH Then, the interferometers $IFX_1$ and IFY for measuring the coordinate position of the wafer stage WST are used when the wafer marks provided with several shot areas on the wafer W are detected by the off-axis alignment system, and the positional control of the wafer stage WST is performed in accordance with the measured values of the interferometers $IFX_2$ and IFY at the time of the exposure.

In other words, at the position of the wafer stage WST where the reticle R can be aligned with the fiducial plate FP as reference, the respective inner counters (UDC 211 and UDC 212) of the two interferometers $IFX_1$ and $IFX_2$ are preset to a same value. Then, after that, it is possible to introduce the value measured by the interferometer $IFX_1$ at the time of the mark detection by the off-axis alignment system OWA as it is as the required value for positioning the wafer stage WST on the basis of the measured value of the interferometer $IFX_2$ at the time of exposure, that is, no positional error results from the yawing of the wafer stage WST during the period from the off-axis alignment to the exposure.

Figure 25:
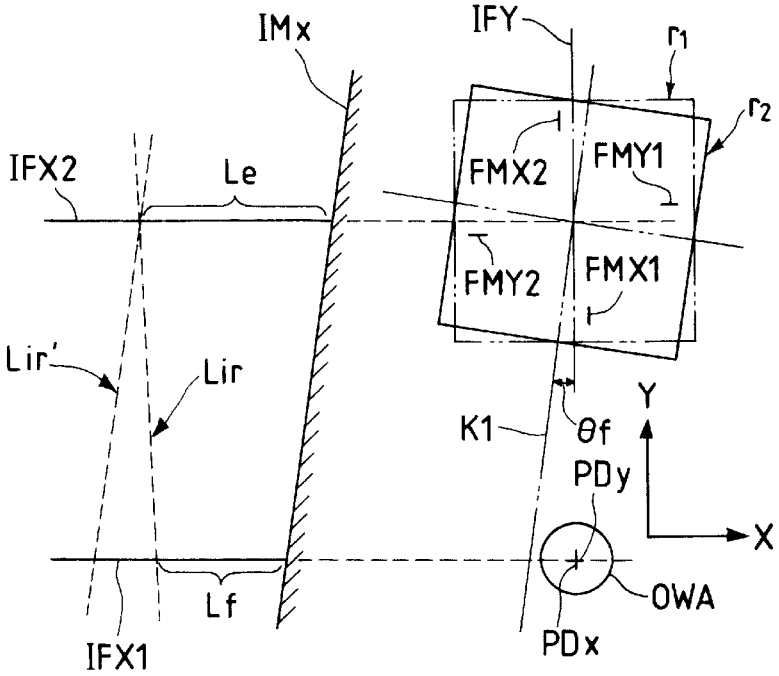
FIG. 25 is a view illustrating the operation of the second embodiment according to the present invention.

Now, in reference to FIG. 25, the sequence set forth above will be described further in detail. FIG. 25 is an exaggerated view showing the arrangement relationship between the fiducial marks FM and movable mirror IMx and interferometers IFY, $IFX_1$, and $IFX_2$.

Firstly, the measurement axis of the interferometer IFY and each of the measurement axes of the interferometers $IFX_1$ and $IFX_2$ are assumed to be precisely rectangular while the intersecting point (Pd) of the detection center PDx of the off-axis alignment system OWA in the direction X and the detection center PDy in the direction Y and the center point Fcc of the fiducial plate FP are assumed to be positioned on the measurement axis of the interferometer IFY. Now, when the fiducial plate FP is mounted on the wafer stage WST, it has a rotational error θf with respect to the reflecting plane of the movable mirror IMx. Accordingly, this rotational error θf is precisely measured in advance as in the case of the first embodiment. Then, when the reticle stage is positioned to correct this rotational error θf at the time of the reticle alignment, the reticle R is aligned to the reflecting plane of the movable mirror IMx without any rotation as shown at $r_2$ in FIG. 25. In this respect, a indicium $r_1$ in FIG. 25 designates the position of the reticle when the reticle marks RM are aligned with respect to the fiducial marks FM with zero errors. The straight line $K_1$ which runs through the center point Fcc represents a line extending in the direction Y through the center of the reticle R, and when the reticle R is aligned to have corrected the error θf, the straight line $K_1$ is in parallel with the reflecting plane of the movable mirror IMx.

On the other hand, the servo control for positioning the wafer stage WST in this state is being executed in accordance with the interferometers $IFX_2$ and IFY. However, given the measured value of the interferometer IFX ($DX_2$) as Le, and the measured value of the interferometer $IFX_1$ ($DX_1$) as Lf, the main control system 214 calculates its difference Ly using the value (Lf−ΔLe) and stores ΔLy. The measured values Le and Lf are based on the position of the reflecting plane of the movable mirror IMx when the wafer stage WST is at its home position, and its reference is indicated by a straight line Lir in FIG. 25. Now, after the difference ΔLy is stored, the UDC 211 is preset to make the measured value Lf of the interferometer $IFX_1$ equal to the measured value Le of the interferometer $IFX_2$. Then, the reference of the two interferometers $IFX_1$ and $IFX_2$ are modified to be as indicated by a straight line Lir'. This straight line Lir' is in parallel with the reflecting plane of the movable mirror IMx and the straight line $K_1$ as well. Thus, thereafter, the marks on the wafer W or the fiducial marks FM on the fiducial plate FP are detected by the off-axis alignment system OWA, and the coordinate value obtainable by detecting the positions thereof in the direction X using the interferometer $IFX_1$ corresponds one to one as it is to be value to be measured by the interferometer $IFX_2$. Hence making it possible to switch over the positioning control of the wafer stage WST at the time of exposure to the control by the interferometers $IFX_2$ and IFY without operating any corrective calculation in consideration of the yawing and others of the stage.

In this respect, when the wafer stage WST is stepped in the direction Y, for example, by the step-and-repeat method, the stage WST is driven along the direction in which the reflecting plane of the movable mirror IMx is set. Because of this, if the reticle R is aligned with the correction of the error θf at $r_2$, the rotation per shot area, that is, the so-called chip rotation, is reduced to an extent which is negligible with respect to the arrangement coordinate system determined by the arrangement of a plurality of shot areas exposed on the wafer W.

Also, in the present embodiment, while only one off-axis alignment system OWA is arranged, if the arrangement of two or more systems is desired, the interferometers which can satisfy the Abbe's condition likewise should only be arranged more. Further, it may be possible to arrange the interferometer to satisfy the Abbe's condition for the TTL inner-field off-axis alignment system having the center point of detection in the circumference inside the larger image field of the projection lens. Also, if there are arranged two interferometers in the direction X and two interferometers in the direction Y as well, the reciprocative presets are conducted respectively in the direction X and direction Y. Also, in FIG. 25, while the description is made of the case where the measured value Le ($DX_2$) of the UDC 212 of the interferometer $IFX_2$ is preset to the UDC 211 of the interferometer $IFX_1$, it may be possible to conduct the presetting in the reverse direction. In other words, the measured value Lf of the UDC 211 can be preset to the UDC 212. In this case, however, it is necessary to switch over the positioning control of the wafer stage WST to before the resetting.

Now, as the TTR alignment systems $DDX_1$, $DDX_2$, $DDY_1$, and $DDY_2$ shown in FIG. 23 or off-axis alignment system OWA, it may be possible to employ a twin-beam interference alignment system (same as LIA type) in which, as disclosed in the application Ser. No. 483,820 filed on Feb. 23, 1990, for example, two coherent beams are irradiated so that they are intersected at a predetermined angle on the reticle or wafer to produce interference fringes on the grating patterns on the reticle or the wafer, and then the coordinate position of the grating patterns on the wafer or the relative positional deviating amounts between the grating patterns of the reticle and the grating patterns on the wafer are obtained by photoelectrically detecting the diffracting light (±first order diffraction light, or zeroth light, ±second order diffraction light) generated by the grating patterns. Particularly, this system is extremely effective when the reticle R is aligned using the fiducial plate FP. In other words, each of the fiducial marks FM on the fiducial plate FP is formed into the grating pattern and each of the reticle marks RM on the reticle R is also formed into the grating pattern as well. Then, the positional deviating amount between each of the reticle marks RM and each of the fiducial marks FM is obtained by the TTR alignment system of the twin-beam interference alignment method. The measuring resolution of this positional deviating amount can be higher than the resolution (±0.01 μm) of the interferometers $IFX_1$, $IFX_2$, and IFY.

Then, it should be good enough if the offset amount of each of the marks necessitated by the mounting error θf of the fiducial plate FP is added to the positional deviating amount thus obtained for the execution of the servo control of the reticle stage in the directins X, Y, and θ.

In this respect, it may be possible to make an arrangement so that subsequent to the alignment of the reticle R, the control of the stage driver 220 is started only on the basis of the positional deviating amount detected by the TTR alignment system in order to servo control the position of the fiducial plate FP with respect to the reticle R by the TTR alignment system of the twin-beam interference alignment method thereby to preset the 20 measured values of the two interferometers $IFX_1$ and $IFX_2$ equally while the position of the wafer stage WST is being servo locked with the aligned reticle R as reference. In this case, the two interferometers $IFX_1$ and $IFX_2$ do not contribute to the positioning control of the wafer stage WST. Therefore, both of them can be preset.

Also, regarding the reticle alignment or the checking of the residual errors subsequent to the reticle alignment, it may be possible to employ besides the TTR alignment system a method in which he relative positions of the images of the light emission marks and the reticle marks RM are detected by projecting the light emission type marks on the fiducial plate FP of the wafer stage WST to the reticle R inversely, or a method in which photoelectric elements are provided below the slit type marks of the fiducial plate FP and the projected images of the reticle marks RM focused on the fiducial plate are received by such photoelectric elements for the positional detection of the projected images.

Now, as a method to measure precisely the mounting error θf of the fiducial plate FP in advance, there is a method using a pilot exposure besides the method described in the first embodiment in this case, a test reticle or the like for the evaluation of the stepper is aligned precisely with respect to the fiducial plate FP using the TTR alignment systems $DDX_1$, $DDX_2$, $DDY_1$, and $DDY_2$ shown in FIG. 23. In other words, in this reticle alignment, the test reticle is positioned with respect to the fiducial plate FP with the accompanying mounting error θf. As a result, the test reticle is set at $r_1$ in FIG. 25.

Then, in such a state, the test wafer (bare silicon or the like) coated with resist is prealigned on the wafer holder WH with flat OF as reference for mounting. Then, at the pitches corresponding to the size of the projected images on the pattern area PA of the test reticle, the wafer stage WST is stepped in the direction X and direction Y to repeat the exposure in this case, the driving of the wafer stage WST in the direction X and direction Y must follow the reflecting planes of the movable mirrors IMx and IMy.

Figure 26:
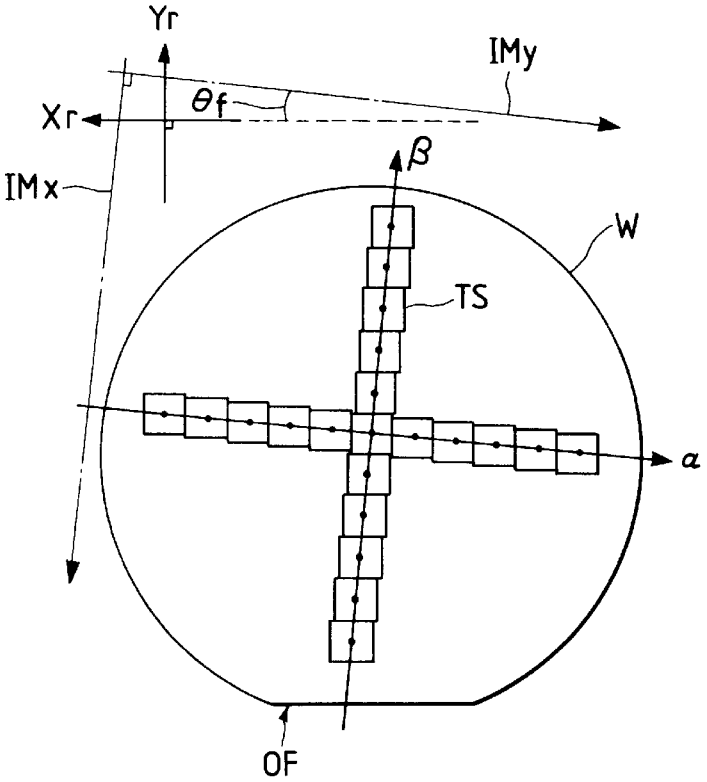
FIG. 26 is a view illustrating the shot arrangement on the wafer when the mounting error of the fiducial plate is obtained by a pilot exposure.

FIG. 26 is an exaggerated view showing the arrangement of the shot area TS of the test reticle to be formed on the test wafer W at the time of exposure. In FIG. 26, the rectangular coordinate systems Xr and Yr are the internal coordinate systems of the test reticle, and there is no rotational deviation for each of the plural shot areas TS on the wafer W with respect to the coordinate systems Xr and Yr. However, the stepping of the wafer stage WST by the step-and-repeat method is executed following the movable mirrors IMx and IMy. Accordingly, the arrangement coordinate systems (rectangular) αβ regulated by the center point of each of the shot areas are in parallel with each of the reflecting planes of the moving mirrors IMx and IMy. Consequently, as clear from FIG. 26, each of the shot areas TS on the wafer looks as if a chip rotation has taken place when observed with the arrangement coordinate systems αβ as reference.

Therefore, subsequent to the development of the wafer to which the pilot exposure has been given, the averaged rotational error amount Δθc of each of the shot areas TS with respect to the arrangement coordinate systems αβ is obtained by the use of the measuring function of the stepper or some other measuring instrument using the test mark (vernier pattern or the like) in each of the shot areas TS. Then, the error amount Δθc must essentially be the same as the mounting error θf.

There is in this respect a technique for performing a special stepping when the pilot exposure is conducted for measuring the chip rotation. In this method, the stepping is conducted in such a manner that the vernier patterns provided at plural locations on the outermost circumference of the pattern areas PA of the test reticle are caused to overlap with each other when adjacent shot area is exposed. The specific example thereof is shown in FIGS. 27A, 27B and 27C.

Figure 27A:
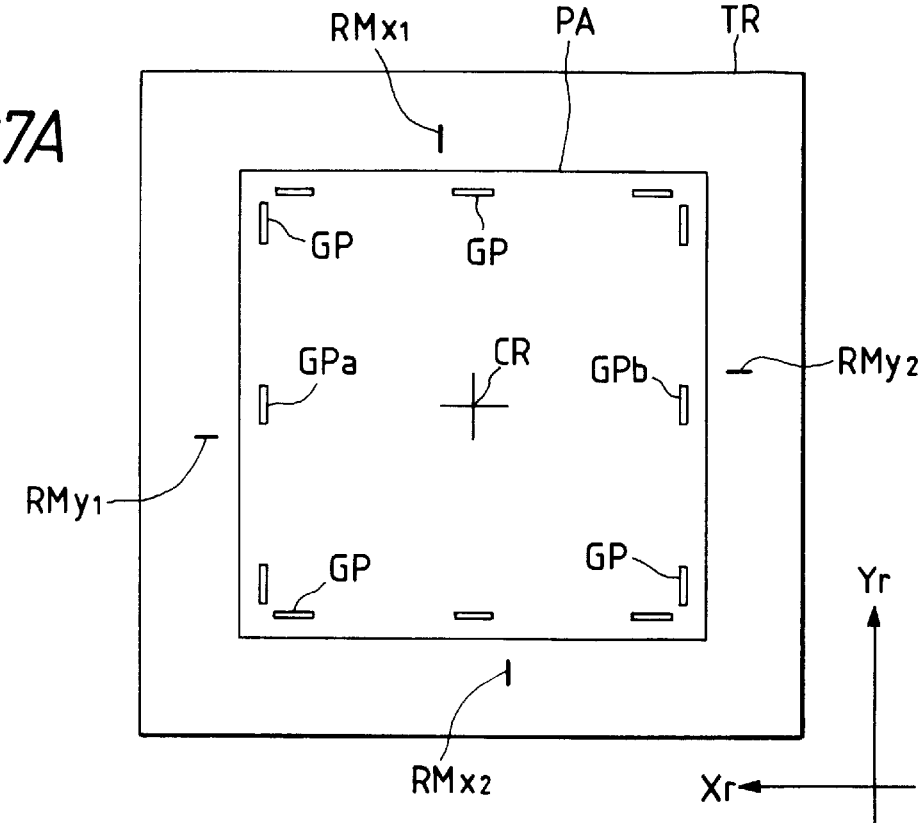
FIGS. 27A, 27B and 27C are views illustrating the pattern arrangement of the test reticle for the chip rotation measurement and the method of stepping therefor.

FIG. 27A illustrates an example of the vernier pattern arrangement in the pattern area PA of a test reticle TR. On each of the four sides of the circumference of the area PA, a plurality of vernier patterns GP of a diffraction grating type shown in FIG. 27B are formed on the predetermined positions. Among these vernier patterns GP, those formed along the side of the pattern area PA in parallel with the axis Yr of the coordinate system Xr and Yr are set so as to allow its pitch direction of the diffraction grating to be matched with the direction Yr while those fomred along the side of the pattern area PA in parallel with the axis Xr are set so as to allow its pitch direction of the diffraction grating to be matched with the direction Xr. Also, each of the plural vernier patterns GP is formed at a predetermined position with respect to the center point CR of the test reticle TR. Then, it is assumed that this positional relationship has been precisely measured by some other measuring instrument and obtained as an arrangement precision (error) of the verniear of the test reticle.

Figure 27B:
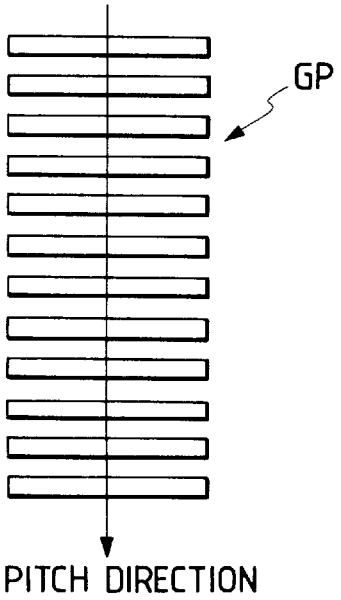

Now, the vernier pattern GP of a diffraction grating type shown in FIG. 27B is formed with a constant pitch (4 μm on the wafer, for example) to present lines and spaces, and the width of each of the lines and spaces is 2 μm on the wafer, for example.

Figure 27C:
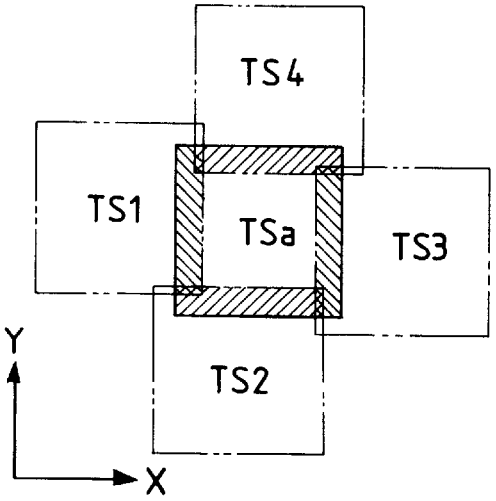

If the pattern areas PA having vernier patterns GP such as this are exposed to the wafer by stepping, the adjacent shot areas themselves are driven in step with parts thereof being overlapped in the direction X and direction Y as shown in FIG. 27C. FIG. 27C is an exaggerated view showing the arrangement of one specific shot area TSa of the plural shot areas shown in FIG. 26, in which adjacent four shot areas $TS_1$, $TS_2$, $TS_3$, and $TS_4$ are arranged. As clear from FIG. 26, too, if any chip rotation is present, the adjacent shot areas themselves are observed as if they have created relative positional deviations in the direction substantially perpendicular to the stepping direction. For example, in FIG. 27C the shot areas $TS_1$ and $TS_3$ formed by stepping in the direction α (X) are deviated in the direction β (Y) with respect to the specific shot area TSa while the shot areas $TS_2$ and $TS_4$ formed by stepping in the direction β (Y) are deviated in the direction α (X) with respect to the specific shot area TSa. Then, the stepping is performed so that the deviating direction due to the chip rotation and the pitch direction of the grating vernier pattern GP are matched to the overlapping portion (slanted portion) each of the shot areas and each of the vernier patterns of the adjacent shot areas is arranged in parallel with a slight deviation.

When the wafer thus exposed is developed, the resist images of a pair of grating type vernier patterns GP are formed on each of the four sides on the circumference of the shot area TSa. The pair of the vernier resist patterns have slight positional deviations in the pitch direction. And measuring this positional deviating amount with a high accuracy, the chip rotation amount $\Delta\theta c$, that is, the mounting error $\theta f$ is obtained.

Now, a specific example is provided. Among the vernier patterns GP of the test reticle TR in FIG. 27A, an attention should be given to the two vernier patterns GPa and GPb which are positioned symmetrically with respect to the center point CR on the line running through the reticle center CR in parallel with the axis Xr. At this juncture, in the overlapped portion (assumed to be the overlapped portion on the left-hand side) between the shot area TSa and shot area $TS_1$, the vernier resist pattern GPb of the area $TS_1$ is deviated to the positive position in the direction Y with respect to the vernier resist pattern GPa provided to the area TSa while in the overlapped portion (assumed to be the overlapped portion on the right-hand side) between the shot area $TS_a$ and shot area $TS_3$, the vernier resist pattern GPa of the area $T_3$ is deviated to the negative position in the direction Y with respect to the vernier resist pattern GPb provided to the area TSa.

Now, given the value obtainable by converting the interval between the vernier patterns GPa and GPb in the direction Xr on the test reticle into the wafer side as LD, the positional deviating amount in the direction Y obtainable in the overlapped portion on the left-hand side as $\Delta Yg_1$, and the positional deviating amount in the direction Y obtainable in the overlapped portion on the right-hand side as $Yg_2$, the chip rotation $\Delta\theta c$ (=$\theta f$) can be worked out by the following equation:

$$\Delta\theta c \cong (\Delta Yg_1 - \Delta Tg_2)/LD$$

With a technique such as this, the relative positional deviating amounts of other plural vernier resist patterns GP are obtained in the specific shot area TSa in order to calculate the plural chip rotation amounts $\Delta\downarrow c$. Then, by averaging them, it is possible to obtain the mounting error $\theta f$ with a higher precision. Also, the specific shot area TSa is arranged in the plural different positions on the wafer so as to obtain the averaged chip rotation amount $\Delta\theta c$ in each of such plural positions. Then, by averaging them further, it is possible to reduce the effect due to the random stepping errors of the wafer stage WST.

In this respect, if the two of the resist images of the vernier patterns GP in FIG. 27B are arranged in parallel in the direction rectangular to the pitch direction, the positional deviating amounts of the two vernier patterns in the pitch direction can be measured with an extremely high precision by the use of a measurement instrument for the positional deviation using the interference fringes as disclosed in U.S. Pat. No. 4,710,026, for example.

According to the method disclosed in this publication, two laser beams symmetrically slanted in the pitch direction are irradiated to each of the two vernier resist patterns simultaneously to produce the interference fringes having pitches ½ of the grating pitches Pg of the vernier resist patterns. Then, a pair of frequency differentials $\Delta f$ are given between the two laser beams simultaneously. At this juncture, the interference light of ±first order diffraction light generated vertically from each of the vernier resist patterns becomes bearing light having a beat frequency $\Delta f$. Then, two alternating current signals (sine waveform) having the frequency $\Delta f$ can be obtained by photoelectrically detecting the interference light individually. However, if the two vernier resist patterns have positional deviations in the pitch direction (within ½ of the grating pitch Pg), a phase difference $\phi$ is generated between the two alternating current signals in proportion to the positional deviating amounts. Therefore, using a phase difference meter or the like, the phase difference $\phi$ between the two alternating current signals (within ±180°) is measured, and the result can be converted into the positional deviating amount. In this connection, assuming that Fourier integration is used for the phase difference measurement, it is possible to obtain approximately ±0.5 stably as the resolution of the phase difference measurement. Now, if the grating pitch Pg is 4 $\mu$m on the wafer, the positional deviaiton of Pg/2 corresponds to 360° of the phase difference (±Pg/4 corresponds to ±180°). Accordingly, when the phase measurement resolution is ±0.5°, the positional deviation detecting resolution is ±Pg/4 (4·180/0.5), which is approximately ±2.8 nm. This value is higher by one digit than the usual resolution of the laser interferometer for measurement use.

Therefore, if the positional deviation measuring function using such interference fringes, that is, the same function of the LIA system described in the aforesaid first embodiment, is incorporated as an alignment system of a stepper, it is possible to obtain the chip rotation $\Delta\theta c$ and the mounting error $\theta f$ of the fiducial plate FP immediately by mounting the developed wafer on the stepper for an automatic measurement. As a result, there is an advantage that the operations required to store such values in the stepper as apparatus constants can be automated. Also, with a stepper provided with such a high resolution and a highly precise self measuring system, it is possible to obtain the mounting error of the fiducial plate FP by measuring the positional relations of the fiducial marks directly. In this case, it is necessary to provide the marks of the same diffraction grating type as shown in FIG. 27B partially with the fiducial marks.

What is claimed is:

1. An exposure apparatus for exposing mask patterns on a sensitive plate having, a mask stage holding said mask, a plate stage movable two dimensionally in accordance with a rectangular coordinate system while holding said sensitive plate, a projection optical system imaging said mask patterns at a predetermined position on said sensitive plate, a first mark detecting system for detecting a mask mark formed at a predetermined position on said mask in the image field of said projection optical system, and a second mark detecting system for detecting a plate mark formed on said sensitive plate in a detection area positioned at predetermined intervals from the optical axis of said projection optical system, said exposure apparatus comprising:

(a) a first fiducial mark member arranged on a part of said plate stage, having a shape capable of being detected by said first mark detecting system through said projection optical system;

(b) a second fiducial mark member arranged on a part of said plate stage, having a shape capable of being detected by said second mark detecting system; and (c) a mounting member for mounting said first fiducial mark member and said second fiducial mark member at constant intervals recognized in advance so as to position said second fiducial mark member in the detection area of said second mark detecting system when said first fiducial mark member is positioned in a predetermined relationship with respect to the position where said mask mark is to be present in the image field of said projection optical system.

2. An exposure apparatus for exposing mask patterns on a sensitive plate having, a mask stage holding said mask, a plate stage movable two dimensionally in accordance with a rectangular coordinate system while holding said sensitive plate, a projection optical system imaging said mask patterns at a predetermined position on said sensitive plate, a first mark detecting system for detecting a mask mark formed at a predetermined position on said mask in the image field of said projection optical system, and a second mark detecting system having a detection center positioned at predetermined intervals apart from the optical axis of said projection optical system, for detecting a plate mark formed on said sensitive plate, said exposure apparatus comprising:

(a) a first fiducial mark member arranged on a part of said plate stage and capable of being detected by said first mark detecting system through said projection optical system;

(b) a second fiducial mark member arranged on a part of said plate stage, and capable or being detected by said second mark detecting system;

(c) a mounting member for mounting said first fiducial mark member and said second fiducial mark member at constant intervals recognized in advance so as to position said second fiducial mark member in the detection area of said second mark detecting system when said first fiducial mark member is positioned in a predetermined relationship with respect to the position where said mask mark is to be present in the image field of said projection optical system; and (d) base line determining means for calculating the base line distance between the projecting position of said mask patterns by said projection optical system and the position of the detection center of said second mark detecting system based on the positional displacement value between said first fiducial mark member and said mask mark detected by said first mark detecting system, the positional displacement value of said second fiducial mark member against said detection center detected by said second mark detecting system, and the value of said constant intervals recognized in advance.

3. An exposure apparatus for exposing mask patterns on a sensitive plate having a plate stage movable two dimensionally in accordance with a rectangular coordinate system while holding said sensitive plate, a projection optical system imaging said mask patterns at a predetermined position on said sensitive plate, a first mark detecting system for detecting a mask mark formed at a predetermined position on said mask in the image field of said projection optical system, and a second mark detecting system, having a detection area positioned at predetermined intervals apart from the optical axis of said projection optical system, for detecting a plate mark formed on said sensitive plate, said exposure apparatus comprising:

(a) a first fiducial mark member arranged on a part of said plate stage and capable of being detected by said first mark detecting system through said projection optical system;

(b) a second fiducial mark member arranged on a part of said plate stage, and capable of being detected by said second mark detecting system;

(c) a mounting member for mounting said first fiducial mark member and said second fiducial mark member at constant intervals recognized in advance so as to position said second fiducial mark member in the detection area of said second mark detecting system when said first fiducial mark member is positioned in a predetermined relationship with respect to the position where said mask mark is to be present in the image field of said projection optical system;

(d) positioning control means for causing said plate stage to be stationary on said rectangular coordinate system so as to enable said mask mark and said first fiducial mark member to be detected in an aligned state by said first mark detecting system;

(e) means for starting the detecting operation of said second mark detecting system for said second fiducial mark member while said positioning control means is activating; and (f) base line determining means for calculating the base line distance between the projecting position of said mask patterns by said projection optical system and the position of the detection area of said second mark detecting system based on the positional displacement value of said second fiducial mark member detected by said second mark detecting system, and the value of said constant intervals recognized in advance.

4. An exposure apparatus for exposing mask patterns on a sensitive plate having a plate stage movable two dimensionally in accordance with a rectangular coordinate system while holding said sensitive plate, a projection optical system imaging said mask patterns at a predetermined position on said sensitive plate, a first mark detecting system for detecting a mask mark formed at a predetermined position on said mask in the image field of said projection optical system, and a second mark detecting system, having a detection area positioned at predetermined intervals apart from the optical axis of said projection optical system, for detecting a plate mark formed on said sensitive plate, said exposure apparatus comprising:

(a) a first fiducial mark member arranged on a part of said plate stage and capable of being detected by said first mark detecting system through said projection optical system;

(b) a second fiducial mark member arranged on a part of said plate stage, and capable of being detected by said second mark detecting system;

(c) a mounting member for mounting said first fiducial mark member and said second fiducial mark member at constant intervals recognized in advance so as to position said second fiducial mark member in the detection area of said second mark detecting system when said first fiducial mark member is positioned in a predetermined relationship with respect to the position where said mask mark is to be present in the image field of said projection optical system;

(d) positioning control means for causing said plate stage to be stationary on said rectangular coordinate system so as to enable said detection area and said first fiducial mark member to be detected in an aligned state by said second mark detecting system;

(e) means for starting the detecting operation of said mask mark and said second fiducial mark member by said first mark detecting system while said positioning control means is activating; and (f) base line determining means for calculating the base line distance between the projecting position of said mask patterns by said projection optical system and the position of the detection area of said second mark detecting system based on the positional displacement value between said mask mark and said second fiducial mark member detected by said first mark detecting system, and the value of said constant intervals recognized in advance.

5. An exposure apparatus for exposing mask patterns on a sensitive plate including a projection optical system imaging said mask patterns at a predetermined image plane position on said sensitive plate, a plate stage movable two dimensionally in accordance with a rectangular coordinate system parallel to said image plane while holding said sensitive plate, a first mark detecting system for detecting a mark on said sensitive plate through a first detecting area provided in the projection image field of said projection optical system, a second mark detecting system for detecting a mark on said sensitive plate through a second detecting area provided outside the projection image field of said projection optical system, said exposure apparatus comprising:

(a) a fiducial member mounted on a part of said plate stage with a first fiducial mark capable of being detected by said first mark detecting system and a second fiducial mark capable of being detected by said second mark detecting system, said first and second fiducial marks being formed at predetermined constant intervals, wherein said first and second fiducial marks are provided in a positional relationship substantially the same as the arrangement of said first and second detecting areas in said rectangular coordinate system;

(b) a first measuring means of an incremental type having measuring axes arranged in parallel with each of the two coordinate axes of said rectangular coordinate system to satisfy the Abbe's condition with respect to the optical axis of said projection optical system for measuring the coordinate positions on said rectangular coordinate system of said plate stage;

(c) a second measuring means of an incremental type having measuring axes arranged in parallel with each of the two coordinate axes of said rectangular coordinate system to satisfy the Abbe's condition with respect to the second detecting area of said second mark detecting system for measuring the coordinate positions on said rectangular coordinate system of said plate stage; and (d) resetting means for resetting each of the measured values of said first and second measuring means to a same value when said plate stage is positioned so that said first fiducial mark is detected by said first mark detecting system and at the same time, said second fiducial mark is detected by said second mark detecting system.

6. An exposure apparatus for exposing mask patterns on a sensitive plate including a projection optical system imaging said mask patterns at a predetermined image plane position of said sensitive plate, a plate stage movable two dimensionally in accordance with a rectangular coordinate system parallel to said image plane while holding said sensitive plate, a first mark detecting system for detecting a mask mark on said mask through a detecting area provided in the projection image field of said projection optical system, a second mark detecting system for detecting a mark on said sensitive plate through a detecting area provided outside the projection image field of said projection optical system, said exposure apparatus comprising:

(a) a fiducial member provided on a part of said plate stage and having a fiducial mark detecting by said first mark detecting system;

(b) positioning control means for driving said plate state and for causing said plate stage to be stationary in order to arrange said fiducial mark at a predetermined position in the image field of said projection optical system for enabling said first mark detecting system to detect both said mask mark and said fiducial mark;

(c) a first measuring means of an incremental type having measuring axes arranged in parallel with each of the two coordinate axes of said rectangular coordinate system to satisfy the Abbe's condition with respect to the optical axis of said projection optical system for measuring the coordinate positions on said rectangular coordinate system of said plate stage;

(d) a second measuring means of an incremental type having measuring axes arranged in parallel with each of the two coordinate axes of said rectangular coordinate system to satisfy the Abbe's condition with respect to the detection area of said second mark detecting system for measuring the coordinate positions on said rectangular coordinate system of said plate stage; and (e) resetting means for resetting each of the measured values of said first and second measuring means to a same value when said plate stage is positioned by said positioning control means.

7. An exposure apparatus for exposing mask patterns on a sensitive plate including a mask stage movable two dimensionally while holding said mask, a projection optical system for imaging said mask patterns on said sensitive plate, a plate stage movable two dimensionally in a rectangular coordinate system while holding said sensitive plate, and a first mark detecting system for detecting mask marks formed at a plurality of positions on said mask in the projection image field of said projection optical system, said exposure apparatus comprising:

(a) a fiducial member provided on a part of said plate stage with a first fiducial marks being formed to be aligned with each of said mask marks through the projection image field of said projection optical system;

(b) means for storing values of mounting errors of said fiducial member on said plate stage in advance with said rectangular coordinate system as reference;

(c) a first control means for driving said plate stage and for causing said plate stage to be stationary so as to arrange said plurality of fiducial marks at predetermined positions in the projection image field of said projection optical system; and (d) a second control means for positioning said mask stage on the basis of the detection of said first mark detecting system so that said mask marks are displaced by said mounting errors to be aligned with respect to said plurality of fiducial marks at said predetermined positions.

8. An exposure apparatus for exposing mask patterns on a sensitive plate having a mark stage holding said mask, a plate stage movable two dimensionally in accordance with a rectangular coordinate system while holding said sensitive plate, a projection optical system for imaging said mask patterns on said sensitive plate, an inner-field alignment system for detecting the patterns formed on an object on said plate stage through the image field of said projection optical system, and an outer-field alignment system for detecting the patterns of said object, said exposure apparatus comprising:

(a) a fiducial member of a low expansion material mounted on a part of said plate stage with a first fiducial mark capable of being detected by said inner-field alignment system and a second fiducial mark capable of being detected by said outer-field alignment system being formed on the surface thereof, wherein said first and second fiducial marks are provided in a positional relationship substantially the same as the arrangement the mark detecting areas of said inner-field alignment system and said outer-field alignment system in said rectangular coordinate system;

(b) positioning control means of positioning said plate stage to cause said first fiducial mark to be stationary at a predetermined position in the image field of said projection optical system; and (c) means for instructing said inner-field alignment system and said outer-field alignment system to detect respectively said first fiducial mark and said second fiducial mark almost simultaneously with said plate stage being at rest.

9. A method for controlling the precision of an exposure apparatus for exposing mask patterns on a sensitive plate provided with a mask stage holding said mask, a plate stage movable two dimensionally in accordance with a rectangular coordinate system while holding said sensitive plate, an alignment system for detecting at least one of a mask mark formed on said mask and a plate mark formed on said sensitive plate for the alignment of said mask and said sensitive plate, and a fiducial member arranged on a part of said plate stage with a fiducial mark formed thereon to be detected by said alignment system, including the following steps of:

(a) aligning said mask with respect to said fiducial member by arranging the fiducial mark of said fiducial member at an exposing position in said rectangular coordinate system and detecting said mask mark and fiducial mark using said alignment system;

(b) sequentially exposing said mask patterns on said sensitive plate for each of step positions by moving said plate stage in the direction of one of the coordinate axes of said rectangular coordinate system step by step for a predetermined amount, wherein said mask patterns are partially overlapped in the direction of the step movement for exposure;

(c) measuring a positional deviating amount of said overlapped portions of the patterns exposed on said sensitive plate in a direction intersecting at right angles with said direction of the step movement; and (d) calculating the mounting error of said fiducial member on said plate stage with said rectangular coordinate system as reference on the basis of said measured positional deviating amount.

10. An exposure apparatus for exposing mask patterns on a sensitive plate including:

a plate stage movable two dimensionally in accordance with a rectangular coordinate system while holding said sensitive plate, a projection optical system for imaging said mask patterns on said sensitive plate, a light emission mark member mounted on a part of said plate stage for forming a fine light emission mark image on said mask through said projection optical system, a first detecting system for detecting variation of the light being generated when said light emission mark image scans a mark formed on said mask, and a second detecting system for detecting a mark on said sensitive plate by scanning said plate stage through a detecting area arranged outside the image field of said projection optical system, comprising the following:

(a) a fiducial member mounted on a part of said plate stage at a predetermined interval with respect to said light emission mark member with a fiducial mark formed thereon to be detected by said second detecting system, where the light emission mark of said light emission mark member and the fiducial mark of said fiducial member are provided in a positional relationship substantially the same as the arrangement of the expected position of the projection of the mark of said mask by said projection of the mark of said mask by said projection optical system and the position of the detecting area of said second detecting system in said rectangular coordinate system;

(b) driving control means for scanning said plate stage in a predetermined direction so as to cause said fiducial mark to pass through the detecting area of said second detecting system while said light emission image by said projection optical system scans only a predetermined area including said mask mark; and (c) means for storing signals output from each of the first detecting system and said second detecting system while said plate stage is scanned.

11. An exposure apparatus for exposing mask patterns on a sensitive plate including:

a plate stage movable two dimensionally in accordance with a rectangular coordinate system while holding said sensitive plate, p1 a projection optical system for imaging said mask patterns on said sensitive plate, a first detecting system mounted on a part of said plate stage for detecting photoelectrically mark imaging light from said mask projected by said projection optical system through a light receiving area, and a second detecting system for detecting a mark on said sensitive plate photoelectrically through a detecting area arranged outside the image field of said projection optical system, comprising the following:

(a) a fiducial member mounted on a part of said plate stage at predetermined interval with respect to said first detecting system with a fiducial mask formed thereon to be detected by said second detecting system, wherein the light receiving area of said first detecting system and the fiducial mark of said fiducial member are provided in a positional relationship substantially the same as the arrangement of the expected position of the image mark imaging light from said mask by said projection optical system and the position of the detection area of said second detecting system in said rectangular coordinate system; and (b) driving control means for driving said plate stage to cause said fiducial mark to be detected by said second detecting system substantially at the same time that the mark imaging light from said mask by said projection optical system is detected by said first detecting system.

*12. An alignment apparatus, comprising:*

*a movable stage for supporting an object having at least one mark and for moving in a predetermined coordinate system;*

*a mark detecting system having a detecting region located at a predetermined position in said coordinate system, for detecting the mark positioned into said detecting region and for producing a deviation value of said mark and a predetermined target point designated in said detecting region;*

*an interferometer system including a counter for producing a measuring value that is variable in response to the movement of said movable stage; and*

*a control system for determining control information so as to bring said movable stage into a predetermined position in said coordinate system, on the basis of the deviation value from said mark detecting system and a plurality of the measuring values read out from said counter at the same time as the detecting by said mark detecting system, and for controlling said movable stage on the basis of the determined control information.*

*13. Apparatus according to claim 12, wherein said mark detecting system includes an objective lens for forming an image of the mark of the object on a predetermined imaging plane, and an image pick-up device located at said imaging plane for generating a video signal, said detecting region being defined by an image receiving area of said image pick-up device.*

*14. Apparatus according to claim 13, wherein said predetermined target point is defined by a target mark of a target plate disposed in an optical path from said objective lens to said image pick-up device.*

*15. Apparatus according to claim 14, wherein said mark detecting system includes an image processing circuit for processing said video signal and for producing a deviation amount of said target mark and the mark of said object.*

*16. Apparatus according to claim 15, wherein said image processing circuit calculates a mean value of a plurality of the deviation amounts and generates said mean value as said deviation value.*

*17. A device manufacturing method to transfer a pattern image of a mask onto a predetermined region of a substrate in a predetermined aligning state, comprising the steps of:*

*(a) detecting a first deviation value of the mask and a fiducial mark plate, said fiducial mark plate being mounted on a movable XY-stage supporting the substrate;*

*(b) detecting a second deviation value of said fiducial mark plate and a detection center of an alignment system provided for detecting alignment marks formed on the substrate;*

*(c) measuring positional information of the XY-stage by reading out a plurality of measured values produced from an interferometer system at the same time as the detecting of said second deviation value;*

*(d) determining a base line value having relation to a distance between a center of the mask and the detection center of said alignment system, on the basis of said first deviation value, said second deviation value and said positional information; and*

*(e) controlling the movement of said XY-stage so as to align the mask and the predetermined region of the substrate relatively, on the basis of the determined base line value.*

*18. A device manufacturing method to transfer a pattern image of a mask onto a predetermined region of a substrate in a predetermined aligning state, comprising the steps of:*

*(a) aligning a fiducial mark plate and the mask, said fiducial mark plate being mounted on a movable XY-stage on which the substrate is supported;*

*(b) detecting a deviation value of said fiducial mark plate and a detection center of an alignment system provided for detecting alignment marks formed on the substrate;*

*(c) measuring positional information of the XY-stage by reading out a plurality of measured values produced from an interferometer system at the same time as the detecting of said deviation value;*

*(d) determining a base line value having relation to a distance between a center of the mask and the detection center of said alignment system, on the basis of said deviation value and said positional information; and*

*(e) controlling the movement of said XY-stage so as to align the mask and the predetermined region of the substrate relatively, on the basis of the determined base line value.*

*19. An exposure apparatus which exposes a photosensitive substrate with an illumination beam irradiated on a mask through a projection optical system, comprising:*

*a movable member disposed at an image plane side of said projection optical system for supporting said photosensitive substrate;*

*a mark detection system for detecting a first mark disposed on said movable member by projecting a light beam having substantially the same wavelength as said illumination beam and receiving a light beam reflected by said first mark through said projection optical system;*

*an alignment optical system for detecting an alignment mark on said photosensitive substrate and for detecting a second mark disposed on said moveable member, said alignment optical system having an optical axis which is different from an optical axis of said mark detection system; and*

*a fiducial plate disposed on said movable member for determining a base line of said alignment optical system, said fiducial plate including said first mark and said second mark, both of which are detected substantially simultaneously.*

*20. An apparatus according to claim 19, wherein said alignment optical system includes an objective optical system which is independent from said projection optical system and an image pick-up element for picking-up an image of said second mark through said objective optical system.*

*21. An apparatus according to claim 20, wherein said alignment optical system projects a wide-bandwidth light beam, of which a wavelength range is different from that of said illumination beam, onto said fiducial plate through said objective optical system.*

*22. A method of exposing a photosensitive substrate with an illumination beam irradiated on a mask through a projection optical system, comprising the steps of:*

*disposing a fiducial plate on which first and second marks are formed at an image plane side of said projection optical system;*

*projecting a light beam having substantially the same wavelength as said illumination beam toward said first mark to detect a light beam reflected by said first mark through said projection optical system; and*

*detecting said second mark by an off-axis alignment optical system substantially simultaneously to the detection of said first mark to determine a base line of said off-axis alignment optical system, which is disposed independently from said projection optical system.*

*23. A method according to claim 22, wherein said first mark provides a positional relationship with respect to a mark on said mask and said second mark provides a positional relationship with respect to an index mark in said alignment optical system.*

*24. A method according to claim 23, wherein the base line of said alignment optical system is determined based on the*

*two positional relationships and positional information of a stage on which said fiducial plate is disposed.*

*25. An alignment apparatus, comprising:*

*an interferometer to produce information with respect to relative movement of a mask and a substrate;*

*an alignment optical system that outputs a signal corresponding to a relative deviation between a first mark on the mask and a second mark on the substrate; and*

*an alignment controller that determines a positional relationship between the mask and the substrate based on the signal from said alignment optical system and a plurality of values of information produced by said interferometer in response to a detection of the first and second marks by said alignment optical system.*

*26. An apparatus according to claim 25, wherein said alignment controller calculates an equalized value of said plurality of values of information to determine said positional relationship based on said signal and the equalized value.*

*27. An apparatus according to claim 25, further comprising:*

*a projection optical system disposed between said mask and said substrate; and*

*an off-axis alignment optical system having an optical axis different from that of the projection optical system to detect a third mark formed on said substrate.*

*28. An alignment method comprising the steps of:*

*detecting a relative deviation between a first mark on a mask and a second mark on a substrate;*

*measuring a relative position between the mask and the substrate; and*

*determining a positional relationship between the mask and the substrate based on the detected relative deviation and a plurality of relative positions measured in response to a detection of the first and second marks.*

*29. A method according to claim 28, wherein said positional relationship is determined based on said detected relative deviation and an equalized value of said plurality of relative positions.*

*30. A method according to claim 28, wherein said relative position is measured by an interferometer which detects a position of said mask in an alignment direction.*

*31. A method according to claim 29, further comprising:*

*obtaining positional information of a third mark on said substrate by an off-axis alignment optical system; and*

*determining a baseline of the off-axis alignment optical system based on the determined positional relationship and the obtained positional information.*

*32. A method according to claim 31, wherein the detection of the relative deviation between said first mark and said second mark and a detection of said third mark are performed substantially simultaneously.*

*33. An alignment method comprising the steps of:*

*detecting a relative deviation between a first mark on a mask and a second mark on a substrate;*

*measuring a relative position between the mask and the substrate; and*

*adjusting a positional relationship of the mask and the substrate based on the detected relative deviation and a plurality of relative positions measured in response to a detection of the first and second marks.*

*34. A projection exposure apparatus which exposes a substrate with a projected image of a mask through a projection optical system, comprising:*

*a first mark detection system which has a detection area at the image side of said projection optical system to detect a mark on said substrate through an optical element different from the projection optical system;*

*a second mark detection system which detects a mark disposed at the image side of said projection optical system through the projection optical system; and*

*a movable member disposed at the image side of said projection optical system, on which a first mark and a second mark are arranged in such a positional relationship that allows the detection of said first mark by said first mark detection system and the detection of said second mark by said second mark detection system substantially simultaneously.*

*35. An apparatus according to claim 34, wherein a distance between said first and second marks is set such that said second mark falls within a detection area of said second mark detection system when the detection of said first mark by said first mark detection system is effected.*

*36. An apparatus according to claim 34, wherein a distance between said first and second marks is set such that the detection of the first mark by said first mark detection system and the detection of the second mark by said second mark detection system can be effected without movement of said movable member.*

*37. An apparatus according to claim 34, wherein a distance between said first and second marks is set substantially corresponding to a distance between a detection area of said first mark detection system and a detection area of said second mark detection system.*

*38. An apparatus according to claim 34, wherein said second mark detection system detects a mark on said mask as well as said second mark and a distance between said first and second marks is set substantially corresponding to a distance between a position of said mark on the mask detected by said second mark detection system within a projection field of said projection optical system and a center of detection of said first mark detection system.*

*39. An apparatus according to claim 34, further comprising:*

*an interferometer having at least one measurement axis which passes through a center of detection of said first mark detection system, wherein an output of said interferometer is used upon detection of said first mark by said first mark detection system.*

*40. An apparatus according to claim 34, wherein said movable member is a substrate stage which holds said substrate.*

*41. An apparatus according to claim 34, further comprising a mask stage which holds said mask, wherein said apparatus scanningly exposes said substrate with said projected image by moving said mask and said substrate in a direction perpendicular to an optical axis of said projection optical system.*

*42. An apparatus according to claim 34, further comprising a mask stage which holds said mask, wherein said apparatus transfers a pattern on said mask onto said substrate in accordance with a step and scan scheme.*

*43. An apparatus according to claim 34, further comprising:*

*a drive system which moves said movable member; and*

*a controller connected to said drive system, which servo-locks, upon detection of said second mark by said second mark detection system, said movable member based on an output of said first mark detection system.*

*44. An apparatus according to claim 43, wherein said controller servo-locks said movable member such that a center of detection of said first mark detection system and said first mark substantially coincide.*

*45. An apparatus according to claim 34, wherein said first and second marks are disposed on said movable member separately at positions different from each other.*

*46. An apparatus according to claim 45, wherein said first and second marks are formed on a single fiducial plate disposed on said movable member.*

*47. An apparatus according to claim 46, wherein said measurement system uses a mounting error of said fiducial plate on said movable member and positioning errors of said first and second marks on said fiducial plate.*

*48. An apparatus according to claim 34, further comprising:*

*a measurement system connected to said first and second detection systems to determine a baseline amount of said first detection system by detecting said first and second marks.*

*49. An apparatus according to claim 48, wherein said first mark detection system detects said first mark plural times and said measurement system uses, upon determination of said baseline amount, a plurality of detection values of said first detection system.*

*50. An apparatus according to claim 48, wherein said second mark detection system detects said second mark plural times and said measurement system uses, upon determination of said baseline amount, a plurality of detection values of said second detection system.*

*51. An apparatus according to claim 48, wherein said first and second detection systems detect said first and second marks simultaneously, and said measurement system has an adjusting device which adjusts a positional relationship between said first and second detection systems and said movable member prior to said simultaneous detection.*

*52. An apparatus according to claim 51, wherein said adjusting device comprises a drive system which moves said movable member and a position detection system which detects position information of said movable member to control the movement of said movable member based on the dispositions of said first and second mark detection systems.*

*53. An apparatus according to claim 48, further comprising:*

*a drive system which moves said movable member;*

*a detection device which detects position information of said movable member; and*

*a controller, connected to said drive system and said detection device, which controls said drive system based on the position information detected by said detection device to servo-lock said movable member at the time of detection of said first mark or said second mark by said first mark detection system or said second mark detection system.*

*54. An apparatus according to claim 53, wherein said detection device includes an interferometer which radiates a laser beam onto a reflection surface arranged on said movable member.*

*55. An apparatus according to claim 54, wherein said detection device includes first and second interferometers, having measurement axes which intersect each other on an optical axis of said projection optical system, and a third interferometer having a measurement axis that passes through a center of detection of said first mark detection system and is parallel to one of the measurement axes of said first and second interferometers.*

*56. An apparatus according to claim 53, wherein said detection device includes a third mark detection system which detects a third mark arranged on said movable member.*

*57. An apparatus according to claim 56, wherein said third mark detection system detects said third mark through said projection optical system.*

*58. An apparatus according to claim 56, wherein said third mark detection system detects said third mark and a mark on said mask.*

*59. An apparatus according to claim 56, wherein said third mark is arranged on a fiducial plate on which said first and second marks are also formed.*

*60. An apparatus according to claim 56, wherein said third mark detection system detects said third mark through an objective optical system which is provided independently of said projection optical system.*

*61. An apparatus according to claim 60, wherein said third detection system has a center of detection outside of a projection field of said projection optical system.*

*62. An exposure apparatus which exposes a substrate with an energy beam through a mask, comprising:*

*a first mark detection system which detects a mark on said substrate through a first optical system different from a second optical system through which the energy beam passes;*

*a second mark detection system which detects a mark on said mask; and*

*a mark plate which can be detected by said first and second detection systems simultaneously.*

*63. An apparatus according to claim 62, wherein said mark plate is formed with a first mark to be detected by said first mark detection system and a second mark to be detected by said second mark detection system, the first and second marks being formed separately from each other.*

*64. An apparatus according to claim 62, further comprising a movable member on which said mark plate is arranged and which is arranged on a coordinate system which defines a movement of said substrate.*

*65. An apparatus according to claim 64, wherein said movable member is a substrate stage which holds said substrate.*

*66. An exposure apparatus which exposes a substrate with an energy beam through a mask, comprising:*

*a first mark detection system which detects a mark on said substrate through a first optical system different from a second optical system through which the energy beam passes;*

*a second mark detection system which detects a mark on said mask; and*

*a movable member formed with a fiducial mark in such a way that detections of said fiducial mark by said first and second mark detection systems are effected at substantially the same position.*

*67. An apparatus according to claim 66, wherein said fiducial mark is detected by said first and second mark detection systems substantially simultaneously.*

*68. An apparatus according to claim 66, further comprising an interferometer which detects position information of said movable member, wherein, upon measurement of a baseline of said first mark detection system, results of detection of said fiducial mark by said first and second mark detection system, said position information of said movable member and information concerning a rotation amount of said movable member obtained from said interferometer are used.*

*69. An apparatus according to claim 66, wherein said movable member is a substrate stage which holds said substrate.*

*70. An apparatus according to claim 66, further comprising:*

*a mask stage which holds said mask; and*

*an interferometer which detects position information of said mask stage,*

*wherein an output of said interferometer is used upon baseline measurement of said first mark detection system.*

*71. An apparatus according to claim 70, wherein position information of said mask stage is detected plural times by said interferometer and a plurality of detection results of position information are used upon said baseline measurement.*

*72. An apparatus according to claim 66, wherein said second optical system includes a projection optical system which projects an image of a pattern on said mask onto said substrate, and said first mark detection system has a detection area outside of a field of said projection optical system.*

*73. An apparatus according to claim 72, wherein said first mark detection system is an off-axis system which has an objective optical system which is provided independently of said projection optical system and which is provided in said first optical system.*

*74. An apparatus according to claim 66, wherein said fiducial mark comprises at least a first mark to be detected by said first mark detection system and a second mark to be detected by said second mark detection system, said first mark and said second mark being formed on different positions on said movable member.*

*75. An apparatus according to claim 74, further comprising a plate arranged on said movable member, wherein said first and second marks are formed on said plate.*

*76. An apparatus according to claim 66, further comprising an interferometer which detects position information of said movable member, wherein, upon measurement of a baseline of said first mark detection system, results of detection of said fiducial mark by said first and second mark detection systems and information concerning a rotation amount of said movable member obtained from said interferometer are used.*

*77. An apparatus according to claim 76, further comprising a drive system which servo-locks, upon detection of said fiducial mark by said first mark detection system or said second mark detection system, said movable member using an output of said interferometer.*

*78. An apparatus according to claim 76, wherein said first mark detection system detects said fiducial mark plural times and a plurality of results of detection of said fiducial mark by said first mark detection system are used upon said baseline measurement.*

*79. An apparatus according to claim 78, wherein said second mark detection system detects said fiducial mark plural times and a plurality of results of detection of said fiducial mark by said second mark detection system are used upon said baseline measurement.*

*80. An apparatus according to claim 76, further comprising:*

*a mark detection system which detects a specific mark arranged on said movable member; and*

*a drive system which servo-locks, upon detection of said fiducial mark by said first and second mark detection system, said movable member using an output of said mark detection system which detects the specific mark.*

*81. An apparatus according to claim 80, wherein said mark detection system which detects the specific mark is one of said first and second mark detection systems.*

*82. An exposure method of exposing a substrate with an energy beam through a mask, comprising:*

*controlling movement of a mark plate formed with first and second marks such that detection of said first mark by a first mark detection system and detection of said second mark by a second mark detection system can be substantially simultaneously effected, in order to measure a baseline of said first mark detection system, which detects a mark on said substrate through a first optical system different from a second optical system through which the energy beam passes; and*

*effecting exposure of said substrate after said baseline measurement.*

*83. An exposure method of exposing a substrate with an energy beam through a mask, comprising:*

*positioning a mark plate formed with first and second marks such that detection of said first mark by a first mark detection system and detection of said second mark by a second mark detection system can be effected at substantially the same position, in order to measure a baseline of said first mark detection system, which detects a mark on said substrate through a first optical system different from a second optical system through which the energy beam passes; and*

*effecting exposure of said substrate after said baseline measurement.*

*84. A method according to claim 83, wherein information concerning a rotation amount of said mark plate is used upon the baseline measurement.*

*85. A method according to claim 83, wherein upon the baseline measurement, said mark plate is servo-locked in accordance with information regarding its position.*

*86. A method according to claim 83, wherein upon exposure of said substrate, each of said mask and said substrate is moved with respect to said energy beam.*

*87. A method according to claim 83, wherein the detection of said first mark by said first mark detection system is effected plural times and a plurality of detection results by said first mark detection system are used upon the baseline measurement.*

*88. A method according to claim 87, wherein the detection of said second mark by said second mark detection system is effected plural times and a plurality of detection results by said second mark detection system are used upon said baseline measurement.*

*89. A method according to claim 83, wherein position information of said mask is used upon the baseline measurement.*

*90. A method according to claim 89, wherein position information of said mask in detected plural times and a plurality of detection results of said position information are used upon said baseline measurement.*

*91. A projection exposure apparatus which exposes a substrate with a projected image of a mask through a projection optical system, comprising:*

*a substrate stage disposed at the image side of said projection optical system, which holds said substrate;*

*first and second interferometers having measurement axes parallel to each other and perpendicular to a reflection surface provided on said substrate stage;*

*a mark detection system which detects a mark disposed on said substrate stage through said projection optical system; and*

*a controller connected to said first and second interferometers, said controller determining, upon detection of said mark by said mark detection system, the relationship of respective measurement values of said first and second interferometers.*

*92. An apparatus according to claim 91, wherein said mark detection system detects said mark on said substrate stage and a mark on said mask.*

*93. An apparatus according to claim 91, wherein said mark is formed on a fiducial plate arranged on said substrate stage.*

*94. An apparatus according to claim 91, further comprising an alignment system which has a center of detection, on the image side of said projection optical system, at a position different from said mark detection system.*

*95. An apparatus according to claim 94, wherein said mark comprises a first mark portion to be detected by said alignment system and a second mark portion to be detected by said mark detection system, said first and second mark portions being formed on a same plate in a positional relationship corresponding to an arrangement of said alignment system and said mark detection system.*

*96. An apparatus according to claim 94, wherein a center of detection of said alignment system is located on a measurement axis of said first interferometer and a measurement axis of said second interferometer intersects an optical axis of said projection optical system.*

*97. An apparatus according to claim 94, wherein a center of detection of said alignment system is disposed within a field of said projection optical system.*

*98. An apparatus according to claim 94, wherein a center of detection of said alignment system is disposed outside of a field of said projection optical system.*

*99. An apparatus according to claim 94, wherein said alignment system has an objective optical system provided independently of said projection optical system, wherein said alignment system detects a mark on said substrate through said objective optical system.*

*100. An exposure apparatus which exposes a substrate with an energy beam through a mask, comprising:*

*a first mark detection system to detect a mark on the substrate;*

*a second mark detection system to detect a mark on the mask;*

*a movable member formed with a fiducial mark to be detected by said first and second detection systems;*

*an interferometer to detect position information of said movable member; and*

*a measurement device connected to said first and second mark detection systems, said measurement device determining a baseline amount of said first mark detection system based on a plurality of detection results of the position information obtained from said interferometer upon detections of said fiducial mark by said first and second mark detection systems and detection results of said first and second mark detection systems.*

*101. An apparatus according to claim 100, wherein said fiducial mark comprises a first mark to be detected by said first mark detection system and a second mark to be detected by said second mark detection system, said first and second marks being formed on the same plate with a predetermined positional relationship.*

*102. An apparatus according to claim 100, further comprising a projection optical system disposed between said mask and said substrate, wherein said second mark detection system detects said fiducial mark and a mark on said mask through said projection optical system, and said first mark detection system has a center of detection at a position different from a projection point of said mark on said mask by said projection optical system.*

*103. An apparatus according to claim 102, wherein a center of detection of said first mark detection system is disposed within a field of said projection optical system.*

*104. An apparatus according to claim 102, wherein said first mark detection system has an objective optical system provided independently of said projection optical system, and said first mark detection system detects a mark on said substrate through said objective optical system.*

*105. An exposure method of exposing a substrate with an energy beam through a mask, comprising:*

*detecting a mark plate respectively by a first mark detection system for detecting a mark on said substrate and a second mark detection system for detecting a mark on said mask;*

*detecting, upon detection of said mark plate, position information of said mark plate plural times; and*

*determining a baseline amount of said first mark detection system based on detection results of said first and second mark detection systems and a plurality of detection results of the position information.*

*106. A method according to claim 105, wherein said mark plate is detected by said first and second mark detection systems substantially simultaneously.*

*107. A method according to claim 105, wherein the detections of said mark plate by said first and second detection systems are effected without movement of said mark plate.*

*108. A method according to claim 105, further comprising:*

*detecting position information of said mask upon detection of said mark plate, wherein said position information of the mask is used upon determining said baseline amount.*

*109. An exposure method of exposing a substrate with a projected image of a mask through a projection optical system, comprising:*

*determining, while detecting a mark on a movable member through said projection optical system, a relationship between measurement values of first and second interferometers which have measurement axes parallel to each other and perpendicular to a reflection surface of said movable member; and*

*controlling movement of said substrate based on at least one of the measurement values of said first and second interferometers.*

*110. A method according to claim 109, wherein said movable member is positioned such that said mark is detected together with at least one specific mark formed on said mask.*

*111. A method according to claim 110, further comprising:*

*detecting said mark on said movable member with an alignment system for detecting a mark on said substrate; and*

*determining a baseline amount of said alignment system based on a detection result by said alignment system and detection results of said mark on said movable member and said specific mark.*

*112. A method according to claim 111, wherein a relationship between the measurement axis of said first interferometer and a center of detection of said alignment system is determined, and an output of said first interferometer is used upon detection of said mark on said substrate by said alignment system.*

*113. A method according to claim 112, wherein a relationship between the measurement axis of said second interferometer and an optical axis of said projection optical system is determined, and an output of said second interferometer is used at the time of exposure of said substrate.*

* * * * *

UNITED STATES PATENT AND TRADEMARK OFFICE

CERTIFICATE OF CORRECTION

PATENT NO. : Re. 36,730
DATED : June 13, 2000
INVENTOR(S) : Kenji Nishi

It is certified that error appears in the above-identified patent and that said Letters Patent is hereby corrected as shown below:

Item [45] the asterisk should be deleted.
Between Items [73] and [21] [*] Notice should be deleted entirely.

Item [63] should read:
Continuation of application No. 08/524,465, September 7, 1995, abandoned, which is an application for reissue of Patent No. 5,243,195 granted September 7, 1993, which matured from application No. 07/998,642, December 29, 1992, which is a continuation of application No. 07/872,750, April 21, 1992, abandoned.

Signed and Sealed this

Third Day of July, 2001

*Attest:*

Nicholas P. Godici

*Attesting Officer*

NICHOLAS P. GODICI
*Acting Director of the United States Patent and Trademark Office*